United States Patent
Ichikawa et al.

(10) Patent No.: US 9,791,776 B2
(45) Date of Patent: *Oct. 17, 2017

(54) RESIST COMPOSITION AND METHOD FOR PRODUCING RESIST PATTERN

(75) Inventors: Koji Ichikawa, Osaka (JP); Takahiro Yasue, Osaka (JP); Yuichi Mukai, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/441,032

(22) Filed: Apr. 6, 2012

(65) Prior Publication Data

US 2012/0258401 A1    Oct. 11, 2012

(30) Foreign Application Priority Data

Apr. 7, 2011  (JP) .................................. 2011-085015

(51) Int. Cl.
| | |
|---|---|
| G03F 7/039 | (2006.01) |
| G03F 7/004 | (2006.01) |
| G03F 7/09  | (2006.01) |
| G03F 7/029 | (2006.01) |
| G03F 7/20  | (2006.01) |

(52) U.S. Cl.
CPC ........ *G03F 7/0046* (2013.01); *G03F 7/0045* (2013.01); *G03F 7/029* (2013.01); *G03F 7/0392* (2013.01); *G03F 7/0397* (2013.01); *G03F 7/092* (2013.01); *G03F 7/2041* (2013.01)

(58) Field of Classification Search
CPC ..... G03F 7/0392; G03F 7/0395; G03F 7/0397
See application file for complete search history.

(56) References Cited

U.S. PATENT DOCUMENTS

| | | |
|---|---|---|
| 3,779,778 A | 12/1973 | Smith et al. |
| 3,849,137 A | 11/1974 | Barzynski et al. |
| 4,576,902 A | 3/1986  | Saenger et al. |
| 4,822,716 A | 4/1989  | Onishi et al. |
| 4,857,437 A | 8/1989  | Banks et al. |
| 5,017,453 A | 5/1991  | Onishi et al. |
| 5,073,476 A | 12/1991 | Meier et al. |
| 5,198,520 A | 3/1993  | Onishi et al. |
| 5,260,410 A | 11/1993 | Schwalm |
| 5,453,341 A | 9/1995  | Schwalm |
| 5,663,035 A | 9/1997  | Masuda et al. |
| 7,304,175 B2 | 12/2007 | Harada et al. |
| 7,439,006 B2 | 10/2008 | Yoshida et al. |
| 7,579,132 B2 | 8/2009  | Harada et al. |
| 7,612,217 B2 | 11/2009 | Sakamoto et al. |
| 7,786,322 B2 | 8/2010  | Yamaguchi et al. |
| 2002/0102491 A1 | 8/2002 | Kodama et al. |
| 2006/0194982 A1 | 8/2006 | Harada et al. |
| 2007/0078269 A1 | 4/2007 | Harada et al. |
| 2007/0100096 A1 | 5/2007 | Harada et al. |
| 2007/0122750 A1 | 5/2007 | Yamaguchi et al. |
| 2008/0044738 A1 | 2/2008 | Harada et al. |
| 2008/0076063 A1* | 3/2008 | Yoshida et al. ............ 430/270.1 |
| 2008/0081925 A1 | 4/2008 | Sakamoto et al. |
| 2008/0193874 A1 | 8/2008 | Takata et al. |
| 2009/0208871 A1 | 8/2009 | Kawaue et al. |
| 2010/0081088 A1 | 4/2010 | Kawaue et al. |
| 2010/0203446 A1 | 8/2010 | Ichikawa et al. |
| 2010/0304293 A1 | 12/2010 | Ichikawa et al. |
| 2010/0330497 A1* | 12/2010 | Ichikawa et al. ......... 430/270.1 |
| 2011/0039208 A1 | 2/2011 | Hata et al. |
| 2011/0117495 A1 | 5/2011 | Ichikawa et al. |
| 2011/0171576 A1 | 7/2011 | Yamaguchi et al. |
| 2011/0200936 A1 | 8/2011 | Ichikawa et al. |
| 2012/0028188 A1 | 2/2012 | Ichikawa et al. |
| 2012/0219904 A1* | 8/2012 | Ichikawa et al. ......... 430/280.1 |
| 2012/0219907 A1* | 8/2012 | Ichikawa et al. ......... 430/281.1 |
| 2012/0225385 A1* | 9/2012 | Ichikawa et al. ......... 430/280.1 |
| 2013/0065186 A1 | 3/2013 | Matsuda et al. |

FOREIGN PATENT DOCUMENTS

| | | |
|---|---|---|
| DE | 39 14 407 A1 | 10/1990 |
| EP | 0 126 712 A1 | 11/1984 |
| JP | 55-164824 A | 12/1980 |
| JP | 62-69263 A | 3/1987 |
| JP | 62-153853 A | 7/1987 |
| JP | 63-26653 A | 2/1988 |
| JP | 63-146029 A | 6/1988 |
| JP | 63-146038 A | 6/1988 |
| JP | 63-163452 A | 7/1988 |
| JP | 7-333851 A | 12/1995 |

(Continued)

OTHER PUBLICATIONS

Michaelson et al "Understanding the Role of Base Quenchers in Photoresists", Advances in Resist Technology and Processing XXI, edited by John L sturtevant, Proceedings of SPIE vol. 5376 (SPEI bellingham WA 2004), 1282-1293.*

(Continued)

*Primary Examiner* — Cynthia Hamilton
(74) *Attorney, Agent, or Firm* — Birch, Stewart, Kolasch & Birch, LLP

(57) ABSTRACT

A resist composition contains (A) a resin being insoluble or poorly soluble in alkali aqueous solution, but becoming soluble in an alkali aqueous solution by the action of an acid, (B) an acid generator represented by the formula (II), and (D) a compound represented by the formula (I),

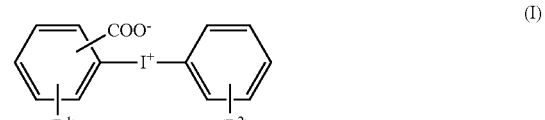

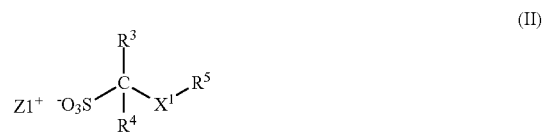

wherein $R^1$ and $R^2$, m and n, $R^3$ and $R^4$, $X^1$, $R^5$ and $Z1^+$ are defined in the specification.

2 Claims, No Drawings

(56) References Cited

FOREIGN PATENT DOCUMENTS

| JP | 2006-257078 A | | 9/2006 |
|---|---|---|---|
| JP | 2007-161707 A | | 6/2007 |
| JP | 2008-13551 A | | 1/2008 |
| JP | 2008-69146 A | | 3/2008 |
| JP | 2008-127367 A | | 6/2008 |
| JP | 2009-19146 A | | 1/2009 |
| JP | 2009-145408 A | | 7/2009 |
| JP | 2009-229603 A | | 10/2009 |
| JP | 2010-111660 A | | 5/2010 |
| JP | 2010-152341 A | | 7/2010 |
| JP | 2010-204646 A | | 9/2010 |
| JP | 2011248342 A | * | 8/2011 |
| JP | 2012-6907 A | | 1/2012 |
| WO | WO 2011/115138 A1 | | 9/2011 |

OTHER PUBLICATIONS

English translation of JP 2011248342 A obtained from http://patentscope.wipo.int/search/en/detail.jsf, obtained Sep. 29, 2013, 81 pages.*

English abstract of JP 2011248342a from Chemical abstracts obtained from SciFinder database, accession No. 2011:1578907, CAPLUS, 3 pages.*

Luis et al., "Non Concerted Pathways in the Generation of Dehydroarenes by Thermal Decomposition of Diaryliodonium Carboxylates", Tetrahedron, vol. 45, No. 19, 1989, pp. 6281-6296.

Office Action issued in the corresponding Japanese Patent Application No. 2012-071500 dated Dec. 1,2015.

* cited by examiner

RESIST COMPOSITION AND METHOD FOR PRODUCING RESIST PATTERN

CROSS-REFERENCE TO RELATED APPLICATIONS

This application claims priority to Japanese Application No. 2011-85015 filed on Apr. 7, 2011. The entire disclosures of Japanese Application No. 2011-85015 is incorporated hereinto by reference.

BACKGROUND OF THE INVENTION

1. Field of the Invention

The present invention relates to a resist composition and a method for producing resist pattern.

2. Background Information

A resist composition which contains a resin, an acid generator and a quencher containing 2,6-diisopropylaniline is described in Patent document of JP-2006-257078A.

However, a resist pattern formed with the conventional resist composition may be not always satisfied with because pattern collapses and defects occur.

SUMMARY OF THE INVENTION

The present invention provides following inventions of <1> to <4>.

<1> A resist composition containing (A) a resin being insoluble or poorly soluble in alkali aqueous solution, but becoming soluble in an alkali aqueous solution by the action of an acid, (B) an acid generator represented by the formula (II), and (D) a compound represented by the formula (I),

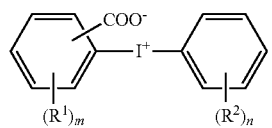

wherein $R^1$ and $R^2$ in each occurrence independently represent a $C_1$ to $C_{12}$ hydrocarbon group, a $C_1$ to $C_6$ alkoxyl group, a $C_2$ to $C_7$ acyl group, a $C_2$ to $C_7$ acyloxy group, a $C_2$ to $C_7$ alkoxycarbonyl group, a nitro group or a halogen atom;

m and n independently represent an integer of 0 to 4;

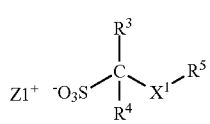

wherein $R^3$ and $R^4$ independently represent a fluorine atom or a $C_1$ to $C_6$ perfluoroalkyl group;

$X^1$ represents an $C_1$ to $C_{17}$ divalent saturated hydrocarbon group, and one or more hydrogen atom contained in the divalent saturated hydrocarbon group may be replaced by a fluorine atom, one or more —$CH_2$— contained in the divalent saturated hydrocarbon group may be replaced by —O— or —CO—;

$R^5$ represents a group having cyclic ether structure; and $Z1^+$ represents an organic cation.

<2> The resist composition according to <1>, wherein $R^5$ in the formula (II) is a group represented by the formula (IIA) or the formula (IIE).

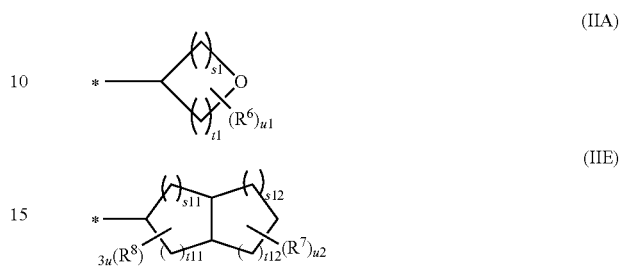

wherein s1 represents an integer of 1 to 4,
t1 represents an integer of 0 to 2,
provided that s1+t1 represents an integer of 1 to 4;
s11 represents an integer of 1 to 4,
t11 represents an integer of 0 to 2;
s12 represents an integer of 1 to 4,
t12 represents an integer of 0 to 2,
provided that s12+t12 represents an integer of 0 to 4;
$R^6$ in each occurrence represents a $C_1$ to $C_{12}$ saturated hydrocarbon group, a $C_6$ to $C_{18}$ aromatic hydrocarbon group, or two $R^6$ are bonded together to form a ring, and one or more hydrogen atoms contained in the saturated hydrocarbon group, the aromatic hydrocarbon group and the ring may be replaced by a $C_1$ to $C_6$ alkyl group or a nitro group, and one or more —$CH_2$— contained in the saturated hydrocarbon group and ring may be replaced by —O—;
u1 represents an integer of 0 to 8;
$R^7$ and $R^8$ in each occurrence independently represent a hydroxy group, a halogen atom, a $C_1$ to $C_6$ alkyl group, a $C_1$ to $C_6$ alkoxyl group, a $C_1$ to $C_6$ hydroxy alkyl group, a $C_2$ to $C_7$ acyl group, a $C_2$ to $C_7$ acyloxy group or a $C_2$ to $C_7$ acylamino group, or two of $R^7$ and/or $R^8$ may be bonded together to form a single bond or a ring;
u2 and u3 independently represent an integer of 0 to 16;
* represent a bond to $X^1$.

<3> The resist composition according to <1> or <2>, which further comprises a solvent.

<4> A method for producing a resist pattern comprising steps of;

(1) applying the resist composition any one of <1> to <3> onto a substrate;

(2) drying the applied composition to form a composition layer;

(3) exposing the composition layer;

(4) heating the exposed composition layer, and (5) developing the heated composition layer.

According to the resin and the resist composition of the present invention, it is possible to achieve satisfactory less pattern collapses and defects.

DETAILED DESCRIPTION OF THE PREFERRED EMBODIMENTS

"(Meth)acrylic monomer" means at least one monomer having a structure of "$CH_2$=CH—CO—" or "$CH_2$=C($CH_3$)—CO—", as well as "(meth)acrylate" and "(meth)acrylic acid" mean "at least one acrylate or methacrylate" and "at least one acrylic acid or methacrylic acid," respectively.

The resist composition of the present invention contains;

(A) a resin (hereinafter is sometimes referred to as "resin (A)"), and (B) an acid generator represented by the formula (II) (hereinafter is sometimes referred to as "acid generator (II)") and (D) a compound represented by the formula (I) (hereinafter is sometimes referred to as "compound (I)").

Further, the present resist composition preferably contains a solvent (hereinafter is sometimes referred to as "solvent (E)"), as needed.

<Resin (A)>

The resin (A) is a resin having properties which is insoluble or poorly soluble in alkali aqueous solution but becomes soluble in an alkali aqueous solution by the action of an acid. Here "a resin having properties which is insoluble or poorly soluble in alkali aqueous solution but becomes soluble in an alkali aqueous solution by the action of an acid" means a resin which has an acid labile group and is insoluble or poorly soluble in aqueous alkali solution before contact with the acid, and becomes soluble in aqueous alkali solution after contact with an acid.

Therefore, the resin (A) can be produced by polymerizing at least one monomer having an acid labile group described below (hereinafter is sometimes referred to as "acid labile monomer (a1)").

The resin (A) may also have a structural unit derived from an acid stable monomer and/or a structural unit derived from a known monomer in this field as long as the resin (A) has the properties described above.

<Acid Labile Monomer (a1)>

The "acid labile group" means a group which has an elimination group and in which the elimination group is detached by contacting with an acid resulting in forming a hydrophilic group such as a hydroxy or carboxy group. Examples of the acid labile group include a group represented by the formula (1) and a group represented by the formula (2). Hereinafter a group represented by the formula (1) is sometimes referred to as an "acid labile group (1)", and a group represented by the formula (2) is sometimes referred to as an "acid labile group (2)".

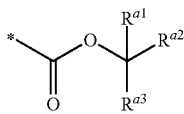
(1)

wherein $R^{a1}$ to $R^{a3}$ independently represent a $C_1$ to $C_8$ alkyl group or a $C_3$ to $C_{20}$ alicyclic hydrocarbon group, or $R^{a1}$ and $R^{a2}$ may be bonded together to form a $C_2$ to $C_{20}$ divalent hydrocarbon group, * represents a bond. In particular, the bond here represents a bonding site (the similar shall apply hereinafter for "bond").

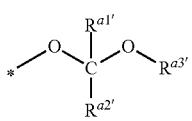
(2)

wherein $R^{a1'}$ and $R^{a2'}$ independently represent a hydrogen atom or a $C_1$ to $C_{12}$ hydrocarbon group, $R^{a3'}$ represents a $C_1$ to $C_{20}$ hydrocarbon group, or $R^{a2'}$ and $R^{a3'}$ may be bonded together to form a divalent $C_2$ to $C_{20}$ hydrocarbon group, and one or more —$CH_2$— contained in the hydrocarbon group or the divalent hydrocarbon group may be replaced by —O— or —S—, * represents a bond.

Examples of the alkyl group of $R^{a1}$ to $R^{a3}$ include methyl, ethyl, propyl, butyl, pentyl, hexyl and octyl groups.

Examples of the alicyclic hydrocarbon group of $R^{a1}$ to $R^{a3}$ include monocyclic groups such as cyclopentyl, cyclohexyl, methylcyclohexyl, dimethylcyclohexyl, cycloheptyl, cyclooctyl groups; and polycyclic hydrocarbon groups such as decahydronaphtyl, adamantyl, norbornyl (i.e., bicyclo[2.2.1]heptyl), and methyl norbornyl groups as well as groups below.

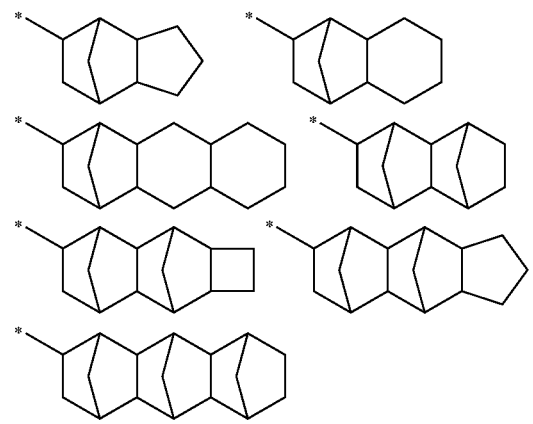

The alicyclic hydrocarbon group of $R^{a1}$ to $R^{a3}$ preferably has 3 to 16 carbon atoms.

When $R^{a1}$ and $R^{a2}$ is bonded together to form the divalent hydrocarbon group, examples of the group —$C(R^{a1})(R^{a2})(R^{a3})$— include groups below. The divalent hydrocarbon group preferably has 3 to 12 carbon atoms.

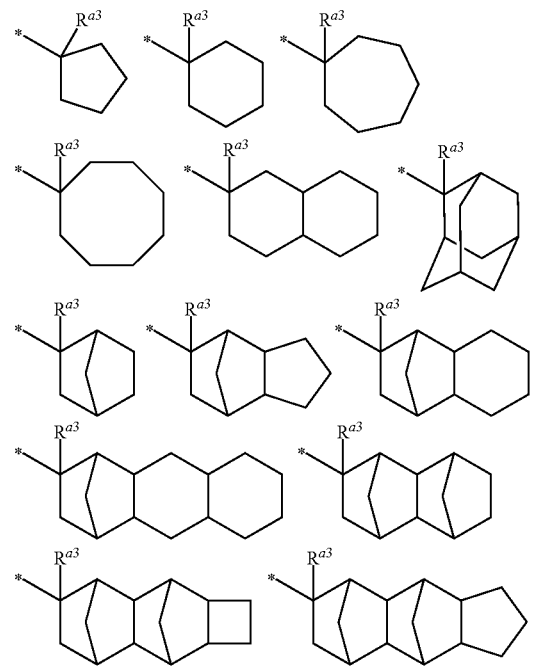

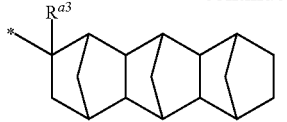

Specific examples of the acid labile group (1) include, for example, 1,1-dialkylalkoxycarbonyl group (a group in which $R^{a1}$ to $R^{a3}$ are alkyl groups, preferably tert-butoxycarbonyl group, in the formula (1)), 2-alkyladamantane-2-yloxycarbonyl group (a group in which $R^{a1}$, $R^{a2}$ and a carbon atom form adamantyl group, and $R^{a3}$ is alkyl group, in the formula (1)), and 1-(adamantane-1-yl)-1-alkylalkoxycarbonyl group (a group in which $R^{a1}$ and $R^{a2}$ are alkyl group, and $R^{a3}$ is adamantyl group, in the formula (1)).

The hydrocarbon group of $R^{a1'}$ to $R^{a3'}$ includes any of an alkyl group, an alicyclic hydrocarbon group and an aromatic hydrocarbon group.

Examples of the alkyl group and the alicyclic hydrocarbon group are the same examples as described above.

Examples of the aromatic hydrocarbon group include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

Examples of the divalent hydrocarbon group which is formed by bonding with $R^{a2'}$ and $R^{a3'}$ include groups in which one hydrogen atom in the hydrocarbon group as described above is removed.

At least one of $R^{a1'}$ and $R^{a2'}$ is preferably a hydrogen atom.

Specific examples of the acid labile group (2) include a group below.

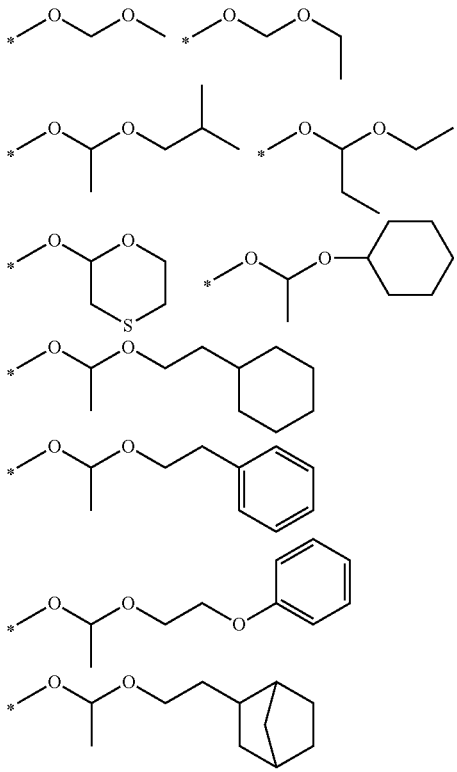

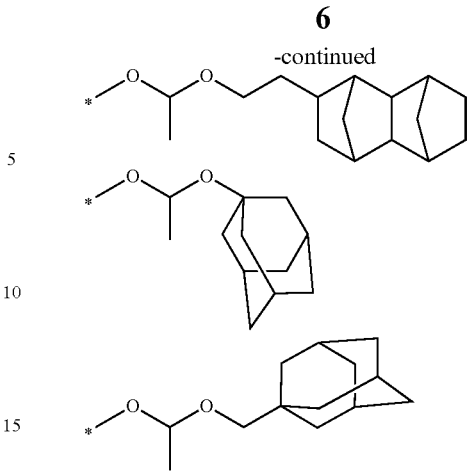

The acid labile monomer (a1) is preferably a monomer having an acid labile group and a carbon-carbon double bond, and more preferably a (meth)acrylic monomer having the acid labile group. In particular, the acid labile monomer (a1) is preferably a monomer having the acid labile group (1) and/or the acid labile group (2), and a carbon-carbon double bond, and more preferably a (meth)acrylic monomer having the acid labile group (1).

Among the (meth)acrylic monomer having an acid labile group, it is preferably a monomer having a $C_5$ to $C_{20}$ alicyclic hydrocarbon group. When a resin which can be obtained by polymerizing monomers having bulky structure such as the alicyclic hydrocarbon group is used, the resist composition having excellent resolution tends to be obtained during the production of a resist pattern.

Examples of a structural unit derived from the (meth)acrylic monomer having the acid labile group and a carbon-carbon double bond preferably include structural units represented by the formula (a1-1) and the formula (a1-2) below. Hereinafter the structural unit represented by the formula (a1-1) and the structural unit represented by the formula (a1-2) are sometimes referred to as "structural unit (a1-1)" and "structural unit (a1-2)"), respectively, and monomers inducing the structural unit (a1-1) and the structural unit (a1-2) are sometimes referred to as "monomer (a1-1)" and "monomer (a1-2)"), respectively. These may be used as a single monomer or as a combination of two or more monomers.

(a1-1)

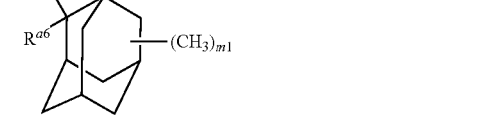

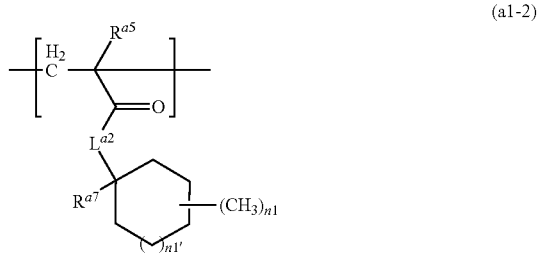

(a1-2)

wherein $L^{a1}$ and $L^{a2}$ independently represent *—O— or *—O—$(CH_2)_{k1}$—CO—O—, k1 represents an integer of 1 to 7, * represents a bond to the carbonyl group;

$R^{a4}$ and $R^{a5}$ independently represent a hydrogen atom or a methyl group;

$R^{a6}$ and $R^{a7}$ independently represent a $C_1$ to $C_8$ alkyl group or a $C_3$ to $C_{10}$ alicyclic hydrocarbon group;

m1 represents an integer 0 to 14;

n1 represents an integer 0 to 10; and n1' represents an integer 0 to 3.

In the formula (a1-1) and the formula (a1-2), $L^{a1}$ and $L^{a2}$ are preferably *—O— or *—O—$(CH_2)_{k1'}$—CO—O— and more preferably *—O—, here k1' represents an integer of 1 to 4 and more preferably 1.

$R^{a4}$ and $R^{a5}$ are preferably a methyl group.

Examples of the alkyl group of $R^{a6}$ and $R^{a7}$ include methyl, ethyl, propyl, butyl, pentyl, hexyl and octyl groups. Among these, the alkyl group of $R^{a6}$ and $R^{a7}$ is preferably a $C_1$ to $C_6$ alkyl group, Examples of the alicyclic group of $R^{a6}$ and $R^{a7}$ include monocyclic hydrocarbon groups such as cyclopentyl, cyclohexyl, methylcyclohexyl, dimethylcyclohexyl, cycloheptyl, cyclooctyl groups; and polycyclic hydrocarbon groups such as decahydronaphtyl, adamantyl, norbornyl (i.e., bicyclo[2.2.1]heptyl), and methyl norbornyl groups as well as groups below. Among these, the alicyclic group of $R^{a6}$ and $R^{a7}$ is preferably a $C_3$ to $C_8$ alicyclic hydrocarbon group, and more preferably a $C_3$ to $C_6$ alicyclic hydrocarbon group.

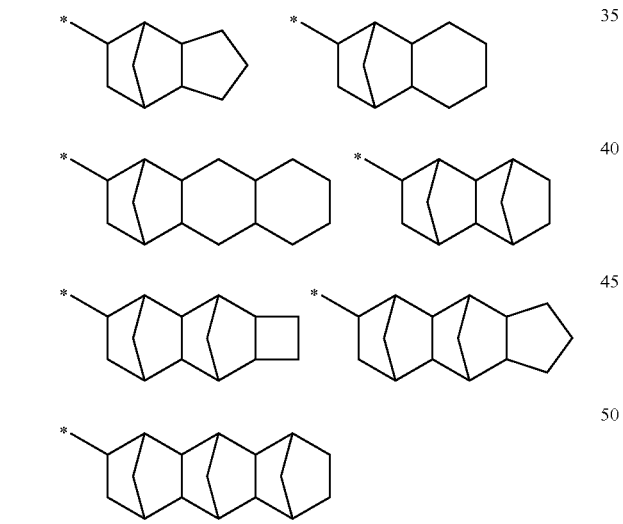

m1 is preferably an integer of 0 to 3, and more preferably 0 or 1.

n1 is preferably an integer of 0 to 3, and more preferably 0 or 1.

n1' is preferably 0 or 1.

Examples of the monomer (a1-1) include monomers described in JP 2010-204646A. Among these, the monomers are preferably monomers represented by the formula (a1-1-1) to the formula (a1-1-8), and more preferably monomers represented by the formula (a1-1-1) to the formula (a1-1-4) below.

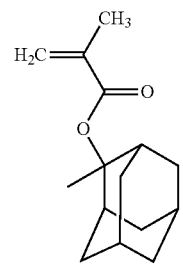
(a1-1-1)

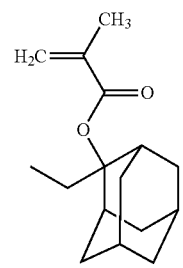
(a1-1-2)

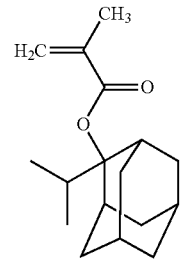
(a1-1-3)

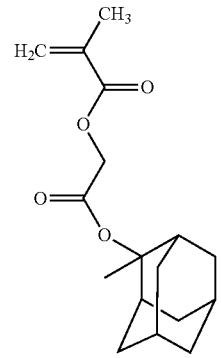
(a1-1-4)

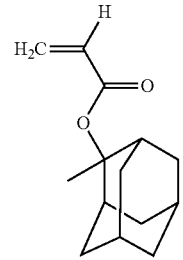
(a1-1-5)

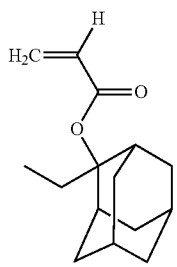
(a1-1-6)

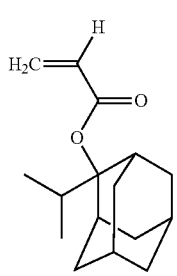
(a1-1-7)

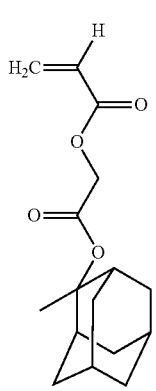
(a1-1-8)

Examples of the monomer (a1-2) include 1-ethylcyclopentane-1-yl (meth)acrylate, 1-ethylcyclohexane-1-yl (meth)acrylate, 1-ethylcycloheptane-1-yl (meth)acrylate, 1-methylcyclopentane-1-yl (meth)acrylate and 1-isopropylcyclopentane-1-yl (meth)acrylate. Among these, the monomers are preferably monomers represented by the formula (a1-2-1) to the formula (a1-2-12), and more preferably monomers represented by the formula (a1-2-3), the formula (a1-2-4), the formula (a1-2-9) and the formula (a1-2-10), and still more preferably monomer represented by the formula (a1-2-3) and the formula (a1-2-9) below.

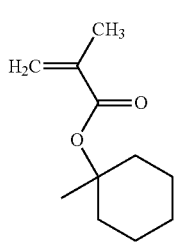
(a1-2-1)

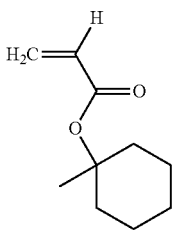
(a1-2-2)

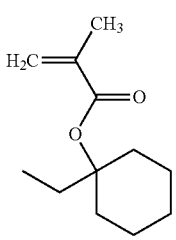
(a1-2-3)

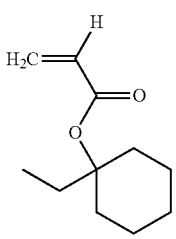
(a1-2-4)

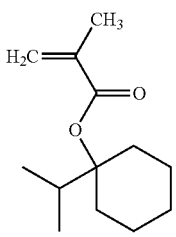
(a1-2-5)

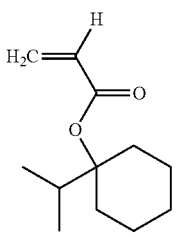
(a1-2-6)

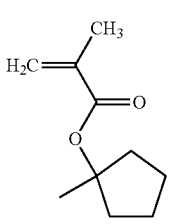
(a1-2-7)

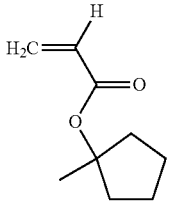
(a1-2-8)

-continued

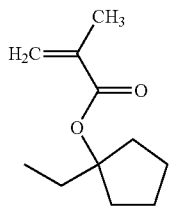 (a1-2-9)

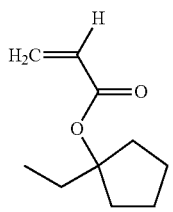 (a1-2-10)

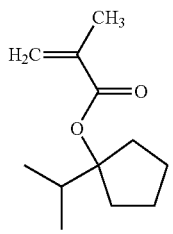 (a1-2-11)

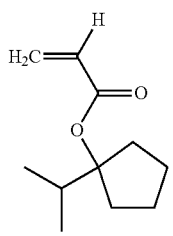 (a1-2-12)

When the resin (A) contains the structural unit (a1-1) and/or the structural unit (a1-2), the total proportion thereof is generally 10 to 95 mol %, preferably 15 to 90 mol %, more preferably 20 to 85 mol %, with respect to the total structural units (100 mol %) of the resin (A).

Examples of a monomer having an acid-labile group (2) and a carbon-carbon double bond include a monomer represented by the formula (a1-5). Hereinafter, such monomer is sometimes referred to as "monomer (a1-5)". When the resin (A) has the structural unit derived from the monomer (a1-5), a resist pattern tends to be obtained with less defects.

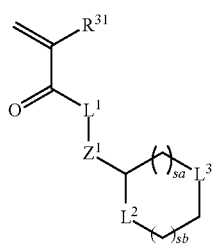 (a1-5)

wherein $R^{31}$ represents a hydrogen atom, a halogen atom or a $C_1$ to $C_6$ alkyl group that optionally has a halogen atom;

$L^1$, $L^2$ and $L^3$ independently represent *—O—, *—S— or *—O—$(CH_2)_{k1}$—CO—O—, k1 represents an integer of 1 to 7, * represents a bond to the carbonyl group (—CO—);

sa represents an integer of 0 to 4;
sb represents an integer of 0 to 4;

$Z^1$ represents a single bond or a $C_1$ to $C_6$ alkanediyl group, and one or more —$CH_2$— contained in the alkanediyl group may be replaced by —O— or —CO—.

In the formula (a1-5), $R^{31}$ is preferably a hydrogen atom, a methyl group or trifluoromethyl group;

$L^1$ is preferably —O—;

$L^2$ and $L^3$ are independently preferably *—O— or *—S—, and more preferably —O— for one and —S— for another;

sa is preferably 1;

sb is preferably an integer of 0 to 2;

$Z^1$ is preferably a single bond or —$CH_2$—CO—O—.

Examples of the compound represented by the formula (a1-5) include compounds below.

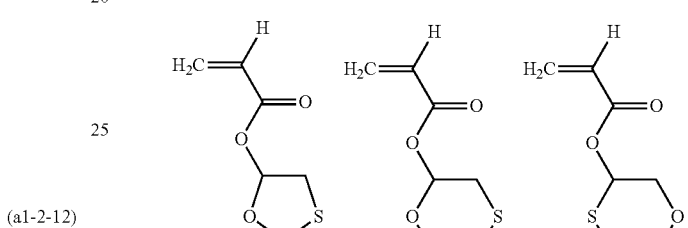

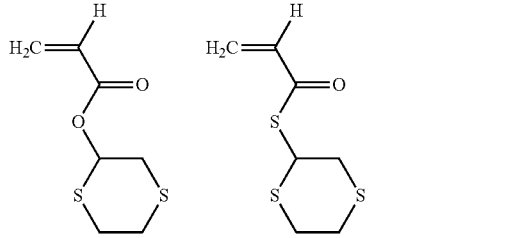

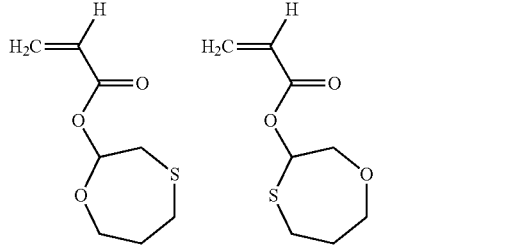

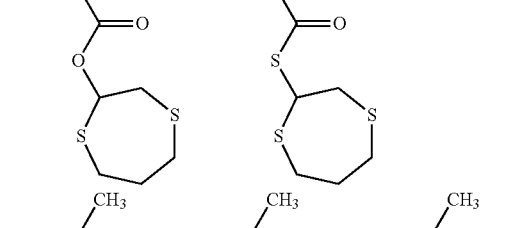

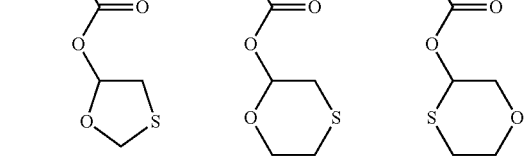

-continued

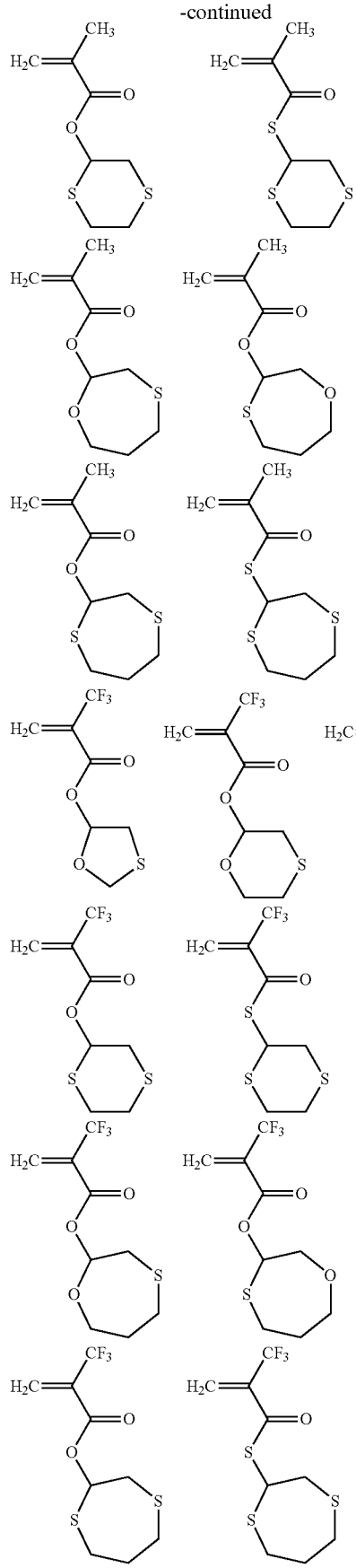

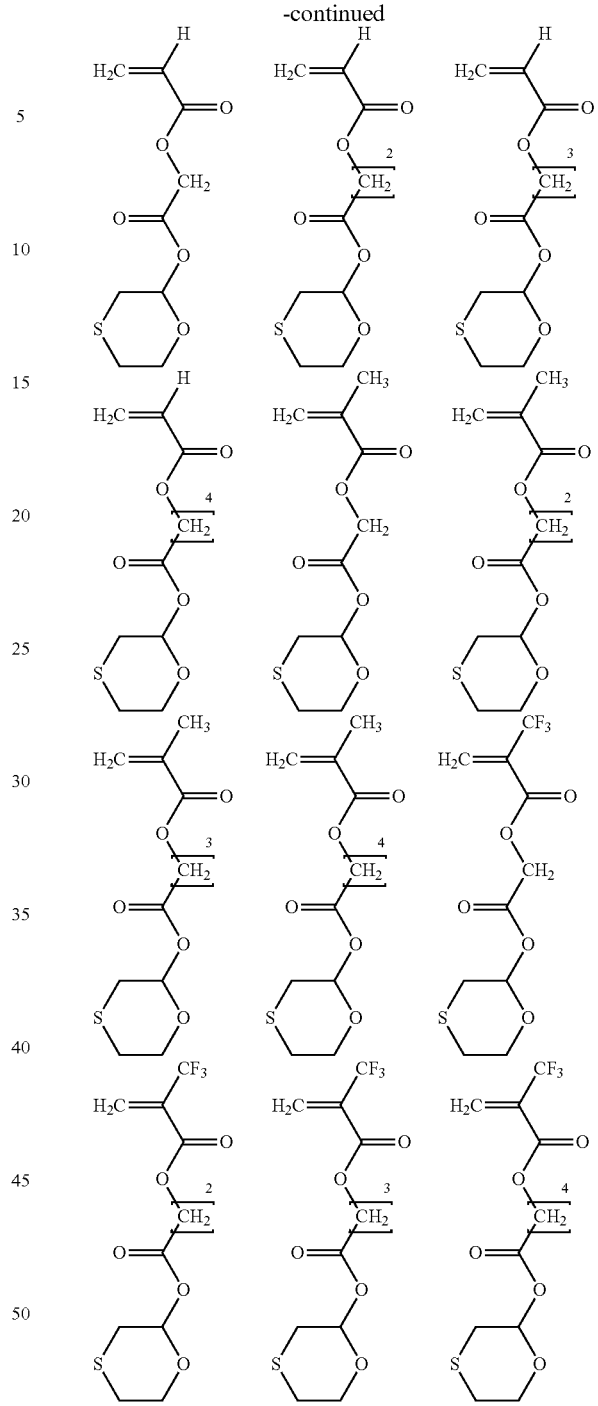

When the resin (A) contains the structural unit derived from the monomer represented by the formula (a1-5), the proportion thereof is generally 1 to 50 mol %, preferably 3 to 45 mol %, and more preferably 5 to 40 mol %, with respect to the total structural units (100 mol %) constituting the resin (A).

<Acid Stable Monomer>

The resin (A) is preferably a copolymer of monomers which does not having the acid labile group and the monomers (a1). Hereinafter the monomer not having the acid labile group is sometimes referred to as "acid stable monomer".

As the acid stable monomer, a monomer having a hydroxy group or a lactone ring is preferable. When a resin containing the structural unit derived from a monomer having hydroxy group (hereinafter such acid stable monomer is sometimes referred to as "acid stable monomer (a2)") or a acid stable monomer having a lactone ring (hereinafter such acid stable monomer is sometimes referred to as "acid stable monomer (a3)") is used, the adhesiveness of resist to a substrate and resolution of resist pattern tend to be improved.

<Acid Stable Monomer (a2)>

The acid stable monomer (a2), which has the hydroxy group, is preferably selected depending on the kinds of an exposure light source at producing the resist pattern.

When KrF excimer laser lithography (248 nm), or high-energy irradiation such as electron beam or EUV is used for the resist composition, using the acid stable monomer having a phenolic hydroxy group such as hydroxystyrene as the acid stable monomer (a2) is preferable.

When ArF excimer laser lithography (193 nm), i.e., short wavelength excimer laser lithography is used, using the acid stable monomer having a hydroxy adamantyl group represented by the formula (a2-1) as the acid stable monomer (a2) is preferable.

The acid stable monomer (a2) having the hydroxy group may be used as a single monomer or as a combination of two or more monomers.

Examples of the acid stable monomer having hydroxy adamantyl include the monomer represented by the formula (a2-1).

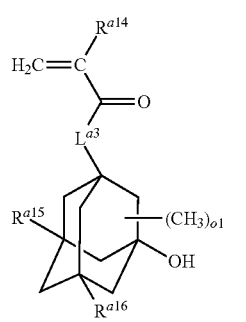

(a2-1)

wherein $L^{a3}$ represents —O— or *—O—$(CH_2)_{k2}$—CO—O—;

k2 represents an integer of 1 to 7;

* represents a bind to —CO—;

$R^{a14}$ represents a hydrogen atom or a methyl group;

$R^{a15}$ and $R^{a16}$ independently represent a hydrogen atom, a methyl group or a hydroxy group;

o1 represents an integer of 0 to 10.

In the formula (a2-1), $L^{a3}$ is preferably —O—, —O—$(CH_2)_{f1}$—CO—O—, here f1 represents an integer of 1 to 4, and more preferably —O—.

$R^{a14}$ is preferably a methyl group.

$R^{a15}$ is preferably a hydrogen atom.

$R^{a16}$ is preferably a hydrogen atom or a hydroxy group.

o1 is preferably an integer of 0 to 3, and more preferably an integer of 0 or 1.

Examples of the acid stable monomer represented by the formula (a2-1) include monomers described in JP 2010-204646A. Among these, the monomers are preferably monomers represented by the formula (a2-1-1) to the formula (a2-1-6), more preferably monomers represented by the formula (a2-1-1) to the formula (a2-1-4), and still more preferably monomers represented by the formula (a2-1-1) and the formula (a2-1-3) below.

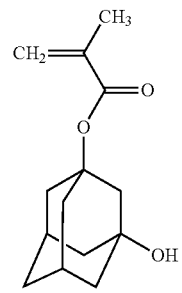

(a2-1-1)

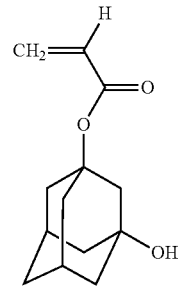

(a2-1-2)

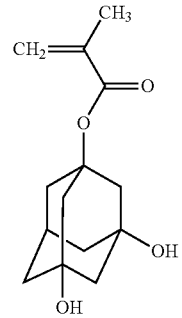

(a2-1-3)

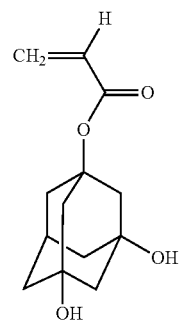

(a2-1-4)

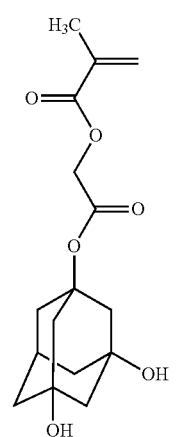

(a2-1-5)

-continued (a2-1-6)

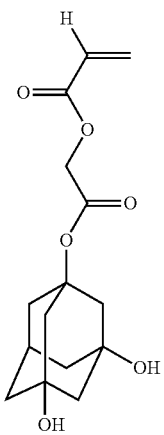

When the resin (A) contains the acid stable structural unit derived from the monomer represented by the formula (a2-1), the proportion thereof is generally 3 to 45 mol %, preferably 5 to 40 mol %, more preferably 5 to 35 mol %, and still more preferably 5 to 20 mol %, with respect to the total structural units (100 mol %) constituting the resin (A).

<Acid Stable Monomer (a3)>

The lactone ring included in the acid stable monomer (a3) may be a monocyclic compound such as β-propiolactone ring, γ-butyrolactone, δ-valerolactone, or a condensed ring with monocyclic lactone ring and other ring. Among these, γ-butyrolactone, and condensed ring with γ-butyrolactone and other ring are preferable.

Examples of the acid stable monomer (a3) having the lactone ring include monomers represented by the formula (a3-1), the formula (a3-2) and the formula (a3-3). These monomers may be used as a single monomer or as a combination of two or more monomers.

(a3-1)

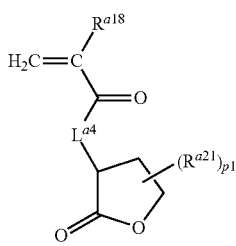

(a3-2)

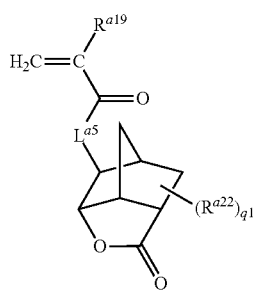

-continued (a3-3)

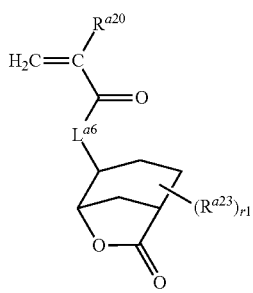

wherein $L^{a4}$ to $L^{a6}$ independently represent —O— or *—O—$(CH_2)_{k3}$—CO—O—;

k3 represents an integer of 1 to 7, * represents a bind to —CO—;

$R^{a18}$ to $R^{a20}$ independently represent a hydrogen atom or a methyl group;

$R^{a21}$ in each occurrence represents a $C_1$ to $C_4$ alkyl group;

p1 represents an integer of 0 to 5;

$R^{a22}$ to $R^{a23}$ in each occurrence independently represent a carboxyl group, cyano group and a $C_1$ to $C_4$ alkyl group;

q1 and r1 independently represent an integer of 0 to 3.

Examples of the alkyl group of $R^{a21}$ and $R^{a23}$ include methyl, ethyl, propyl, isopropyl, n-butyl, tert-butyl and sec-butyl groups.

In the formulae (a3-1) to (a3-3), $L^{a4}$ to $L^{a6}$ include the same group as described in $L^{a3}$ above, and are independently preferably —O—, *—O—$(CH_2)_{k3'}$—CO—O—, here k3' represents an integer of 1 to 4 (preferably 1), and more preferably —O—;

$R^{a18}$ to $R^{a21}$ are independently preferably a methyl group.

$R^{a22}$ and $R^{a23}$ are independently preferably a carboxyl group, cyano group or methyl group;

p1 to r1 are independently preferably an integer of 0 to 2, and more preferably an integer of 0 or 1.

Examples of the monomer (a3) include monomers described in JP 2010-204646A. Among these, the monomers are preferably monomers represented by the formula (a3-1-1) to the formula (a3-1-4), the formula (a3-2-1) to the formula (a3-2-4), the formula (a3-3-1) to the formula (a3-3-4), more preferably monomers represented by the formula (a3-1-1) to the formula (a3-1-2), the formula (a3-2-3) to the formula (a3-2-4), and still more preferably monomers represented by the formula (a3-1-1) and the formula (a3-2-3) below.

(a3-1-1)

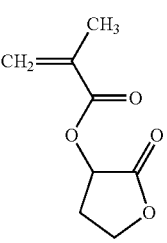

(a3-1-2)
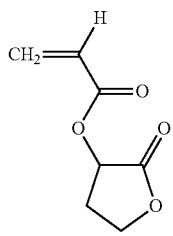
(a3-1-3)
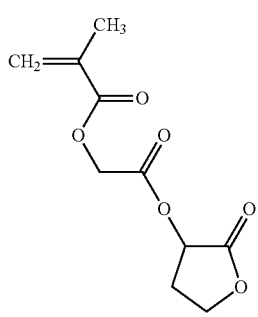
(a3-1-4)
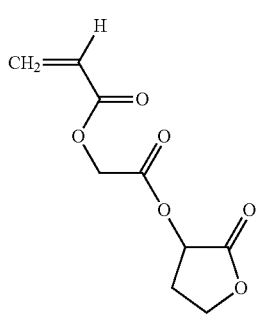
(a3-2-1)
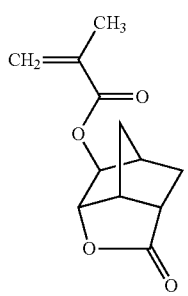
(a3-2-2)
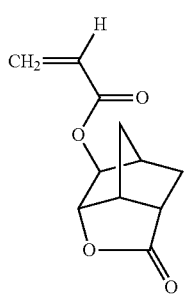
(a3-2-3)
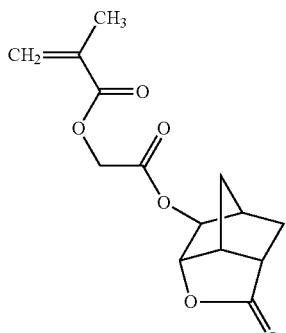
(a3-2-4)
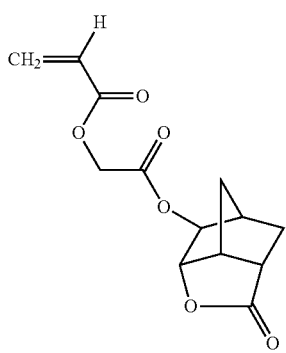
(a3-3-1)
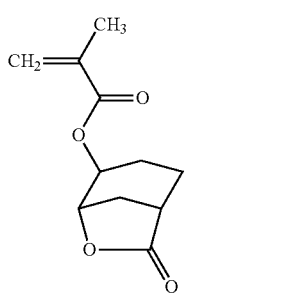
(a3-3-2)
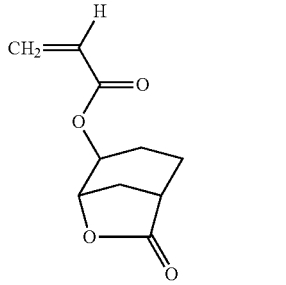
(a3-3-3)
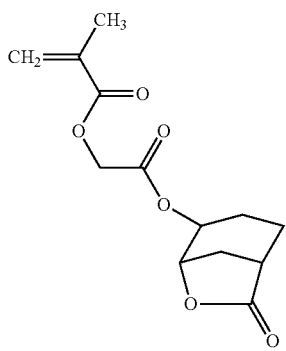

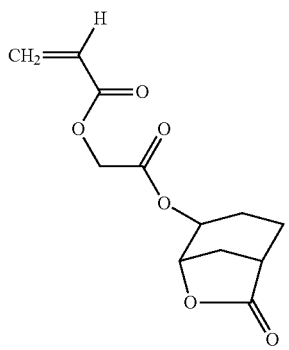

(a3-3-4)

When the resin (A) contains the structural units derived from the acid stable monomer (a3) having the lactone ring, the total proportion thereof is preferably 5 to 70 mol %, more preferably 10 to 65 mol %, still more preferably 10 to 60 mol %, with respect to the total structural units (100 mol %) constituting the resin (A).

When the resin (A) is the copolymer of the acid labile monomer (a1) and the acid stable monomer, the proportion of the structural unit derived from the acid labile monomer (a1) is preferably 10 to 80 mol %, and more preferably 20 to 60 mol %, with respect to the total structural units (100 mol %) constituting the resin (A).

The proportion of the structural unit derived from the monomer having an adamantyl group (in particular, the monomer having the acid labile group (a1-1)) is preferably 15 mol % or more with respect to the structural units derived from the acid labile monomer (a1). As the mole ratio of the structural unit derived from the monomer having an adamantyl group increases within this range, the dry etching resistance of the resulting resist improves.

The resin (A) preferably is a copolymer of the acid labile monomer (a1) and the acid stable monomer. In this copolymer, the acid labile monomer (a1) is preferably at least one of the acid labile monomer (a1-1) having an adamantyl group and the acid labile monomer (a1-2) having a cyclohexyl or cyclopentyl group, and more preferably is the acid labile monomer (a1-1).

The acid stable monomer is preferably the acid stable monomer (a2) having a hydroxy group and/or the acid stable monomer (a3) having a lactone ring. The acid stable monomer (a2) is preferably the monomer having the hydroxyadamantyl group (a2-1).

The acid stable monomer (a3) is preferably at least one of the monomer having the γ-butyrolactone ring (a3-1) and the monomer having the condensed ring of the γ-butyrolactone ring and the norbornene ring (a3-2).

The resin (A) can be produced by a known polymerization method, for example, radical polymerization method, using at least one of the acid labile monomer (a1) and/or at least one of the acid stable monomer (a2) having a hydroxy group and/or at least one of the acid stable monomer (a3) having a lactone ring and/or at least one of a known compound.

The weight average molecular weight of the resin (A) is preferably 2,500 or more (more preferably 3,000 or more, and still more preferably 4,000 or more), and 50,000 or less (more preferably 30,000 or less, and still more preferably 15,000 or less). The weight average molecular weight is a value determined by gel permeation chromatography using polystyrene as the standard product. The detailed condition of this analysis is described in Examples.

The resist composition may contain a resin which is produced by copolymerizing the acid stable monomers and/or the known monomers in this field and does not contain the monomer (a1), in addition to the resin (A).

The resist composition of the present invention preferably contains 80 weight % or more, and 99 weight % or less of the resin, with respect to the total solid proportion of the resist composition.

In the specification, the term "solid proportion of the resist composition" means the entire proportion of all ingredients other than the solvent (E). For example, if the proportion of the solvent (E) is 90 weight %, the solid proportion of the resist composition is 10 weight %.

The proportion of the resin (A) and the solid proportion of the resist composition can be measured with a known analytical method such as, for example, liquid chromatography and gas chromatography.

<Acid Generator (II)>

The acid generator (II) is represented by the formula (II) below.

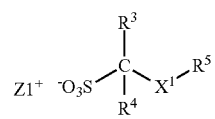

(II)

wherein $R^3$ and $R^4$ independently represent a fluorine atom or a $C_1$ to $C_6$ perfluoroalkyl group;

$X^1$ represents an $C_1$ to $C_{17}$ divalent saturated hydrocarbon group, and one or more hydrogen atom contained in the divalent saturated hydrocarbon group may be replaced by a fluorine atom, one or more —$CH_2$— contained in the divalent saturated hydrocarbon group may be replaced by —O— or —CO—;

$R^5$ represents a group having cyclic ether structure; and $Z1^+$ represents an organic cation.

Examples of the perfluoroalkyl group of $R^3$ and $R^4$ include trifluoromethyl, perfluoroethyl, perfluoropropyl, perfluoro-isopropyl, perfluorobutyl, perfluoro-sec-butyl, perfluoro-tert-butyl, perfluoropentyl and perfluorohexyl groups.

Among these, $R^3$ and $R^4$ independently are preferably trifluoromethyl or fluorine atom, and more preferably a fluorine atom.

Examples of the a divalent saturated hydrocarbon group of $X^1$ include any of;

a chain alkanediyl group such as methylene, ethylene, propane-1,3-diyl, propane-1,2-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl groups, methane-1,1-diyl, ethane-1,1-diyl, propan-1,1-diyl and propan-2,2-diyl groups;

a branched chain alkanediyl group such as a group in which a chain alkanediyl group is bonded a side chain of a $C_1$ to $C_4$ alkyl group such as methyl, ethyl, propyl, isopropyl, butyl, sec-butyl and tert-butyl, for example, butan-1,3-diyl, 2-methylpropane-1,3-diyl, 2-methylpropane-1,2-diyl, pentane-1,4-diyl, 2-methylbutane-1,4-diyl groups;

a divalent monocyclic-alicyclic saturated hydrocarbon group such as a cycloalkanediyl group (e.g., cyclobutan-1,3-diyl, cyclopentan-1,3-diyl, cyclohexane-1,2-diyl, 1-methylhexane-1,2-diyl, cyclohexane-1,4-diyl, cyclooctan-1,2-diyl, cyclooctan-1,5-diyl groups);

a divalent polycyclic-alicyclic saturated hydrocarbon group such as norbornane-1,4-diyl, norbornane-2,5-diyl, adamantane-1,5-diyl and adamantane-2,6-diyl groups; and a combination of two or more groups.

Examples of the saturated hydrocarbon group of $X^1$ in which one or more —$CH_2$— contained in the saturated hydrocarbon group is replaced by —O— or —CO— include groups represented by the formula (b1-1) to the formula (b1-6) below. In the formula (b1-1) to the formula (b1-6), the group is represented so as to correspond with two sides of the formula (II), that is, the left side of the group bonds to $C(R^3)(R^4)$— and the right side of the group bonds to $R^5$ (examples of the formula (b1-1) to the formula (b1-6) are the same as above). * represents a bond.

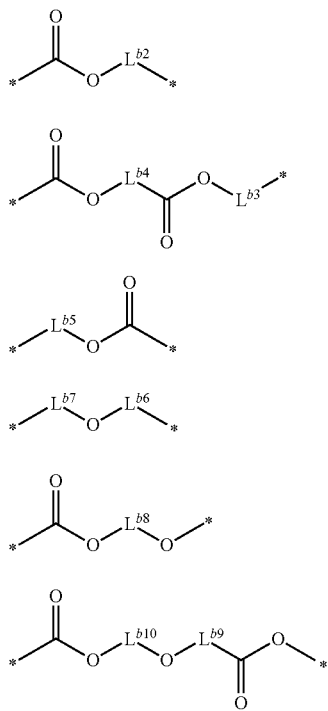

(b1-1)

(b1-2)

(b1-3)

(b1-4)

(b1-5)

(b1-6)

wherein $L^{b2}$ represents a single bond or a $C_1$ to $C_{15}$ divalent saturated hydrocarbon group;

$L^{b3}$ represents a single bond or a $C_1$ to $C_{12}$ divalent saturated hydrocarbon group;

$L^{b4}$ represents a $C_1$ to $C_{13}$ divalent saturated hydrocarbon group, the total number of the carbon atoms in $L^{b3}$ and $L^{b4}$ is at most 13;

$L^{b5}$ represents a $C_1$ to $C_{15}$ divalent saturated hydrocarbon group;

$L^{b6}$ and $L^{b7}$ independently represent a $C_1$ to $C_{15}$ divalent saturated hydrocarbon group, the total number of the carbon atoms in $L^{b6}$ and $L^{b7}$ is at most 16;

$L^{b8}$ represents a $C_1$ to $C_{14}$ divalent saturated hydrocarbon group;

$L^{b9}$ and $L^{b10}$ independently represent a $C_1$ to $C_{11}$ divalent saturated hydrocarbon group, the total number of the carbon atoms in $L^{b9}$ and $L^{b10}$ is at most 12.

Among these, $X^1$ is preferably the groups represented by the formula (b1-1) to the formula (b1-4), more preferably the group represented by the formula (b1-1) or the formula (b1-2), and still more preferably the group represented by the formula (b1-1). In particular, the divalent group represented by the formula (b1-1) in which $L^{b2}$ represents a single bond or —$CH_2$— is preferable.

Specific examples of the divalent group represented by the formula (b1-1) include groups below. In the formula below, * represent a bond.

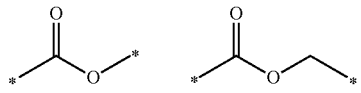

Specific examples of the divalent group represented by the formula (b1-2) include groups below.

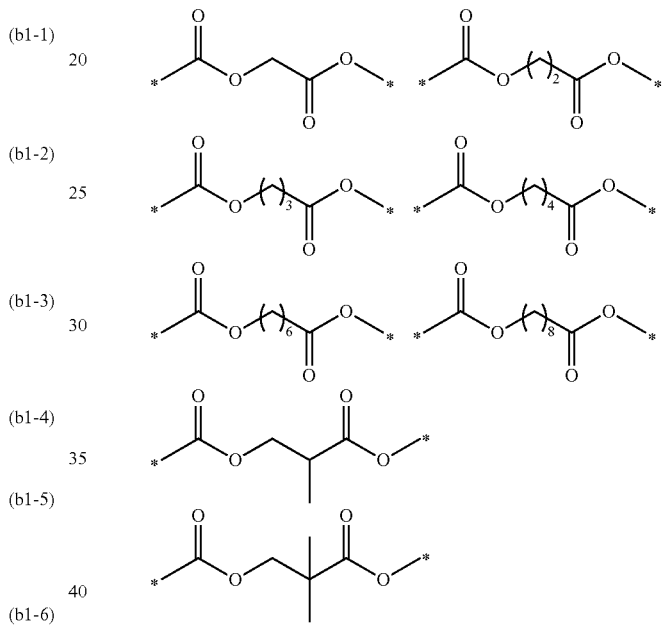

Specific examples of the divalent group represented by the formula (b1-3) include groups below.

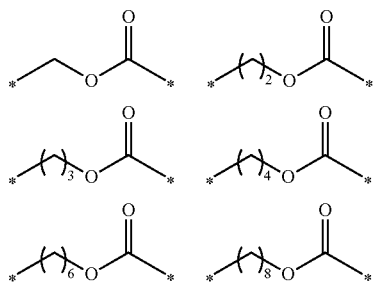

Specific examples of the divalent group represented by the formula (b1-4) include a group below.

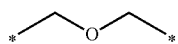

Specific examples of the divalent group represented by the formula (b1-5) include groups below.

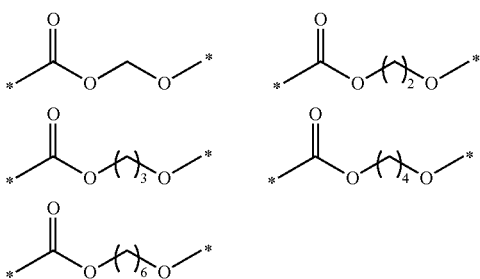

Specific examples of the divalent group represented by the formula (b1-6) include groups below.

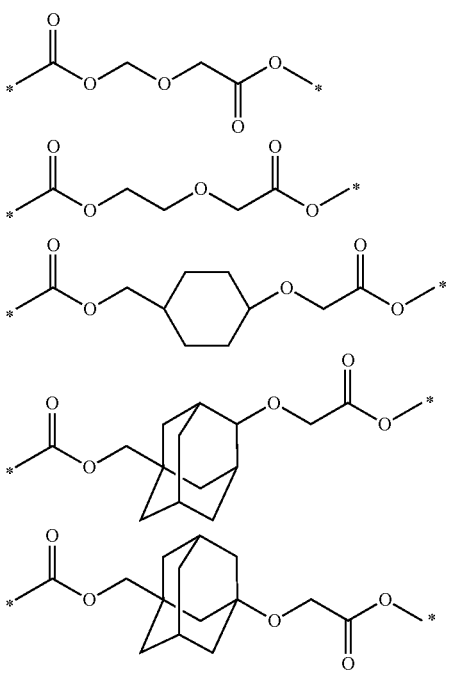

The group having cyclic ether structure of $R^5$ may be either monocyclic ether structure or polycyclic ether structure. Also, the group having cyclic ether structure includes one or more substituents. The ring structure having an oxygen atom in the monocyclic ether structure or polycyclic ether structure preferably has two to five carbon atoms.

Examples of the group having cyclic ether structure include a group represented by the formula (IIA) and a group represented by the formula (IIE).

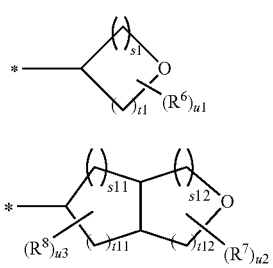

wherein s1 represents an integer of 1 to 4,
t1 represents an integer of 0 to 2,
provided that s1+t1 represents an integer of 1 to 4;
s11 represents an integer of 1 to 4,
t11 represents an integer of 0 to 2;
s12 represents an integer of 1 to 4,
t12 represents an integer of 0 to 2,
provided that s12+t12 represents an integer of 0 to 4;
$R^6$ in each occurrence represents a $C_1$ to $C_{12}$ saturated hydrocarbon group, a $C_6$ to $C_{18}$ aromatic hydrocarbon group, or two $R^6$ are bonded together to form a ring, and one or more hydrogen atoms contained in the saturated hydrocarbon group, the aromatic hydrocarbon group and the ring may be replaced by a $C_1$ to $C_6$ alkyl group or a nitro group, and one or more —$CH_2$— contained in the saturated hydrocarbon group and ring may be replaced by —O—;
u1 represents an integer of 0 to 8;
$R^7$ and $R^8$ in each occurrence independently represent a hydroxy group, a halogen atom, a $C_1$ to $C_6$ alkyl group, a $C_1$ to $C_6$ alkoxyl group, a $C_1$ to $C_6$ hydroxy alkyl group, a $C_2$ to $C_7$ acyl group, a $C_2$ to $C_7$ acyloxy group or a $C_2$ to $C_7$ acylamino group, or two of $R^7$ and/or $R^8$ may be bonded together to form a single bond or a ring;
u2 and u3 independently represent an integer of 0 to 16;
* represent a bond to $X^1$.

Examples of the saturated hydrocarbon group of $R^6$ include an alkyl group, a saturated cyclic hydrocarbon groups (including a spiro ring group).

Examples of the alkyl group include methyl, ethyl, propyl, butyl, pentyl, hexyl and octyl groups.

Examples of the saturated cyclic hydrocarbon group include monocyclic hydrocarbon groups such as cyclopentyl, cyclohexyl, methylcyclohexyl, dimethylcyclohexyl, cycloheptyl, cyclooctyl groups; and polycyclic hydrocarbon groups such as decahydronaphtyl, adamantyl, norbornyl (i.e., bicyclo[2.2.1]heptyl), and methyl norbornyl groups as well as groups below.

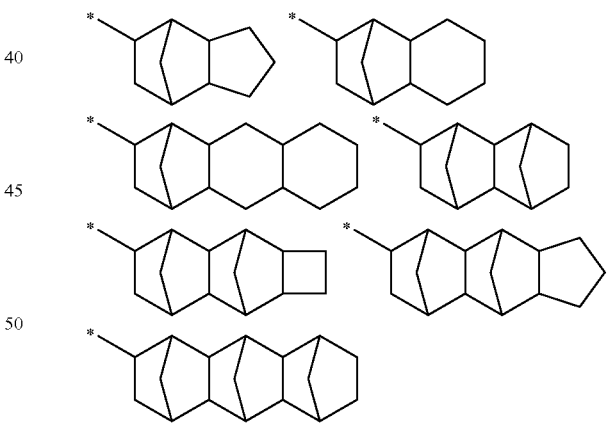

Among these, a cycloalkyl group such as cyclohexyl group, and adamantyl group are preferable as the saturated hydrocarbon group.

Examples of the aromatic hydrocarbon group include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

When two $R^6$ are bonded together to form a ring, the ring may be any of a saturated or an unsaturated ring. Two $R^6$ bonded together to form a ring may bond to different carbon atoms or the same carbon atom, respectively.

Examples of the alkyl group of $R^7$ and $R^8$ include the same as those of groups in $R^6$ described above.

Examples of the alkoxyl group include methoxy, ethoxy, n-propoxy, iso-propoxy, n-butoxy, sec-butoxy, tert-butoxy, n-pentyloxy, and n-hexyloxy groups.

Examples of the hydroxy alkyl group include hydroxymethyl and hydroxyethyl groups.

Examples of the acyl group include acetyl, propionyl and butyryl groups.

Examples of the acyloxy group include acetyloxy, propionyloxy and butyryloxy groups.

Examples of the acylamino group include acetylamino, propionylamino and butyrylamino groups.

When two of $R^7$ and/or $R^8$ are bonded together to form a single bond or a ring, two $R^7$, two $R^8$ or two of $R^7$ and $R^8$ may be bonded together. In particular, when two of $R^7$ and/or $R^8$ are bonded together to form a single bond, two $R^8$ preferably are bonded together.

s1 is preferably 1, t1 is preferably 0 or 1, and s1+t1 is preferably 1 or 2.

s12+t12 is preferably 1 or 2.

Examples of the group represented by the formula (IIA) include groups below.

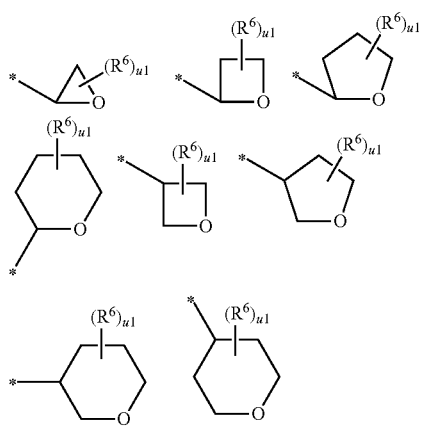

Examples of the group represented by the formula (IIE) include groups below.

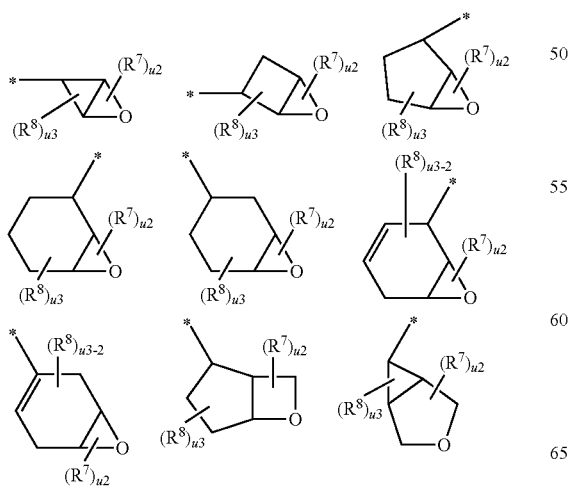

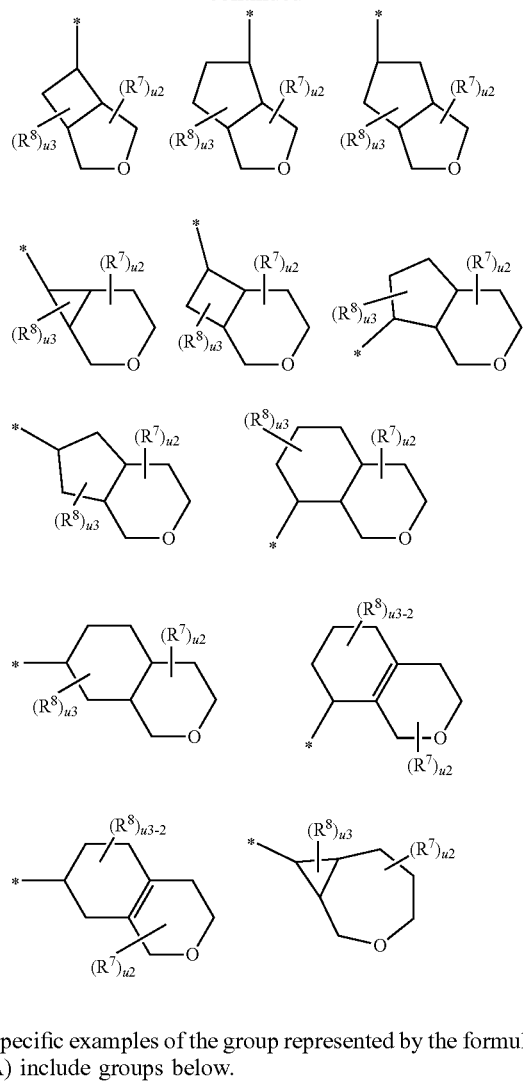

Specific examples of the group represented by the formula (IIA) include groups below.

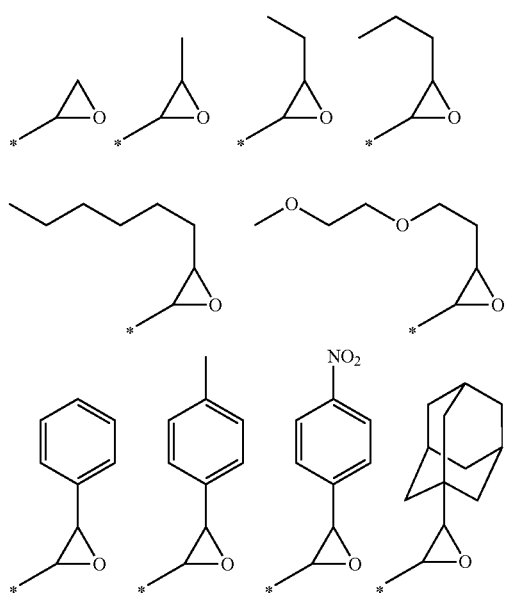

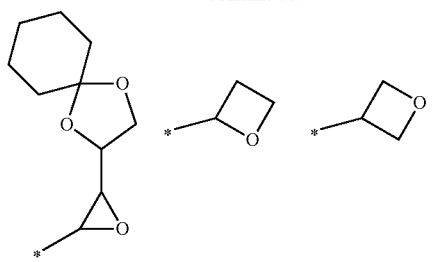
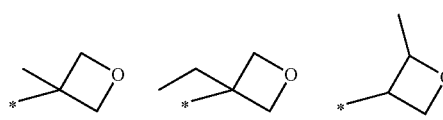
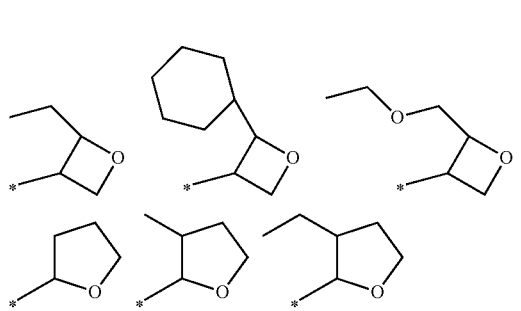
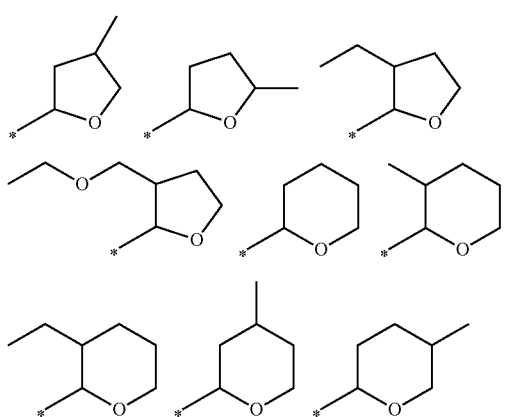
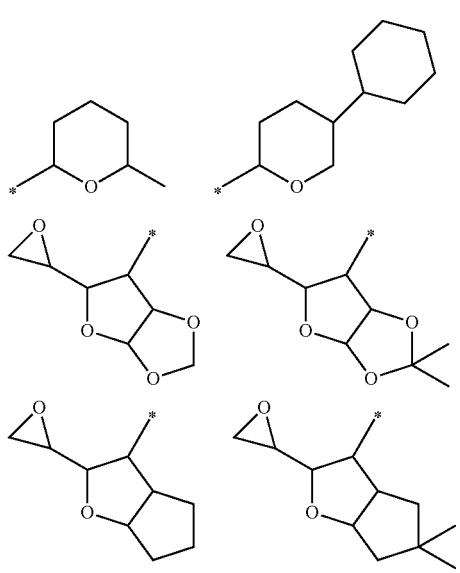
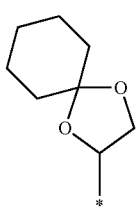
Specific examples of the group represented by the formula (IIE) include groups below.
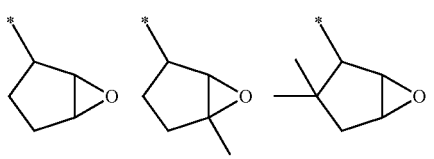
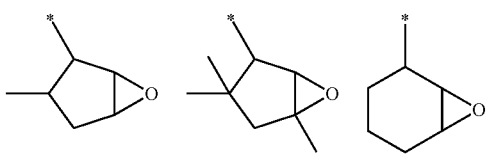
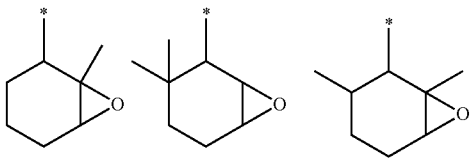
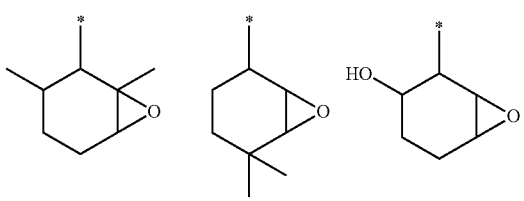
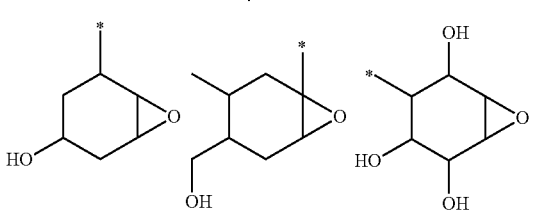
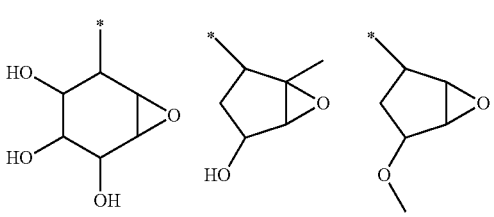
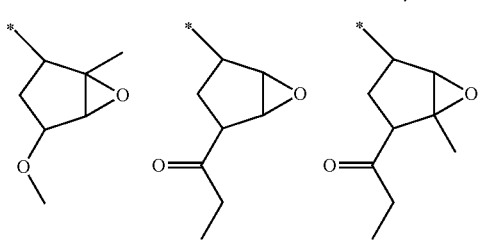

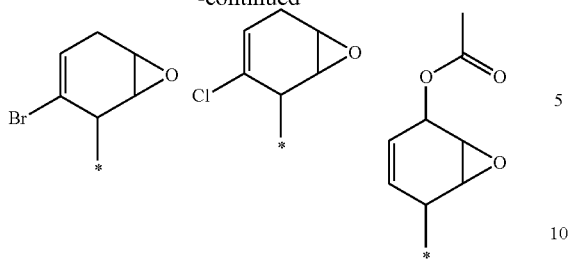

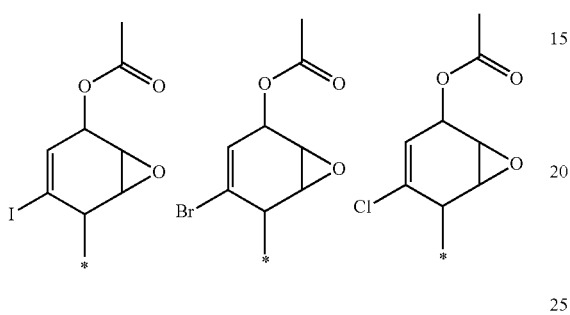

As the group having cyclic ether structure of $R^5$, a group including a $C_2$ to $C_5$ cyclic ether structure is preferable. Example thereof include groups containing an oxirane ring, oxetane ring, 5-membered cyclic ether structure having four carbon atoms such as tetra hydro furan and 6-membered cyclic ether structure having five carbon atoms such as tetrahydro pyrane.

Among these, ether ring structures having two or three carbon atoms are preferable, ether ring structures such as 3-membered ether ring having two carbon atoms (i.e., oxirane ring) and 4-membered cyclic ether structure having three carbon atoms (i.e., oxetane ring) are more preferable, ether ring structures of 3-membered cyclic ether structure having two carbon atoms (i.e., oxirane ring) is still more preferable.

The acid generator (II) is preferably an acid generator represented by the formula (II-a) or the formula (II-b), and more preferably an acid generator represented by the formula (II-a).

(II-a)

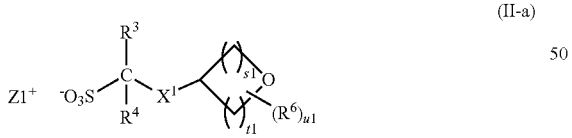

(II-b)

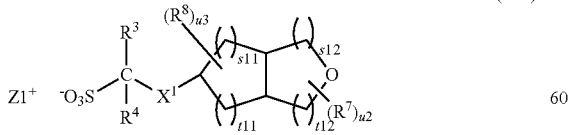

wherein s1, t1, s11, t11, s12, t12, $R^3$, $R^4$, $R^6$, $R^7$, $R^8$, $Z1^+$, $X^1$, u1, u2 and u3 have the same meaning as described above.

Examples of the acid generator (II) include salts below.

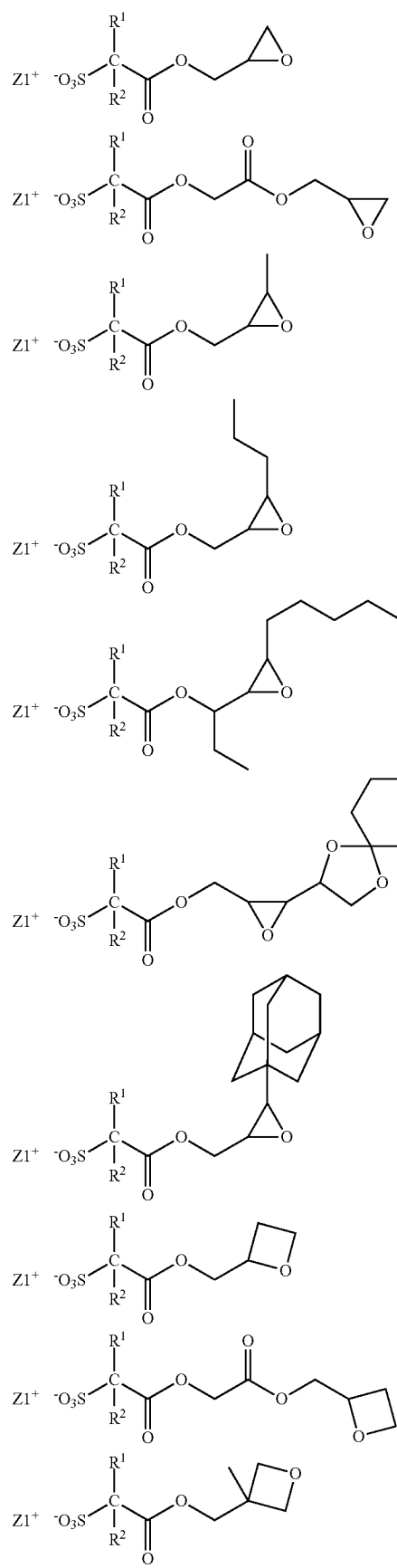

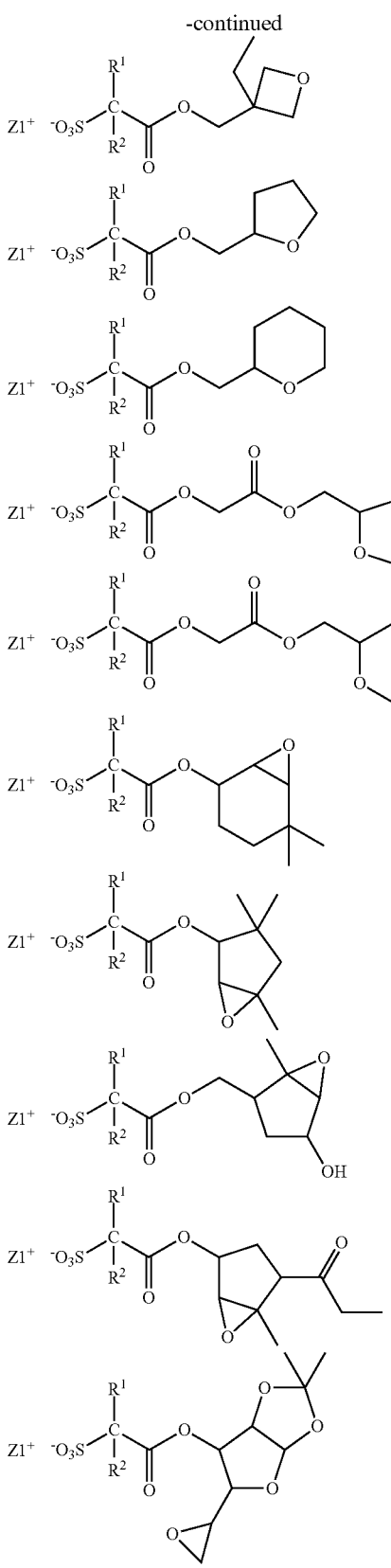

organic phosphonium cation. Among these, organic sulfonium cation and organic iodonium cation are preferable, and aryl sulfonium cation is more preferable.

Z1+ is preferably represented by any of the formula (b2-1) to the formula (b2-4).

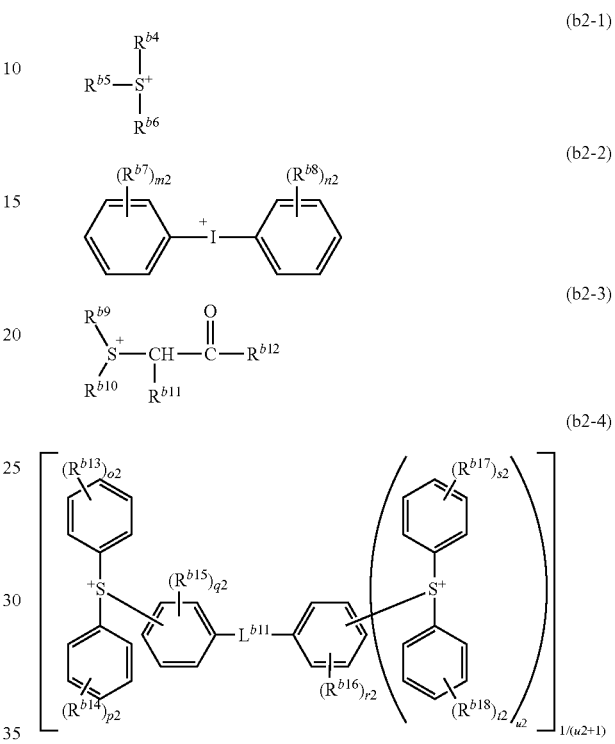

wherein $R^{b4}$, $R^{b5}$ and $R^{b6}$ independently represent a $C_1$ to $C_{30}$ hydrocarbon group, the hydrocarbon group is preferably a $C_1$ to $C_{30}$ alkyl group, a $C_3$ to $C_{18}$ alicyclic hydrocarbon group and a $C_6$ to $C_{18}$ aromatic hydrocarbon group, the alkyl group may be substituted with a hydroxy group, a $C_1$ to $C_{12}$ alkoxy group or a $C_6$ to $C_{18}$ aromatic hydrocarbon group, the alicyclic hydrocarbon group may be substituted with a halogen atom, a $C_2$ to $C_4$ acyl group and a glycidyloxy group, the aromatic hydrocarbon group may be substituted with a halogen atom, a hydroxy group, a $C_1$ to $C_{18}$ alkyl group, a $C_3$ to $C_{18}$ alicyclic hydrocarbon group or a $C_1$ to $C_{12}$ alkoxy group, or $R^{b4}$ and $R^{b5}$ may be bonded together with a sulfur atom bonded thereto to form a sulfur-containing ring;

$R^{b7}$ and $R^{b8}$ in each occurrence independently represent a hydroxy group, a $C_1$ to $C_{12}$ alkyl group or a $C_1$ to $C_{12}$ alkoxyl group;

m2 and n2 independently represent an integer of 0 to 5;

$R^{b9}$ and $R^{b10}$ independently represent a $C_1$ to $C_{18}$ alkyl group or a $C_3$ to $C_{18}$ alicyclic hydrocarbon group, or $R^{b9}$ and $R^{b10}$ may be bonded together with a sulfur atom bonded thereto to form a sulfur-containing 3- to 12-membered (preferably 3- to 7-membered) ring, and one or more —$CH_2$— contained in the ring may be replaced by —O—, —S— or —CO—;

$R^{b11}$ represents a hydrogen atom, a $C_1$ to $C_{18}$ alkyl group, a $C_3$ to $C_{18}$ alicyclic hydrocarbon group or a $C_6$ to $C_{18}$ aromatic hydrocarbon group;

$R^{b12}$ represents a $C_1$ to $C_{12}$ alkyl group, a $C_3$ to $C_{18}$ alicyclic hydrocarbon group and a $C_6$ to $C_{18}$ aromatic hydro- Examples of Z1+ include an organic onium cation, for example, organic sulfonium cation, organic iodonium cation, organic ammonium cation, benzothiazolium cation and carbon group, the aromatic hydrocarbon group may be substituted with a $C_1$ to $C_{12}$ alkyl group, a $C_1$ to $C_{12}$ alkoxy group, a $C_3$ to $C_{18}$ alicyclic hydrocarbon group or a $C_1$ to $C_{12}$ alkyl carbonyloxy group;

$R^{b11}$ and $R^{b12}$ may be bonded together with —CH—CO— bonded thereto to form a 3- to 12-membered (preferably a 3- to 7-membered) ring, and one or more —CH$_2$— contained in the ring may be replaced by —O—, —S— or —CO—;

$R^{b13}$, $R^{b14}$, $R^{b15}$, $R^{b16}$, $R^{b17}$ and $R^{b18}$ in each occurrence independently represent a hydroxy group, a $C_1$ to $C_{12}$ alkyl group or a $C_1$ to $C_{12}$ alkoxy group;

$L^{b11}$ represents —S— or —O—;

o2, p2, s2 and t2 independently represent an integer of 0 to 5;

q2 or r2 independently represent an integer of 0 to 4;

u2 represents an integer of 0 or 1.

Examples of the alkyl group preferably include methyl, ethyl, n-propyl, isopropyl, n-butyl, sec-butyl, tert-butyl, pentyl, hexyl, octyl and 2-ethylhexyl groups. Among these, the alkyl group of $R^{b9}$ to $R^{b12}$ is preferably a $C_1$ to $C_{12}$ alkyl group.

Examples of the alicyclic hydrocarbon group preferably include monocyclic groups such as cyclopentyl, cyclohexyl, methylcyclohexyl, dimethylcyclohexyl, cycloheptyl, cyclooctyl groups; and polycyclic hydrocarbon groups such as decahydronaphtyl, adamantyl, norbornyl (i.e., bicyclo[2.2.1]heptyl), and methyl norbornyl groups as well as groups below.

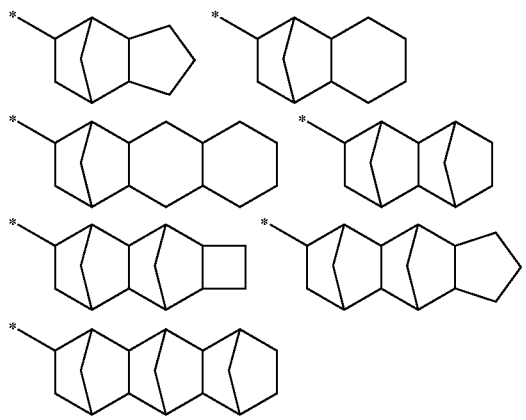

Among these, the alicyclic group of $R^{b9}$ to $R^{b11}$ is preferably a $C_3$ to $C_{18}$ alicyclic group, and more preferably a $C_4$ to $C_{12}$ alicyclic group, such as cyclopropyl, cyclobutyl, cyclopentyl, cyclohexyl, cycloheptyl, cyclodecyl, 2-alkyladamantane-2-yl, 1-(adamatane-1-yl)-1-alkyl and isobornyl groups.

Examples of the aromatic hydrocarbon group preferably include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups. Among these, examples thereof of $R^{b12}$ preferably include phenyl, 4-methylphenyl, 4-ethylphenyl, 4-t-butylphenyl, 4-cyclohexylphenyl, 4-methoxyphenyl, naphthyl and biphenyl groups.

Examples of the aromatic group substituted with an alkyl group typically represent an aralkyl group such as benzyl and phenethyl groups.

Examples of the halogen atom include fluorine, chlorine, bromine or iodine atom.

Examples of the alkoxyl group include methoxy, ethoxy, n-propoxy, iso-propoxy, n-butoxy, sec-butoxy, tert-butoxy, n-pentyloxy, n-hexyloxy, heptyloxy, octyloxy, 2-ethylhexyloxy, nonyloxy, decyloxy, undecyloxy and dodecyloxy groups.

Examples of the acyl group include acetyl, propionyl and butyryl groups.

Examples of the alkyl carbonyloxy group of the $R^{b12}$ include methyl carbonyloxy, ethyl carbonyloxy, n-propyl carbonyloxy, isopropyl carbonyloxy, n-butyl carbonyloxy, sec-butyl carbonyloxy, tert-butyl carbonyloxy, pentyl carbonyloxy, hexyl carbonyloxy, octylcarbonyloxy and 2-ethylhexylcarbonyloxy groups.

The sulfur atom-containing ring which is formed by $R^{b4}$ and $R^{b5}$ may be any of monocyclic, polycyclic, aromatic, non-aromatic, saturated and unsaturated rings. Also, the sulfur atom-containing ring may have at least one of sulfur atom and/or at least one of oxygen atom in addition to one sulfur atom. The sulfur atom-containing ring is preferably a ring having 3 to 18 carbon atoms, and more preferably a ring having 4 to 13 carbon atoms.

Examples of the ring having a sulfur atom and formed by $R^{b9}$ and $R^{b10}$ bonded together include thiolane-1-ium ring (tetrahydrothiophenium ring), thian-1-ium ring and 1,4-oxathian-4-ium ring.

Examples of the ring having —CH—CO— and formed by $R^{b11}$ and $R^{b12}$ bonded together include oxocycloheptane ring, oxocyclohexane ring, oxonorbornane ring and oxoadamantane ring.

Specific examples of the sulfonate anion include sulfonate anions described in JP2010-204646A.

Among the cations represented by the formula (b2-1) to the formula (b2-4), the cation represented by the formula (b2-1-1) is preferable, and triphenyl sulfonium cation (v2=w2=x2=0 in the formula (b2-1-1)), diphenyltolyl sulfonium cation (v2=w2=0, x2=1, and $R^{b21}$ is a methyl group in the formula (b2-1-1)) and tritolyl sulfonium cation (v2=w2=x2=1, $R^{b19}$, $R^{b20}$ and $R^{b21}$ are a methyl group in the formula (b2-1-1)) are more preferable.

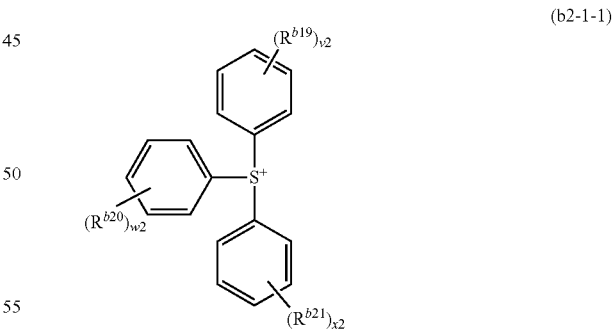

(b2-1-1)

wherein $R^{b19}$, $R^{b20}$ and $R^{b21}$ in each occurrence independently represent a halogen atom, a hydroxy group, a $C_1$ to $C_{12}$ alkyl group, a $C_3$ to $C_{18}$ alicyclic hydrocarbon group or a $C_1$ to $C_{12}$ alkoxy group, or two of $R^{b19}$, $R^{b20}$ and $R^{b21}$ may be bonded together to form a hetero atom-containing ring;

v2 to x2 independently represent an integer of 0 to 5.

In the formula (b2-1-1), $R^{b19}$ to $R^{b21}$ independently preferably represent a halogen atom (and more preferably fluorine atom), a hydroxy group, a $C_1$ to $C_{12}$ alkyl group or a $C_1$ to $C_{12}$ alkoxy group; and v2 to x2 independently represent preferably 0 or 1.
Specific examples of the cation of the formula (b2-1-1) include a cation below.
(b2-c-1)
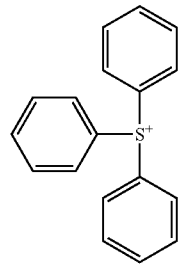
(b2-c-2)
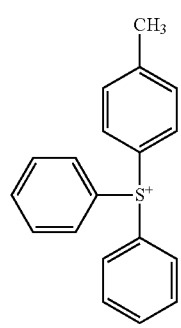
(b2-c-3)
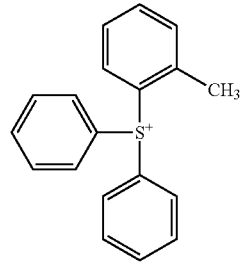
(b2-c-4)
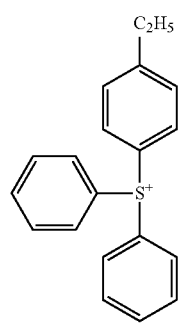
(b2-c-5)
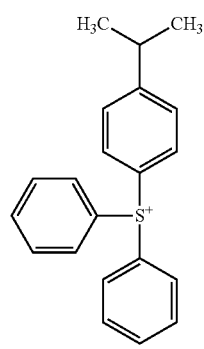
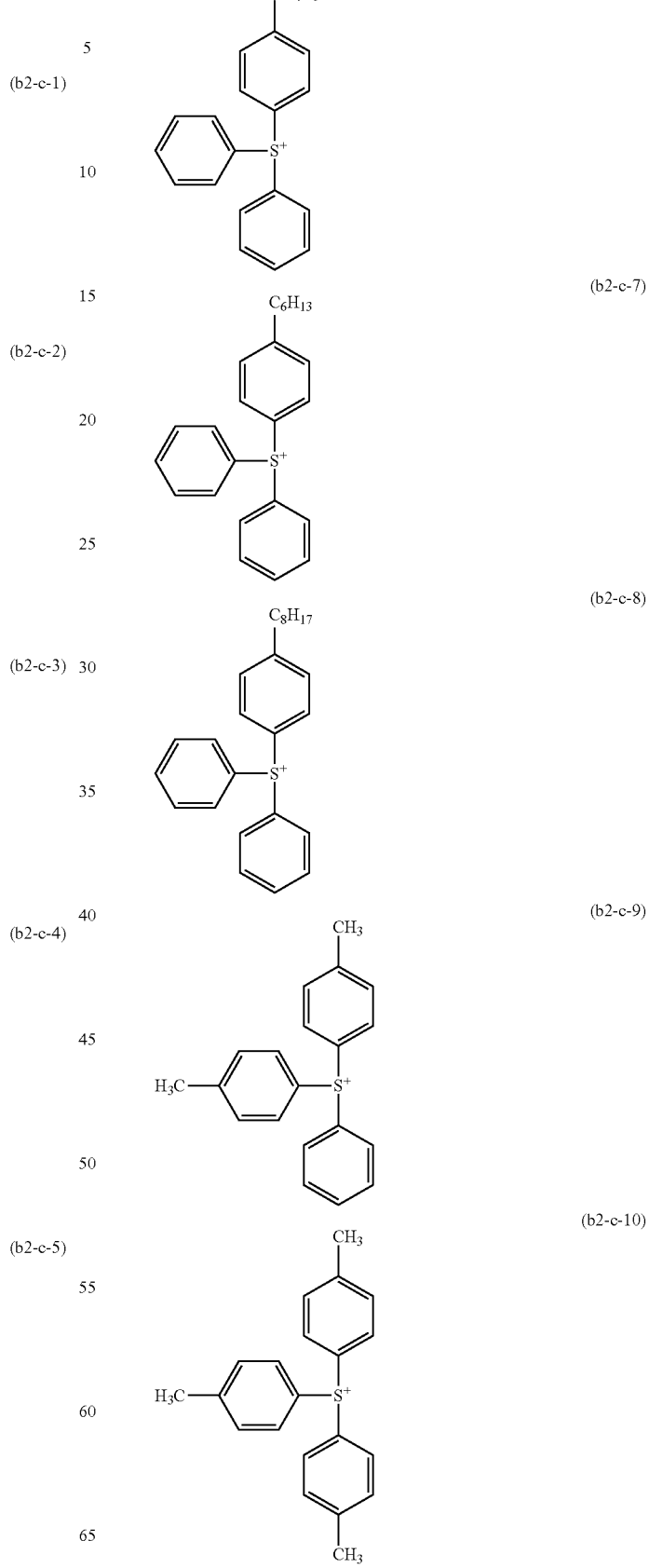

(b2-c-11) 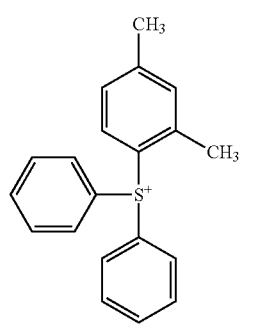
(b2-c-12) 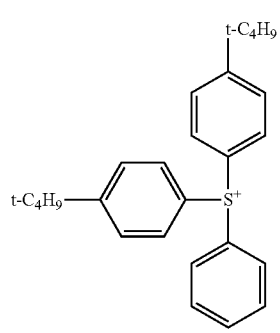
(b2-c-13) 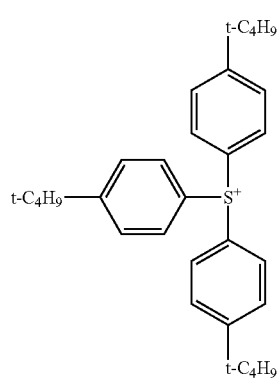
(b2-c-14) 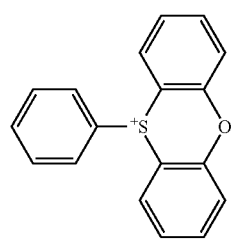
(b2-c-15) 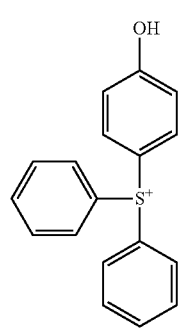
(b2-c-16) 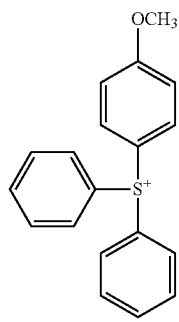
(b2-c-17) 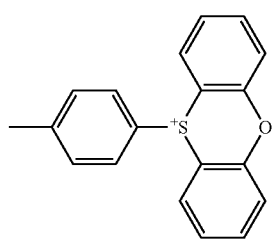
(b2-c-18) 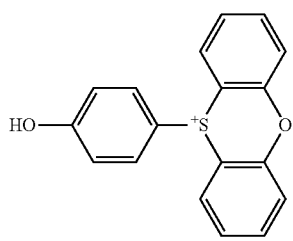
(b2-c-19) 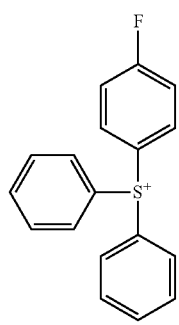
(b2-c-20) 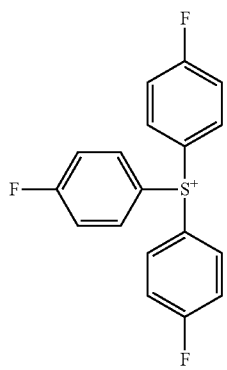

(b2-c-21)
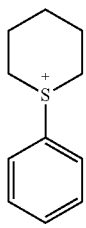
(b2-c-22)
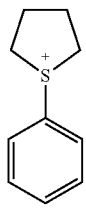
(b2-c-23)
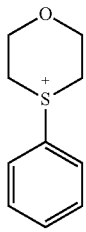
(b2-c-24)
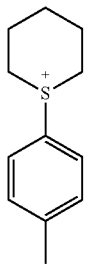
(b2-c-25)
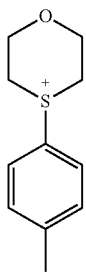
(b2-c-26)
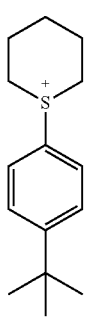
(b2-c-27)
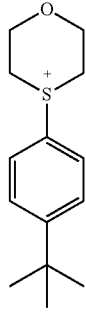
Specific examples of the cation of the formula (b2-2) include a cation below.
(b2-c-28)
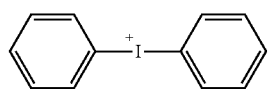
(b2-c-29)
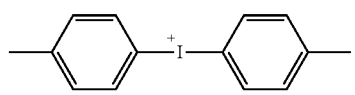
(b2-c-30)
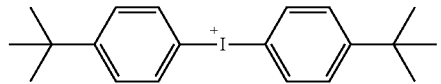
Specific examples of the cation of the formula (b2-3) include a cation below.
(b2-c-31)
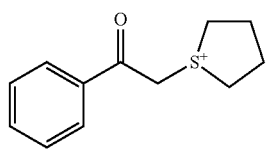
(b2-c-32)
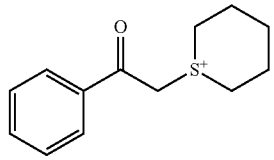
(b2-c-33)
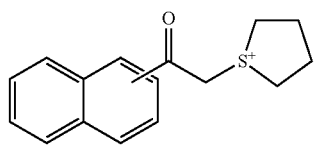
(b2-c-34)
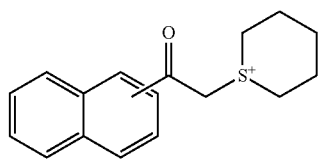

The acid generator (II) is a compound in combination of the above anion and cation. The above anion and cation may optionally be combined, for example, examples thereof include salts below.
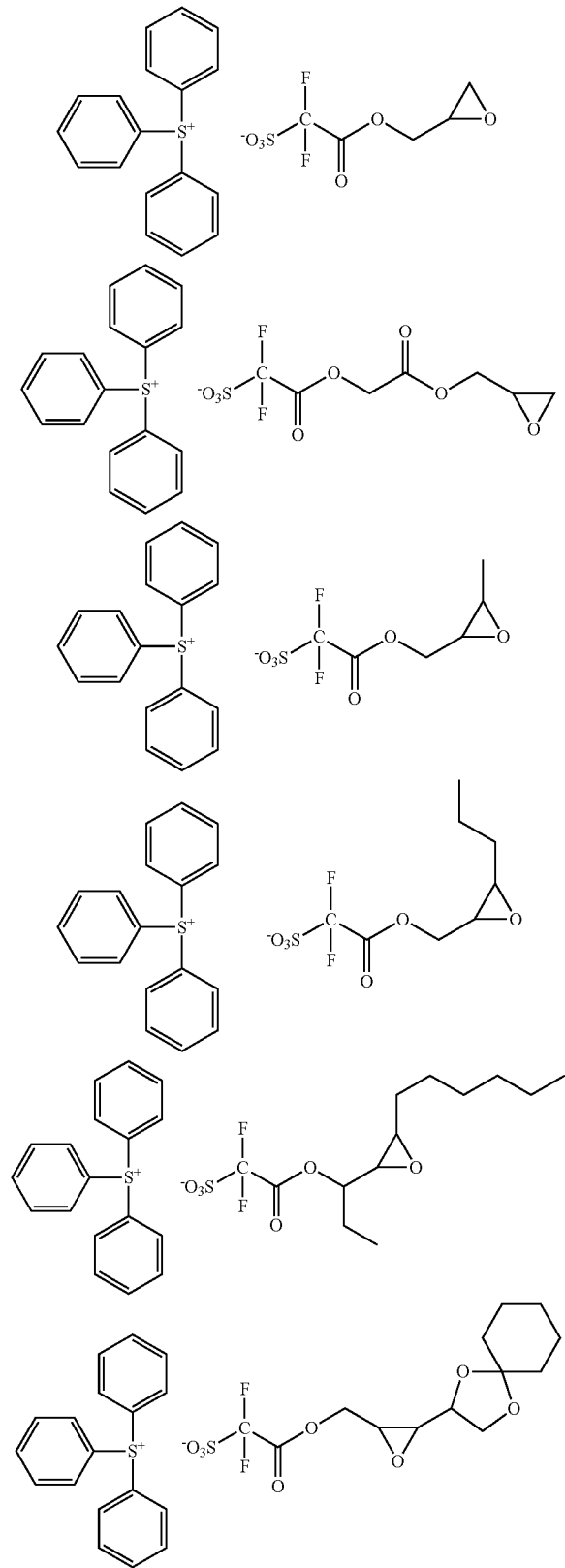
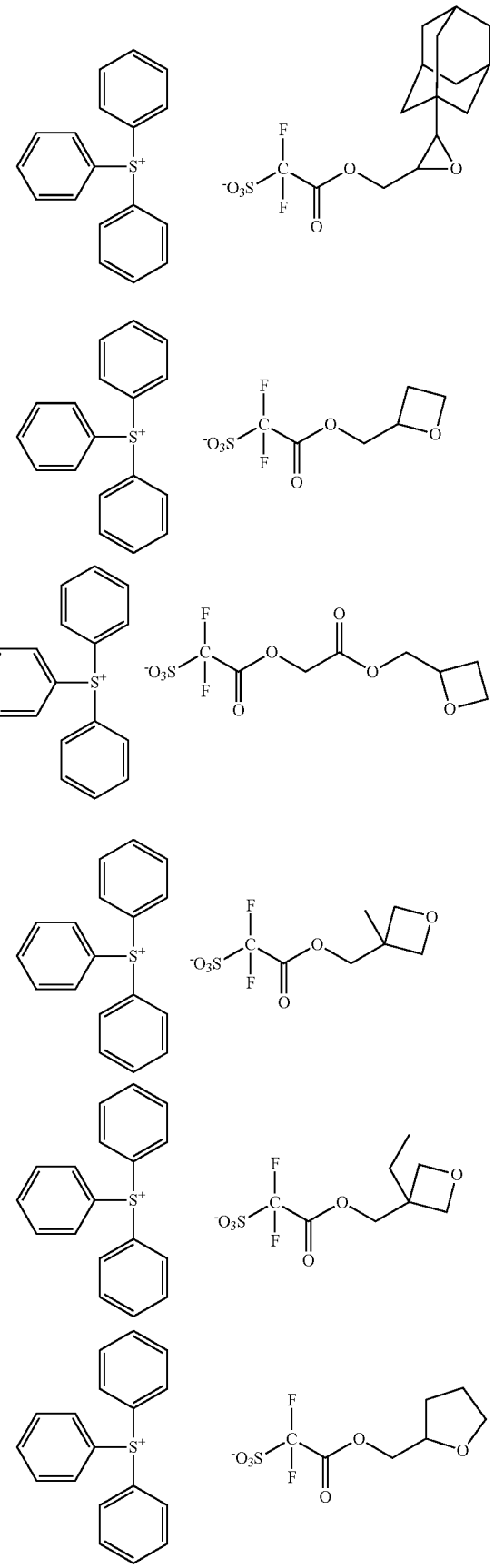
-continued

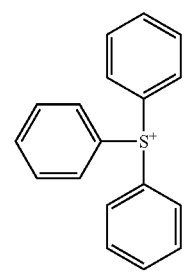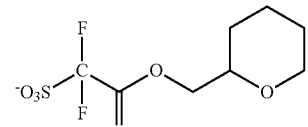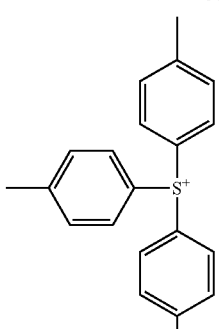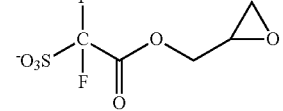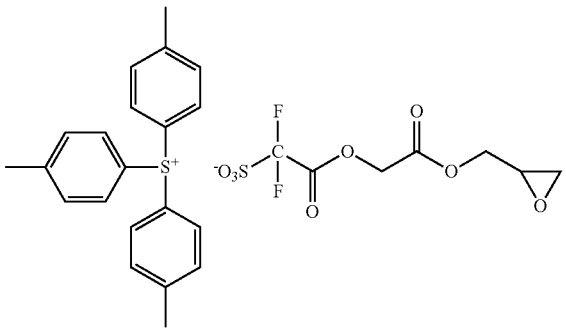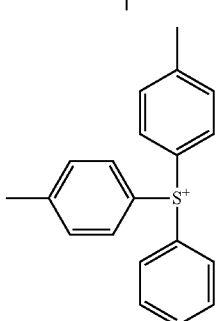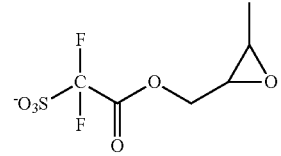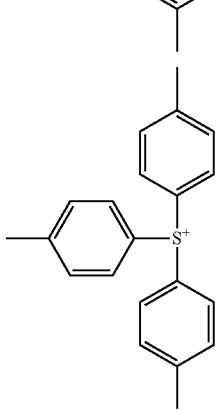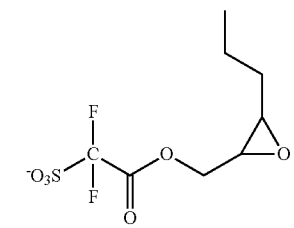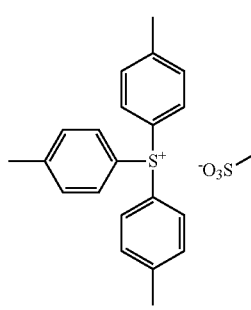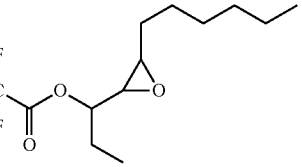

47
-continued
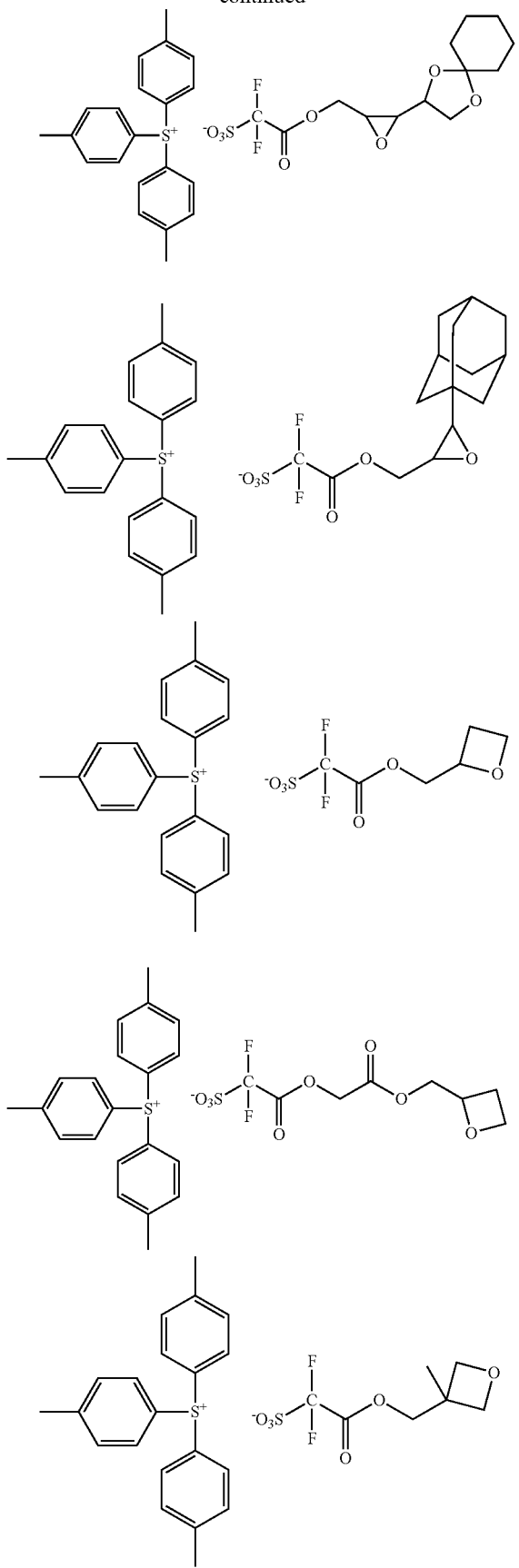
48
-continued
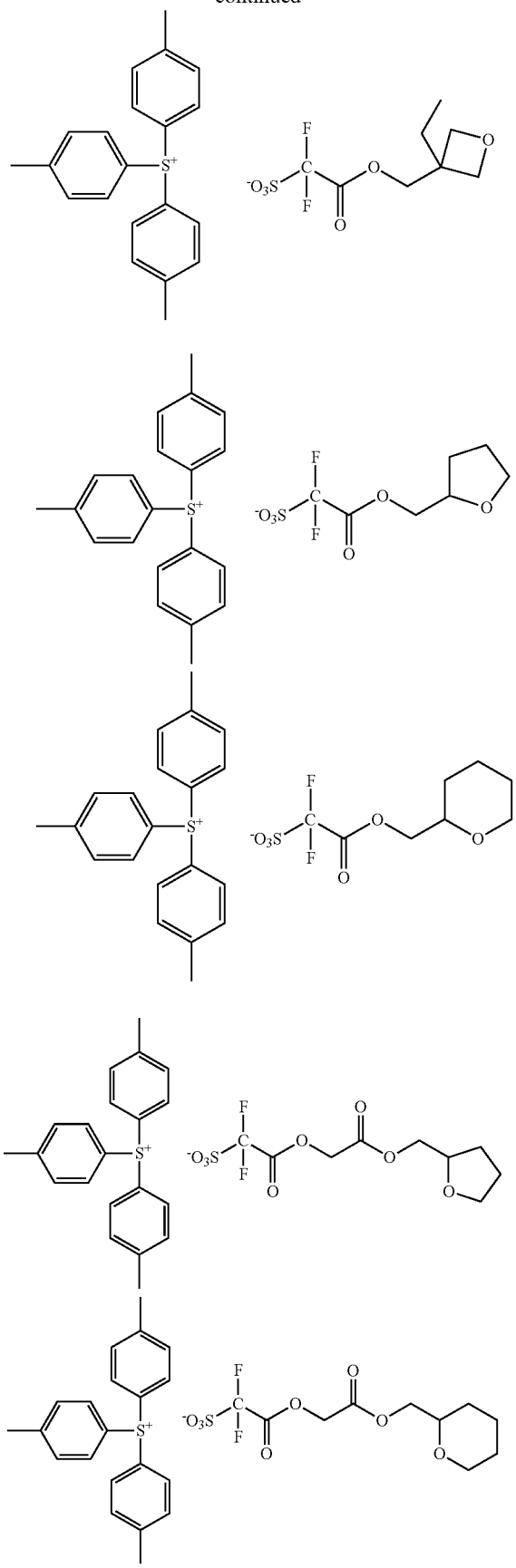

49
-continued
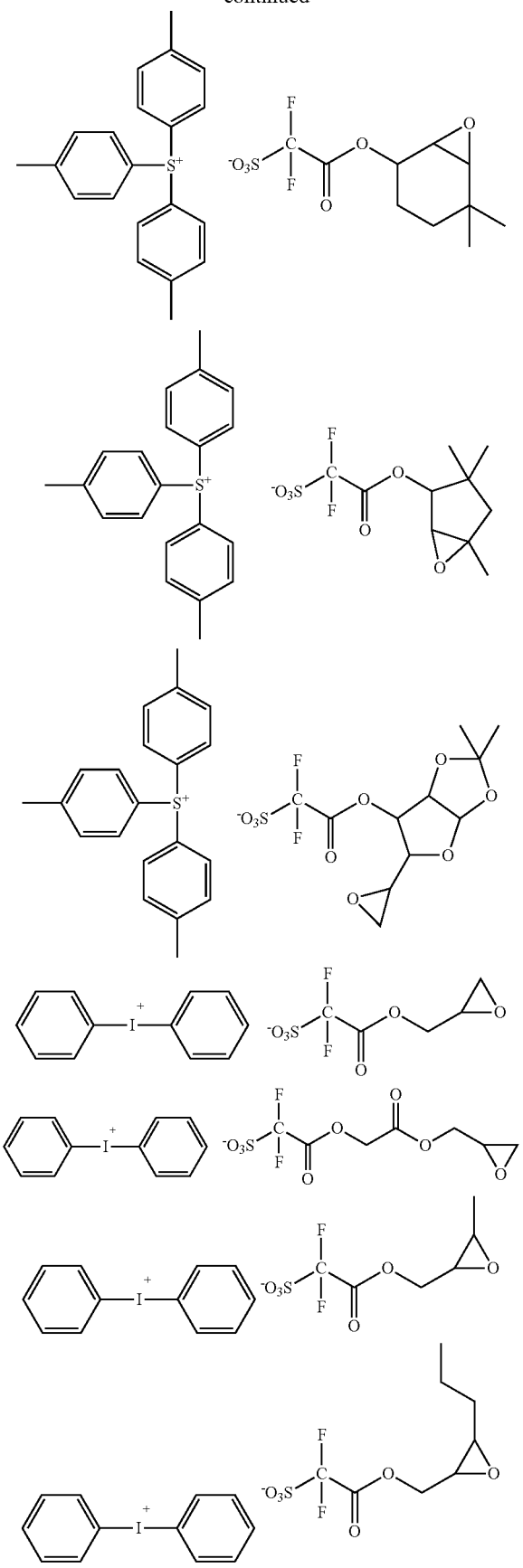
50
-continued
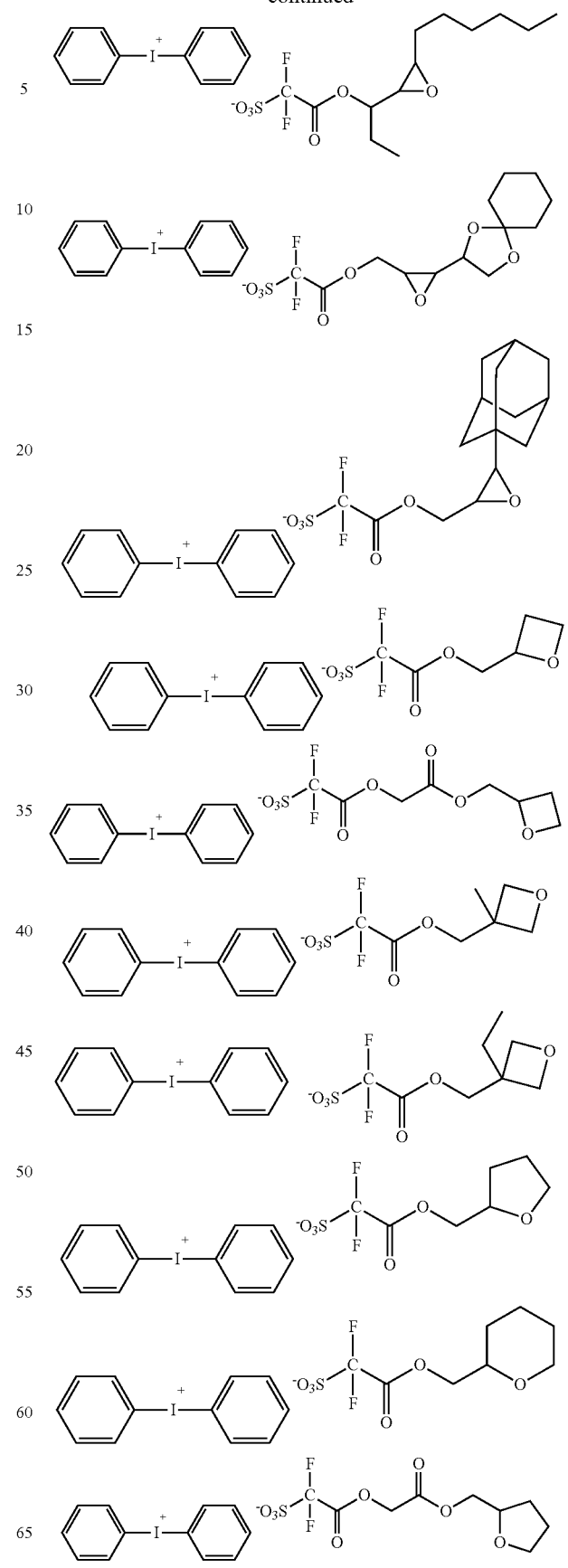

51
-continued
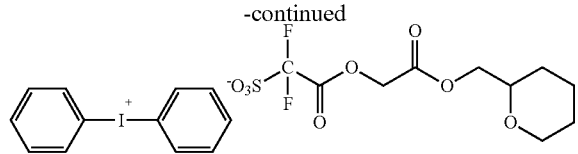
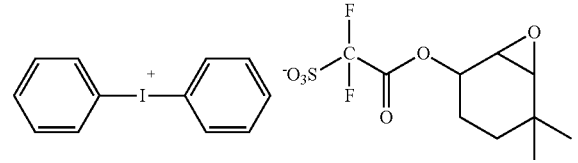
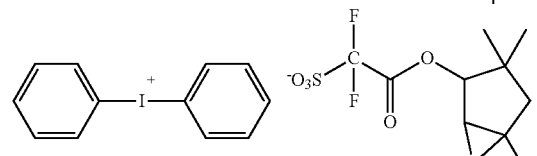
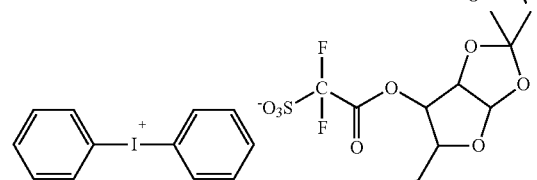
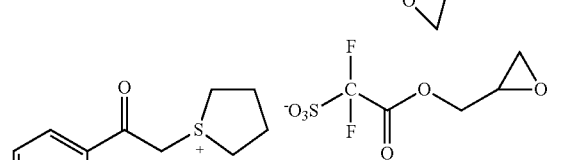
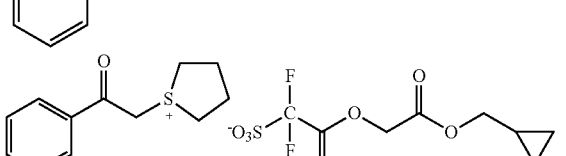
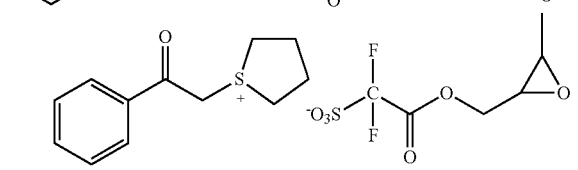
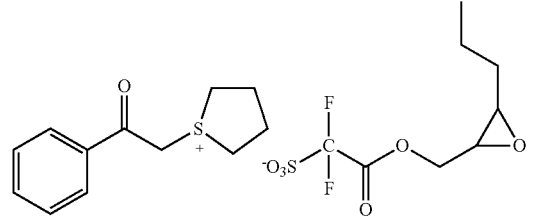
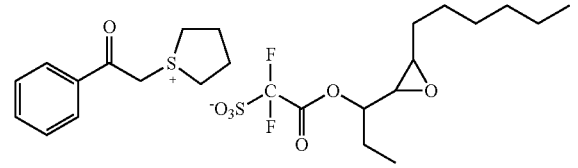
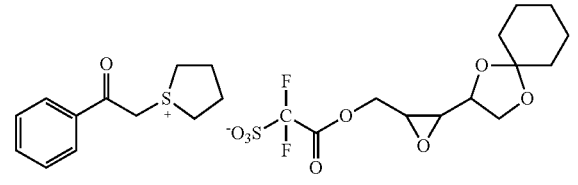
52
-continued
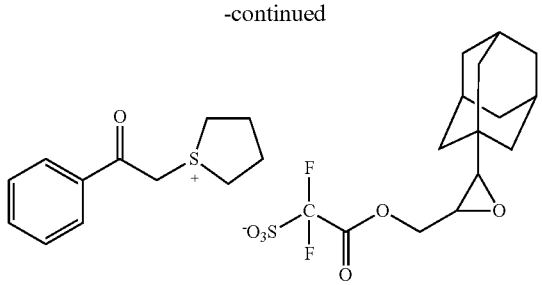
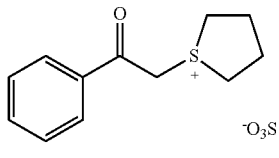
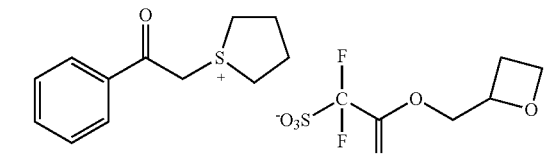
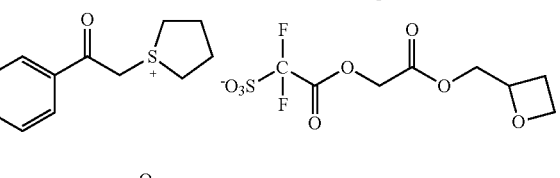
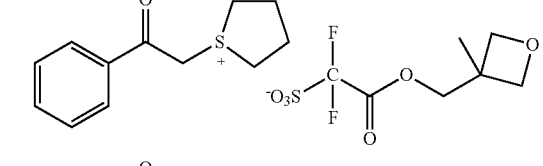
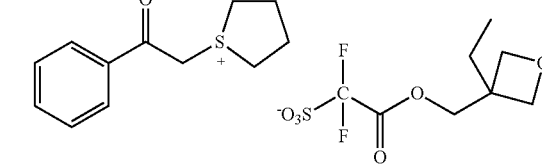
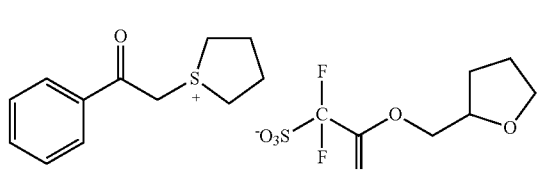
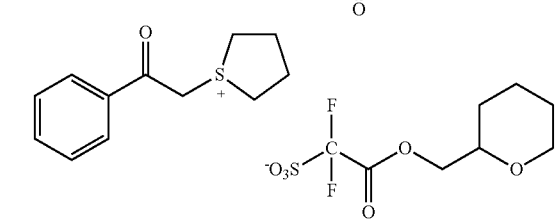
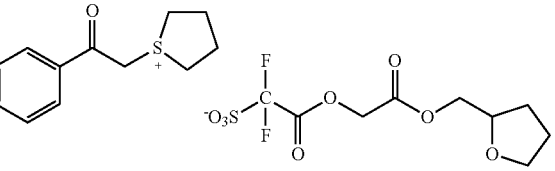
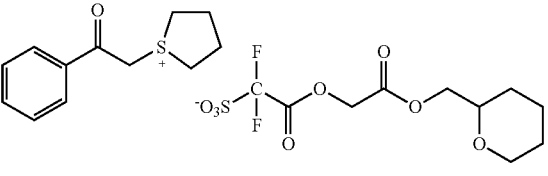

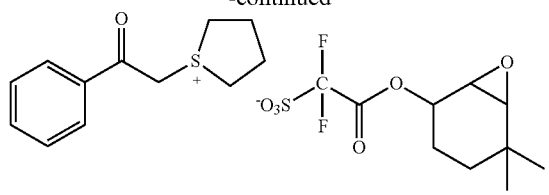

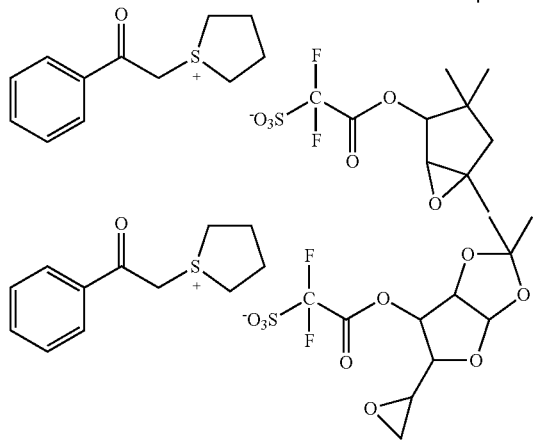

The acid generator (II) can be produced by methods described as or according to below (1) to (3). In the formula below, s1, t1, s11, t11, s12, t12, u1, u2, u3, $R^3$, $R^4$, $R^5$, $R^6$, $R^7$, $R^8$, $L^{b2}$, $L^{b3}$, $L^{b4}$, $Z1^+$ have the same meaning as described above.

(1) An acid generator represented by the formula (IIa) in which $X^1$ in the formula (II) is a group represented by the formula (b1-1), i.e., —CO—O—$L^{b2}$— can be produced by reacting a salt represented by the formula (II-1) with a compound represented by the formula (II-2) in a solvent.

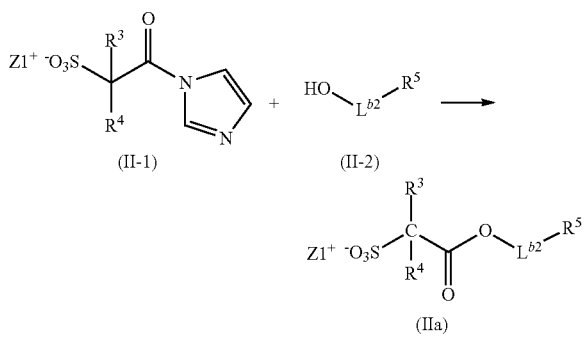

Preferred examples of the solvent include acetonitrile.

(2) An acid generator represented by the formula (II-a-a) in which $X^1$ in the formula (II-a) is a group represented by the formula (b1-1), i.e., —CO—O—$L^{b2}$— can be produced by reacting a salt represented by the formula (IIA-1) with a compound represented by the formula (IIA-2) in a solvent.

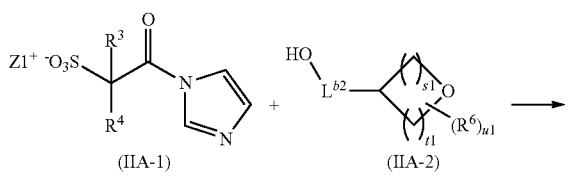

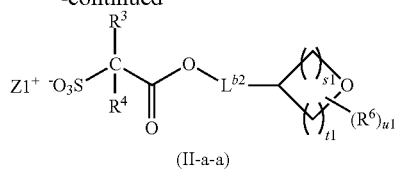

Preferred examples of the solvent include acetonitrile.

Examples of the compound represented by the formula (IIA-2) include glycidol, 2-hydroxymethyl oxetane and 3-ethyl-3-oxetane methanol.

The salt represented by the formula (IIA-1) can be obtained by reacting a salt represented by the formula (IIA-3) with a compound represented by the formula (IIA-4), i.e., carbonyldiimidazole in a solvent. Preferred examples of the solvent include acetonitrile.

The salt represented by the formula (IIA-3) can be formed by a method described in JP2008-127367A.

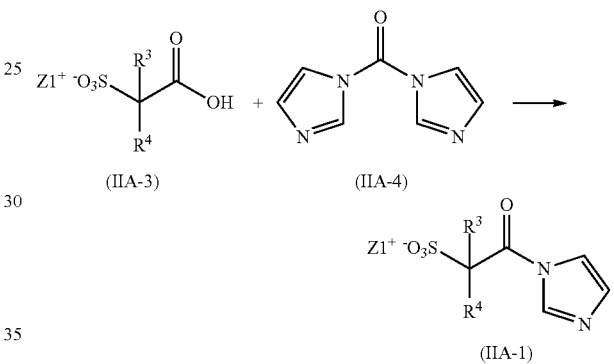

(3) An acid generator represented by the formula (II-a-b) in which $X^1$ in the formula (II-a) is a group represented by the formula (b1-2), i.e., —CO—O—$L^{b4}$—CO—O—$L^{b3}$— can be produced by reacting a salt represented by the formula (IIB-1) with a compound represented by the formula (IIB-2) in a solvent. Preferred examples of the solvent include acetonitrile.

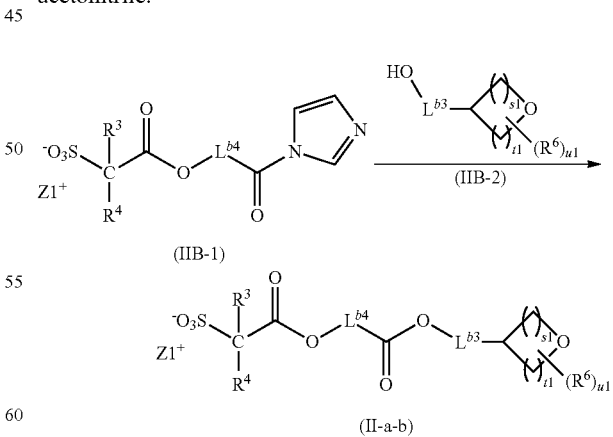

The compound represented by the formula (IIB-1) can be obtained by reacting a salt represented by the formula (IIB-2) with a compound represented by the formula (IIB-3), i.e., carbonyldiimidazole in a solvent. Preferred examples of the solvent include acetonitrile.

Examples of the compound represented by the formula (IIB-2) include glycidol and 2-hydroxymethyl oxetane.

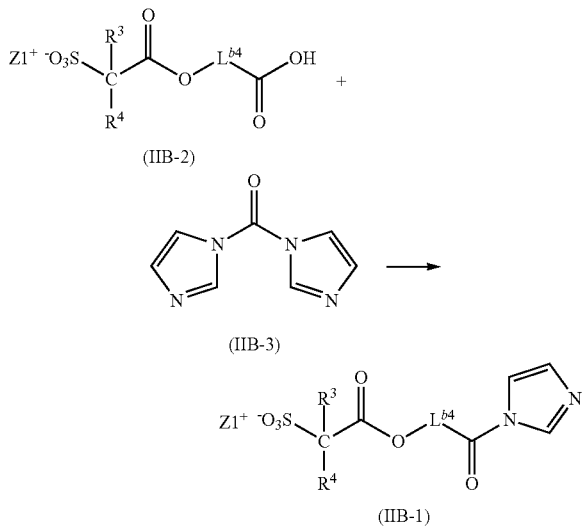

The salt represented by the formula (IIB-2) can be obtained by reacting a salt represented by the formula (IIB-4) with a compound represented by the formula (IIB-5) in presence of a catalyst in a solvent. Preferred examples of the solvent include dimethylformamide. Preferred examples of the catalyst include potassium carbonate and potassium iodide.

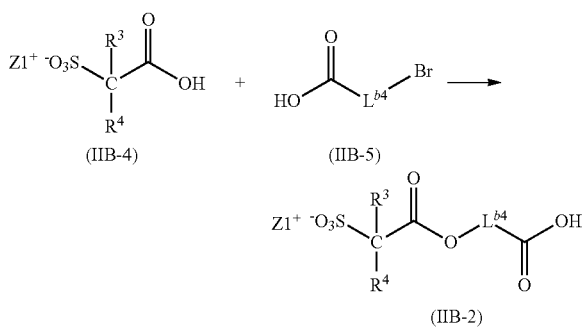

The salt represented by the formula (IIB-4) can be formed by a method described in JP2008-127367A.

Examples of the compound represented by the formula (IIB-5) include bromo acetic acid.

The acid generator (II) may be used as a single salt or as a combination of two or more salts.

<Acid Generator (B)>

The resist composition of the present invention may include one or more known salt for the acid generator other than the acid generator (II). That is, the resist composition of the present invention may include one or more other acid generator than the acid generator (II) (hereinafter is sometimes referred to as "acid generator (B)").

An acid generator (B) is classified into non-ionic-based or ionic-based acid generator. The present resist composition may be used either acid generators.

Examples of the non-ionic-based acid generator include organic halogenated compounds; sulfonate esters such as 2-nitrobenzyl ester, aromatic sulfonate, oxime sulfonate, N-sulfonyl oxyimide, sulfonyl oxyketone and diazo naphthoquinone 4-sulfonate; sulfones such as disulfone, ketosulfone and sulfone diazomethane.

Examples of the ionic acid generator includes onium salts containing onium cation (such as diazonium salts, phosphonium salts, sulfonium salts, iodonium salts).

Examples of anion of onium salts include sulfonate anion, sulfonylimide anion and sulfonylmethyde anion.

For the acid generator (B), compounds which generate an acid by radiation described in JP S63-26653-A, JP S55-164824-A, JP S62-69263-A, JP S63-146038-A, JP S63-163452-A, JP S62-153853-A, JP S63-146029-A, U.S. Pat. No. 3,779,778-B, U.S. Pat. No. 3,849,137-B, DE3,914,407-B and EP-126,712-A can be used.

Also, as the acid generator (B), compounds formed according to conventional methods can be used.

The acid generator (B) is preferably a fluorine-containing acid generator represented by the formula (B1) as described below. In the acid generator (B1), electropositive $Z^+$ hereinafter is sometimes referred to as "an organic cation", and electronegative one in which the organic cation has been removed from the compound is sometimes referred to as "sulfonate anion".

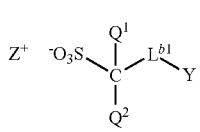

wherein $Q^1$ and $Q^2$ independently represent a fluorine atom or a $C_1$ to $C_6$ perfluoroalkyl group;

$L^{b1}$ represents a single bond or an $C_1$ to $C_{17}$ divalent saturated hydrocarbon group, and one or more —CH$_2$— contained in the divalent saturated hydrocarbon group may be replaced by —O— or —CO—;

Y represents an optionally substituted $C_1$ to $C_{18}$ alkyl group or an optionally substituted $C_3$ to $C_{18}$ saturated alicyclic hydrocarbon group, and one or more —CH$_2$— contained in the alkyl group and saturated alicyclic hydrocarbon group may be replaced by —O—, —CO— or —SO$_2$—, provided that the saturated alicyclic hydrocarbon group in which one or more —CH$_2$— is replaced by —O— has a lactone structure; and $Z^+$ represents an organic cation.

Examples of the perfluoroalkyl group of $Q^1$ and $Q^2$ include the same as those of groups in $R^3$ and $R^4$ of the formula (II) described above.

$Q^1$ and $Q^2$ independently are preferably trifluoromethyl or fluorine atom, and more preferably a fluorine atom.

Examples of the a divalent saturated hydrocarbon group of $L^{b1}$ include any of a chain alkanediyl group, a branched chain alkanediyl group, a monocyclic-alicyclic hydrocarbon group, a polycyclic-alicyclic hydrocarbon group and a combination of two or more groups, and the same as those of groups in $X^1$ of the formula (II) described above.

Examples of the saturated hydrocarbon group of $L^{b1}$ in which one or more —CH$_2$— contained in the saturated hydrocarbon group is replaced by —O— or —CO— include groups represented by the formula (b1-1) to the formula (b1-6) above.

Examples of the aliphatic hydrocarbon group of Y include methyl, ethyl, n-propyl, isopropyl, n-butyl, sec-butyl, tert-butyl, pentyl, hexyl, octyl, 2-ethylhexyl, nonyl, decyl, undecyl and dodecyl groups. The aliphatic hydrocarbon group of Y is preferably a $C_1$ to $C_6$ alkyl group.

Examples of the saturated alicyclic hydrocarbon group of Y include groups represented by the formula (Y1) to the formula (Y11).

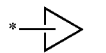
(Y1)

(Y2)

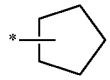
(Y3)

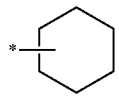
(Y4)

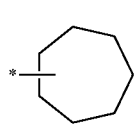
(Y5)

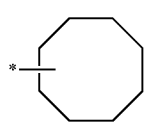
(Y6)

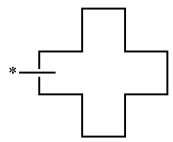
(Y7)

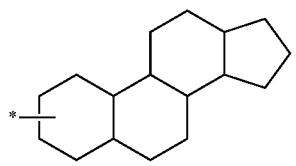
(Y8)

(Y9)

(Y10)

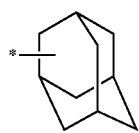
(Y11)

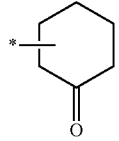
(Y12)

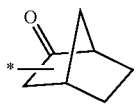
(Y13)

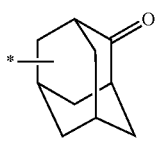
(Y14)

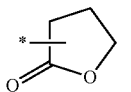
(Y15)

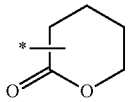
(Y16)

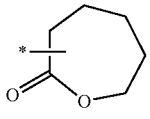
(Y17)

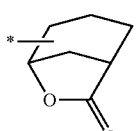
(Y18)

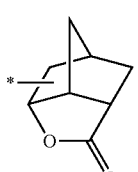
(Y19)

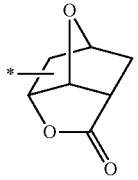
(Y25)

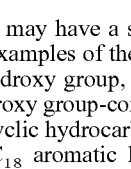
(Y26)

Y may have a substituent.

Examples of the substituent of Y include a halogen atom, a hydroxy group, an oxo group, a $C_1$ to $C_{12}$ alkyl group, a hydroxy group-containing $C_1$ to $C_{12}$ alkyl group, a $C_3$ to $C_{16}$ alicyclic hydrocarbon group, a $C_1$ to $C_{12}$ alkoxy group, a $C_6$ to $C_{18}$ aromatic hydrocarbon group, a $C_7$ to $C_{21}$ aralkyl group, a $C_2$ to $C_4$ acyl group, a glycidyloxy group or a —$(CH_2)_{j2}$—O—CO—$R^{b1}$ group, wherein $R^{b1}$ represents a $C_1$ to $C_{16}$ alkyl group, a $C_3$ to $C_{16}$ alicyclic hydrocarbon group or a $C_6$ to $C_{18}$ aromatic hydrocarbon group, j2 represents an integer of 0 to 4. The alkyl group, alicyclic hydrocarbon group, aromatic hydrocarbon group and the aralkyl group of the substituent may further have a substituent such as a $C_1$ to $C_6$ alkyl group, a halogen atom, a hydroxy group and an oxo group.

Examples of the halogen atom include fluorine, chlorine, bromine or iodine atom.

Examples of the hydroxy group-containing alkyl group include hydroxymethyl and hydroxyethyl groups.

Examples of the alkoxyl group include methoxy, ethoxy, n-propoxy, iso-propoxy, n-butoxy, sec-butoxy, tert-butoxy, n-pentyloxy, n-hexyloxy, heptyloxy, octyloxy, 2-ethylhexyloxy, nonyloxy, decyloxy, undecyloxy and dodecyloxy groups.

Examples of the aromatic hydrocarbon group include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

Examples of the aralkyl group include benzyl, phenethyl, phenylpropyl, naphthylmethyl and naphthylethyl groups.

Examples of the acyl group include acetyl, propionyl and butyryl groups.

Examples of saturated alicyclic hydrocarbon group of Y in which one or more —$CH_2$— contained in the saturated alicyclic hydrocarbon group is replaced by —O—, —CO— or —$SO_2$— include groups represented by the formula (Y12) to the formula (Y19), the formula (Y25) and the formula (Y26).

Among these, the saturated alicyclic hydrocarbon group is preferably any one of groups represented by the formula (Y1) to the formula (Y19), more preferably any one of groups represented by the formula (Y11), (Y14), (Y15) or (Y19), and still more preferably group represented by the formula (Y11) or (Y14).

Examples of Y include the groups below.

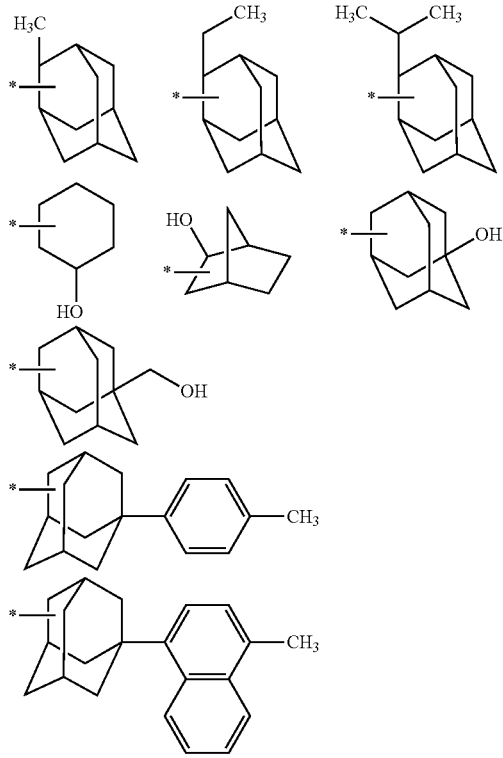

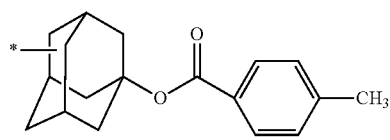

When Y represents an alkyl group and $L^{b1}$ represents a $C_1$ to $C_{17}$ divalent alicyclic hydrocarbon group, the —$CH_2$— contained in the divalent alicyclic hydrocarbon group bonding Y is preferably replaced by an oxygen atom or carbonyl group. In this case, the —$CH_2$— contained in the alkyl group constituting Y is not replaced by an oxygen atom or carbonyl group.

Y is preferably an optionally substituted $C_3$ to $C_{18}$ saturated alicyclic hydrocarbon group, more preferably an adamantyl group which is optionally substituted with, for example, an oxo group and a hydroxy group, and still more preferably an adamantyl group, a hydroxyadamantyl group and an oxoadamantyl group.

The sulfonate anion in the salt represented by the formula (B1) is preferably a sulfonate anions represented by the formula (b1-1-1) to the formula (b1-1-9) below. In the formula (b1-1-1) to the formula (b1-1-9), $Q^1$, $Q^2$ and $L^{b2}$ represents the same meaning as defined above. $R^{b2}$ and $R^{b3}$ independently represent a $C_1$ to $C_4$ alkyl group (preferably methyl group).

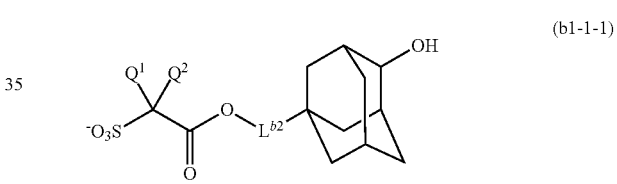

(b1-1-1)

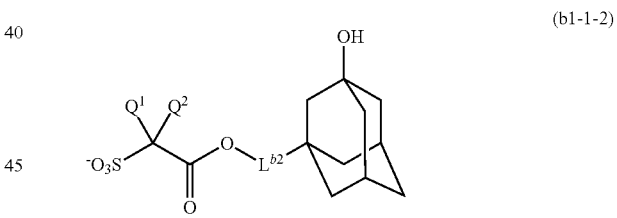

(b1-1-2)

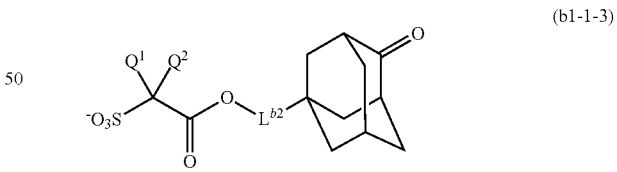

(b1-1-3)

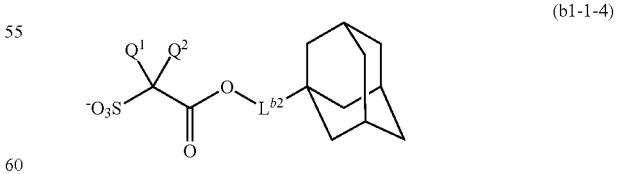

(b1-1-4)

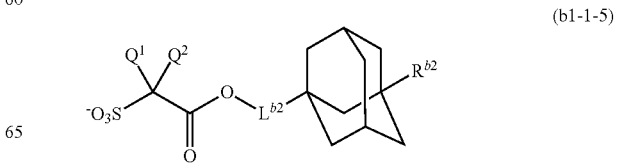

(b1-1-5)

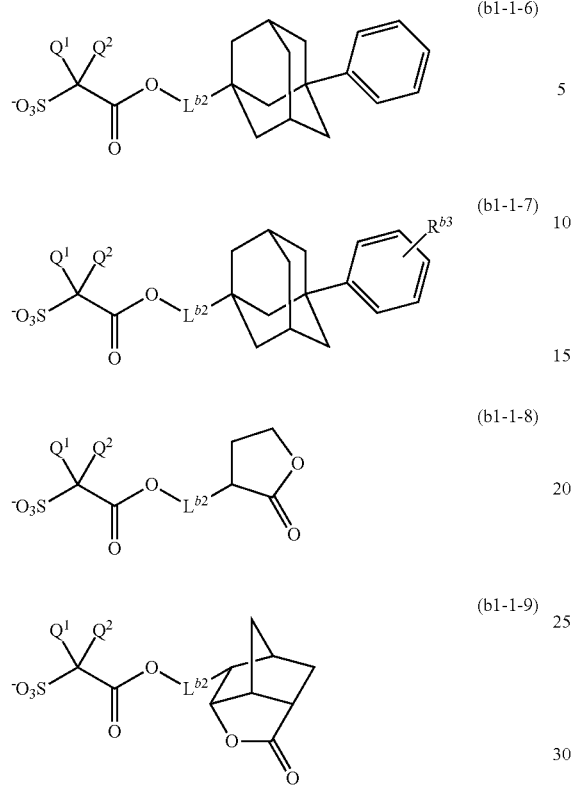

(b1-1-6)
(b1-1-7)
(b1-1-8)
(b1-1-9)

Specific examples of the sulfonate anion include sulfonate anions described in JP2010-204646A.

Examples of the cation of the acid generator (B) include an organic onium cation, for example, organic sulfonium cation, organic iodonium cation, organic ammonium cation, benzothiazolium cation and organic phosphonium cation. Among these, organic sulfonium cation and organic iodonium cation are preferable, and aryl sulfonium cation is more preferable.

Examples of the cation $Z^+$ of the acid generator (B1) preferably include the same as those of cations in the formula (b2-1) to the formula (b2-4) described above.

Preferred acid generators (B1) are represented by the formula (B1-1) to the formula (B1-20). Among these, the formulae (B1-1), (B1-2), (B1-6), (B1-11), (B1-12), (B1-13) and (B1-14) which contain triphenyl sulfonium cation, and the formulae (B1-3) and (B1-7) which contain tritolyl sulfonium cation are preferable.

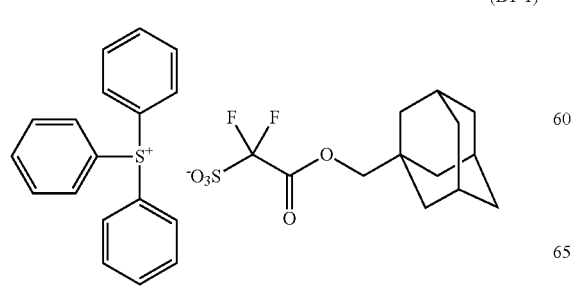

(B1-1)

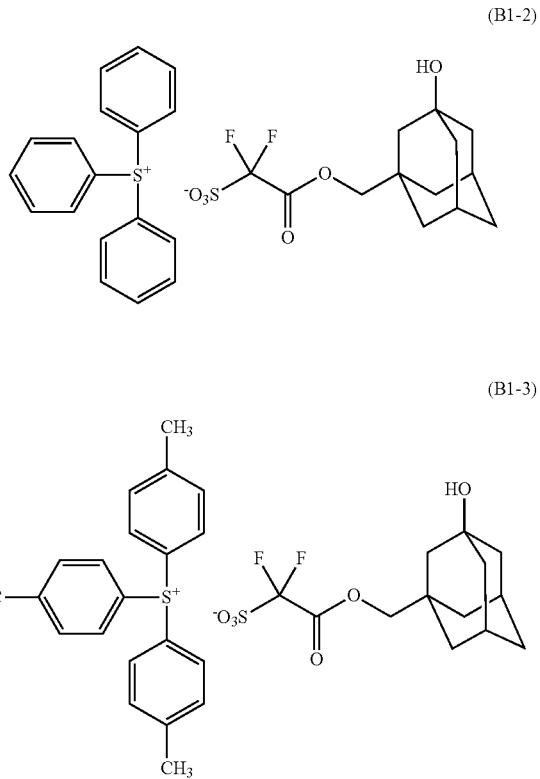

(B1-2)
(B1-3)

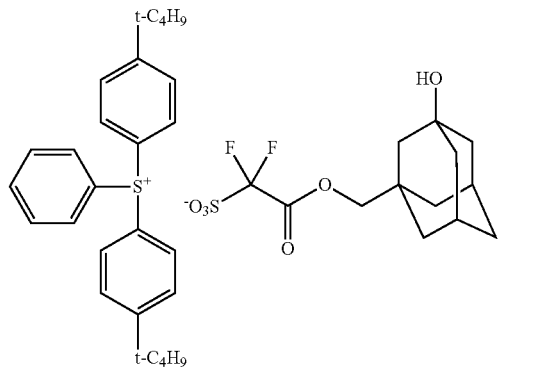

(B1-4)
(B1-5)

(B1-6)
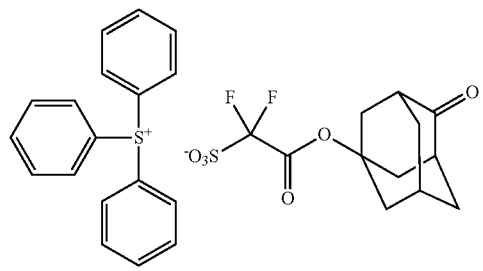
(B1-7)
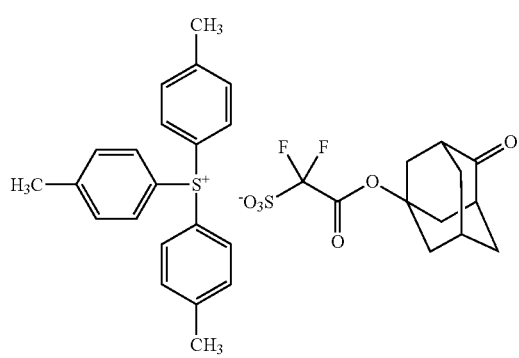
(B1-8)
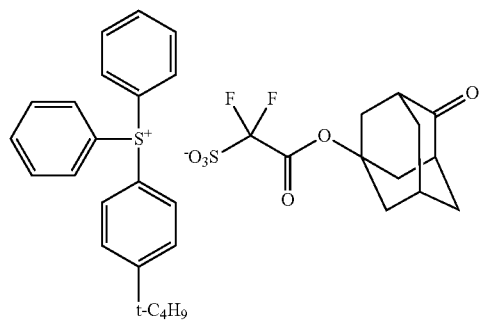
(B1-9)
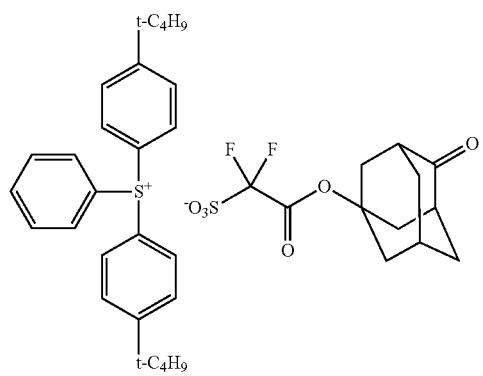
(B1-10)
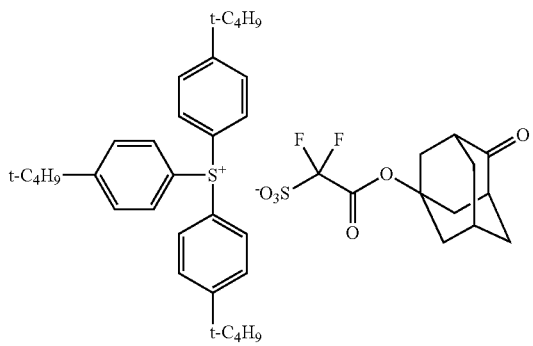
(B1-11)
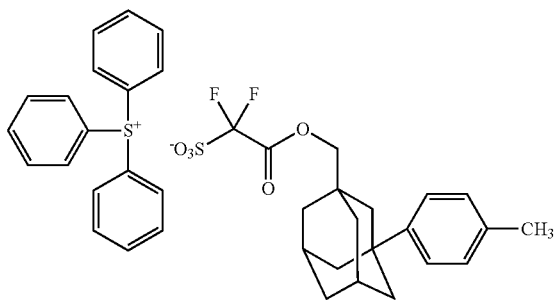
(B1-12)
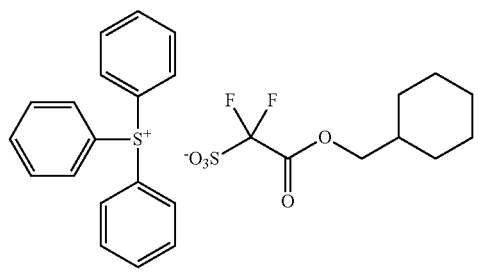
(B1-13)
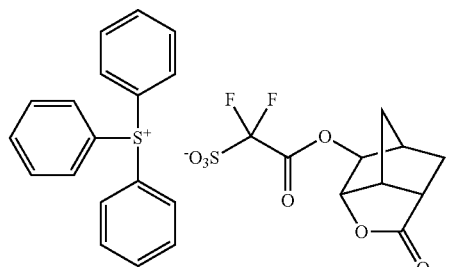
(B1-14)
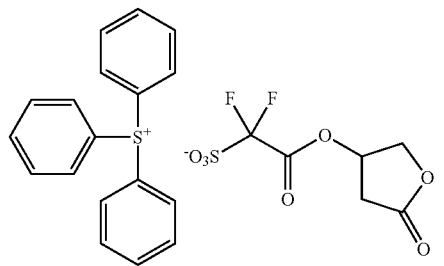

-continued (B1-15)
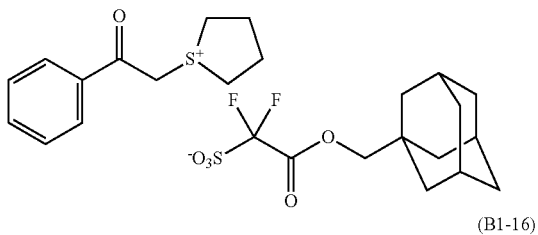

(B1-16)
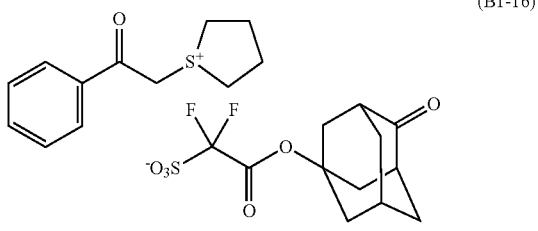

(B1-17)
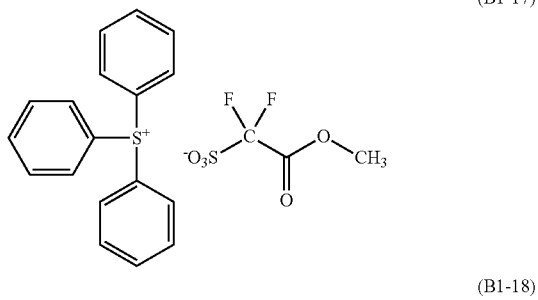

(B1-18)
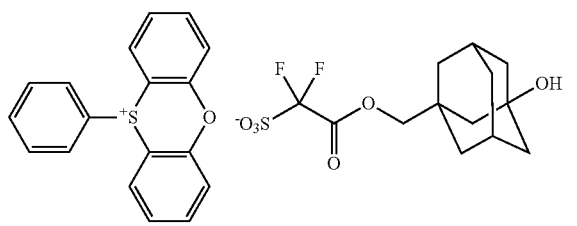

(B1-19)
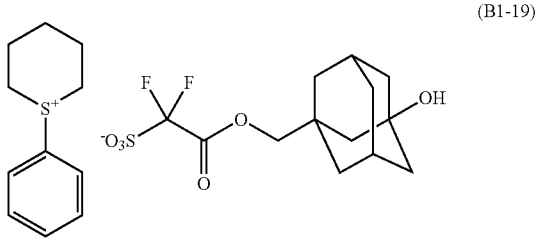

(B1-20)
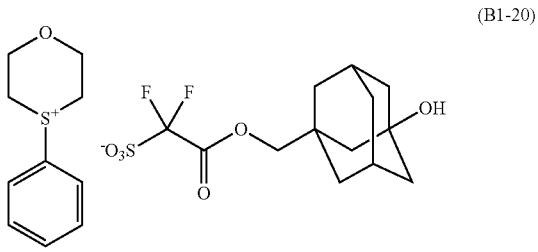

When the salt represented by the formula (B) is used as the acid generator, the salt may be used as a single salt or as a combination of two or more salts.

In the resist composition of the present invention in which the acid generator (II) is contained as the acid generator, the proportion of the acid generator (II) is preferably not less than 1 parts by weight (and more preferably not less than 3 parts by weight), and not more than 30 parts by weight (and more preferably not more than 25 parts by weight), with respect to 100 parts by weight of the resin (A).

In the resist composition of the present invention in which the acid generator (II) is contained together with the acid generator (B), the total proportion of the acid generator (II) and the acid generator (B) is preferably not less than 1 parts by weight (and more preferably not less than 3 parts by weight), and not more than 40 parts by weight (and more preferably not more than 35 parts by weight), with respect to 100 parts by weight of the resin (A).

In this case, the weight ratio of the acid generator (II)/acid generator (B) may be 5/95 to 95/5, preferably 10/90 to 90/10, and more preferably 15/85 to 85/15.

<Compound (I)>

The compound (I) is the compound represented by the formula (I) below.

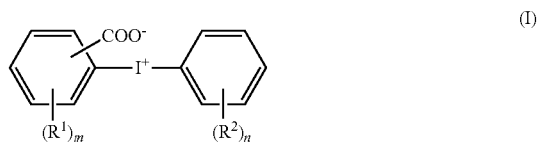

wherein $R^1$ and $R^2$ in each occurrence independently represent a $C_1$ to $C_{12}$ hydrocarbon group, a $C_1$ to $C_6$ alkoxyl group, a $C_2$ to $C_7$ acyl group, a $C_2$ to $C_7$ acyloxy group, a $C_2$ to $C_7$ alkoxycarbonyl group, a nitro group or a halogen atom;

m and n independently represent an integer of 0 to 4.

The hydrocarbon group of $R^1$ and $R^2$ includes any of an aliphatic hydrocarbon group, an alicyclic hydrocarbon group, an aromatic hydrocarbon group and a combination thereof.

Examples of the aliphatic hydrocarbon group include an alkyl group such as methyl, ethyl, propyl, isopropyl, butyl, sec-butyl, tert-butyl, pentyl, hexyl and nonyl groups.

The alicyclic hydrocarbon group is any one of monocyclic or polycyclic hydrocarbon group, and saturated or unsaturated hydrocarbon group. Examples thereof include a cycloalkyl group such as cyclopropyl, cyclobutyl, cyclopentyl, cyclohexyl, cyclononyl and cyclododecyl groups; adamantyl and norbornyl groups. The alicyclic hydrocarbon group is preferably saturated hydrocarbon group.

Examples of the aromatic hydrocarbon group include an aryl group such as phenyl, 1-naphthyl, 2-naphthyl, 2-methylphenyl, 3-methylphenyl, 4-methylphenyl, 4-ethylphenyl, 4-propylphenyl, 4-isopropylphenyl, 4-butylphenyl, 4-tert-butylphenyl, 4-hexylphenyl, 4-cyclohexylphenyl, anthryl, p-adamantylphenyl, tolyl, xylyl, cumenyl, mesityl, biphenyl, phenanthryl, 2,6-diethylphenyl and 2-methyl-6-ethylphenyl groups.

Examples of the combination thereof include an alkyl-cycloalkyl, a cycloalkyl-alkyl, aralkyl (e.g., phenylmethyl, 1-phenylethyl, 2-phenylethyl, 1-phenyl-1-propyl, 1-phenyl-2-propyl, 2-phenyl-2-propyl, 3-phenyl-1-propyl, 4-phenyl-1-butyl, 5-phenyl-1-pentyl and 6-phenyl-1-hexyl groups) groups.

Examples of the alkoxyl group include methoxy and ethoxy groups.

Examples of the acyl group include acetyl, propanoyl, benzoyl and cyclohexanecarbonyl groups.

Examples of the acyloxy group include a group in which oxy group (—O—) bonds to an acyl group.

Examples of the alkoxycarbonyl group include a group in which the carbonyl group (—CO—) bonds to the alkoxy group, such as methoxycarbonyl, ethoxycarbonyl, n-propoxycarbonyl, isopropoxycarbonyl, n-butoxycarbonyl, sec-butoxycarbonyl, and tert-butoxycarbonyl groups.

Example of the halogen atom is a chlorine atom, a fluorine atom and bromine atom.

In the formula (I), $R^1$ and $R^2$ in each occurrence independently preferably represent a $C_1$ to $C_6$ hydrocarbon group, a $C_1$ to $C_4$ alkoxyl group, a $C_2$ to $C_5$ acyl group, a $C_2$ to $C_5$ acyloxy group, a $C_2$ to $C_5$ alkoxycarbonyl group, a nitro group or a halogen atom.

m and n independently preferably represent an integer of 0 to 3, more preferably an integer of 0 to 2, and still more preferably 0.

Specific examples of the compound (I) include compounds below.

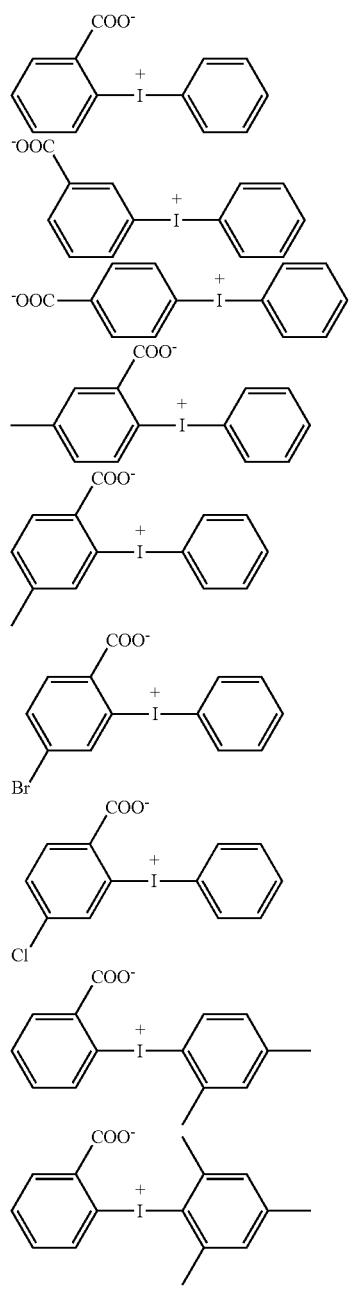

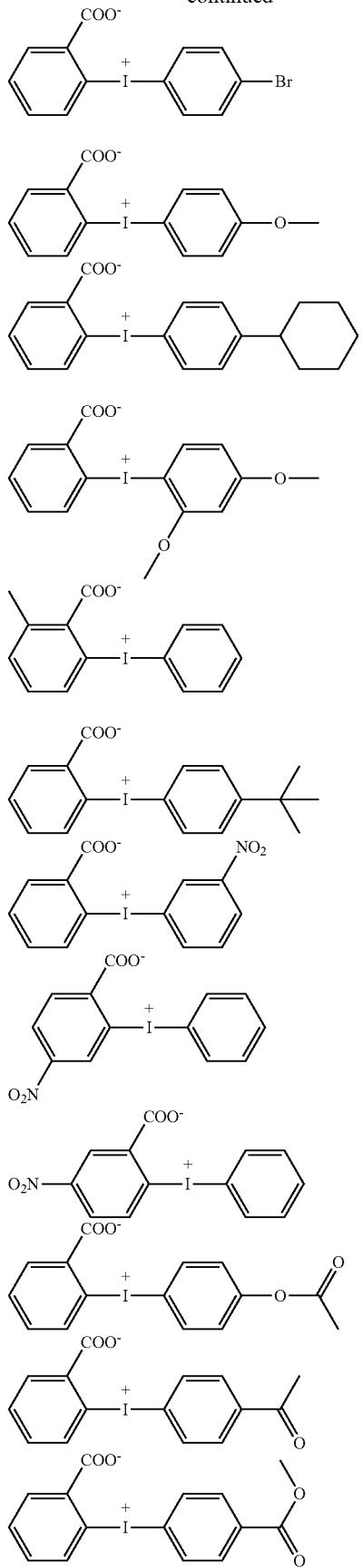

The compound (I) can be produced by a method described in "Tetrahedron Vol. 45, No. 19, p6281-6296". Also, commercially available compounds can be used as the compound (I).

In the resist composition of the present invention, the proportion of the compound (I) is preferably 0.01 to 5 weight %, and more preferably 0.01 to 3 weight %, and still more preferably 0.01 to 1 weight % with respect to total solid proportion of the resist composition.

<Solvent (E)>

The resist composition of the present invention may include a solvent (E) in the amount of 90 weight % or more, preferably 92 weight % or more, and more preferably 94 weight % or more, and 99.9 weight % or less, preferably 99 weight % or less in the composition.

The content of the solvent (E) can be measured with a known analytical method such as, for example, liquid chromatography and gas chromatography.

Examples of the solvent (E) include glycol ether esters such as ethylcellosolve acetate, methylcellosolve acetate and propylene glycol monomethyl ether acetate; glycol ethers such as propylene glycol monomethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents (E) can be used as a single solvent or as a combination of two or more solvents.

<Basic Compound (C)>

The resist composition of the present invention may contain a basic compound (C). The basic compound (C) is a compound having a property to quench an acid, in particular, generated from the acid generator (B), and called "quencher".

As the basic compounds (C), nitrogen-containing basic compounds (for example, amine and basic ammonium salt) are preferable. The amine may be an aliphatic amine or an aromatic amine. The aliphatic amine includes any of a primary amine, secondary amine and tertiary amine. The aromatic amine includes an amine in which an amino group is bonded to an aromatic ring such as aniline, and a heteroaromatic amine such as pyridine.

Preferred basic compounds (C) include compounds presented by the formula (C1) to the formula (C8) as described below. Among these, the basic compound presented by the formula (C1-1) is more preferable.

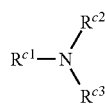
(C1)

wherein $R^{c1}$, $R^{c2}$ and $R^{c3}$ independently represent a hydrogen atom, a $C_1$ to $C_6$ alkyl group, $C_5$ to $C_{10}$ alicyclic hydrocarbon group or a $C_6$ to $C_{10}$ aromatic hydrocarbon group, one or more hydrogen atom contained in the alkyl group and alicyclic hydrocarbon group may be replaced by a hydroxy group, an amino group or a $C_1$ to $C_6$ alkoxyl group, one or more hydrogen atom contained in the aromatic hydrocarbon group may be replaced by a $C_1$ to $C_6$ alkyl group, a $C_1$ to $C_6$ alkoxyl group, a $C_5$ to $C_{10}$ alicyclic hydrocarbon group or a $C_6$ to $C_{10}$ aromatic hydrocarbon group.

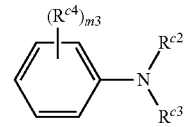
(C1-1)

wherein $R^{c2}$ and $R^{c3}$ independently have the same meaning as described above;

$R^{c4}$ in each occurrence represents a $C_1$ to $C_6$ alkyl group, a $C_1$ to $C_6$ alkoxyl group, a $C_5$ to $C_{10}$ alicyclic hydrocarbon group or a $C_6$ to $C_{10}$ aromatic hydrocarbon group;

m3 represents an integer 0 to 3.

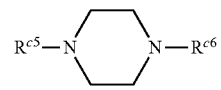
(C2)

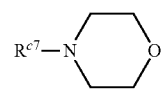
(C3)

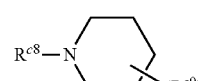
(C4)

wherein $R^{c5}$, $R^{c6}$, $R^{c7}$ and $R^{c8}$ independently have the same meaning as described in $R^{c1}$ of the above;

$R^{c9}$ in each occurrence independently represents a $C_1$ to $C_6$ alkyl group, a $C_3$ to $C_6$ alicyclic hydrocarbon group or a $C_2$ to $C_6$ alkanoyl group;

n3 represents an integer of 0 to 8.

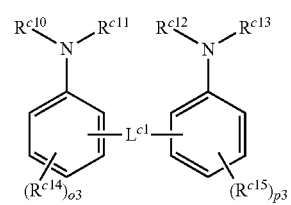
(C5)

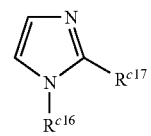
(C6)

wherein $R^{c10}$, $R^{c11}$, $R^{c12}$, $R^{c13}$ and $R^{c16}$ independently have the same meaning as described in $R^{c1}$ of the above;

$R^{c14}$, $R^{c15}$ and $R^{c17}$ in each occurrence independently have the same meaning as described in $R^{c4}$ of the above;

o3 and p3 represent an integer of 0 to 3;

$L^{c1}$ represents a divalent $C_1$ to $C_6$ alkanediyl group, —CO—, —C(=NH)—, —S— or a combination thereof.

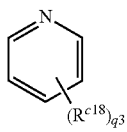

(C7)

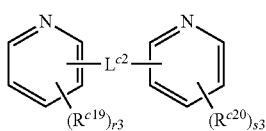

(C8)

wherein $R^{c18}$, $R^{c19}$ and $R^{c20}$ in each occurrence independently have the same meaning as described in $R^{c4}$ of the above;

q3, r3 and s3 represent an integer of 0 to 3;

$L^{c2}$ represents a single bond, a $C_1$ to $C_6$ alkanediyl group, —CO—, —C(=NH)—, —S— or a combination thereof.

In the above formulae, examples of the alkyl group, the alicyclic group, the aromatic group, alkoxy group and the alkanediyl group are the same examples described above.

Examples of the alkanoyl group include acetyl group, 2-methylacetyl group, 2,2-dimethylacetyl group, propionyl group, butylyl group, isobutylyl group, pentanoyl group, and 2,2-dimethylpropionyl group.

Specific examples of the amine represented by the formula (C1) include 1-naphtylamine and 2-naphtylamine, aniline, diisopropylaniline, 2-, 3- or 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl]amine, triisopropanolamine, ethylene diamine, tetramethylene diamine, hexamethylene diamine, 4,4'-diamino-1,2-diphenylethane, 4,4'-diamino-3,3'-dimethyldiphenylmethane and 4,4'-diamino-3,3'-diethyldiphenylmethane.

Among these, diisopropylaniline is preferable, particularly 2,6-diisopropylaniline is more preferable as the basic compounds (C) contained in the present resist composition.

Specific examples of the compound represented by the formula (C2) include, for example, piperazine.

Specific examples of the compound represented by the formula (C3) include, for example, morpholine.

Specific examples of the compound represented by the formula (C4) include, for example, piperidine, a hindered amine compound having piperidine skeleton described in JP H11-52575-A.

Specific examples of the compound represented by the formula (C5) include, for example, 2,2'-methylenebisaniline.

Specific examples of the compound represented by the formula (C6) include, for example, imidazole and 4-methylimidazole.

Specific examples of the compound represented by the formula (C7) include, for example, pyridine and 4-methylpyridine.

Specific examples of the compound represented by the formula (C8) include, for example, 1,2-di(2-pyridyl)ethane, 1,2-di(4-pyridyl)ethane, 1,2-di(2-pyridyl)ethene, 1,2-di(4-pyridyl)ethene, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine, 2,2'-dipicolylamine and bipyridine.

Examples of the ammonium salt include tetramethylammonium hydroxide, tetraisopropylammonium hydroxide, tetrabutylammonium hydroxide, tetrahexylammonium hydroxide, tetraoctylammonium hydroxide, phenyltrimethyl ammonium hydroxide, 3-(trifluoromethyl)phenyltrimethylammonium hydroxide, tetra-n-butyl ammonium salicylate and choline.

The proportion of the basic compound (C) is preferably 0.01 to 5 weight %, more preferably 0.01 to 3 weight %, and still more preferably 0.01 to 1 weight % with respect to the total solid proportion of the resist composition.

<Other Ingredient (Hereinafter is Sometimes Referred to as "Other Ingredient (F)")>

The resist composition can also include small amounts of various additives such as sensitizers, dissolution inhibitors, surfactants, stabilizers, and dyes, as needed.

<Preparing the Resist Composition>

The present resist composition can be prepared by mixing the resin (A), the acid generator (II) and the compound (I), and the acid generator (B), the basic compound (C), the solvent (E) and the other ingredient (F) as needed. There is no particular limitation on the order of mixing. The mixing may be performed in an arbitrary order. The temperature of mixing may be adjusted to an appropriate temperature within the range of 10 to 40° C., depending on the kinds of the resin and solubility in the solvent (E) of the resin. The time of mixing may be adjusted to an appropriate time within the range of 0.5 to 24 hours, depending on the mixing temperature. There is no particular limitation to the tool for mixing. An agitation mixing may be adopted.

After mixing the above ingredients, the present resist compositions can be prepared by filtering the mixture through a filter having about 0.003 to 0.2 µm pore diameter.

<Method for Producing Resist Pattern>

The method for producing a resist pattern of the present invention includes the steps of:

(1) applying the resist composition of the present invention onto a substrate;

(2) drying the applied composition to form a composition layer;

(3) exposing the composition layer;

(4) heating the exposed composition layer, and (5) developing the heated composition layer.

Applying the resist composition onto the substrate can generally be carried out through the use of a resist application device, such as a spin coater known in the field of semiconductor microfabrication technique. The thickness of the applied resist composition layer can be adjusted by controlling the variable conditions of the resist application device. These conditions can be selected based on a pre-experiment carried out beforehand. The substrate can be selected from various substrates intended to be microfabricated. The substrate may be washed, and an organic antireflection film may be formed on the substrate by use of a commercially available antireflection composition, before the application of the resist composition.

Drying the applied composition layer, for example, can be carried out using a heating device such as a hotplate (so-called "prebake"), a decompression device, or a combination thereof. Thus, the solvent evaporates from the resist composition and a composition layer with the solvent removed is formed. The condition of the heating device or the decompression device can be adjusted depending on the kinds of the solvent used. The temperature in this case is generally within the range of 50 to 200° C. Moreover, the pressure is generally within the range of 1 to $1.0 \times 10^5$ Pa.

The composition layer thus obtained is generally exposed using an exposure apparatus or a liquid immersion exposure apparatus. The exposure is generally carried out through a mask that corresponds to the desired pattern. Various types of exposure light source can be used, such as irradiation with ultraviolet lasers such as KrF excimer laser (wavelength: 248 nm), ArF excimer laser (wavelength: 193 nm), $F_2$ excimer laser (wavelength: 157 nm), or irradiation with far-ultraviolet wavelength-converted laser light from a solid-state laser source (YAG or semiconductor laser or the like), or vacuum ultraviolet harmonic laser light or the like. Also, the exposure device may be one which irradiates electron beam or extreme-ultraviolet light (EUV).

After exposure, the composition layer is subjected to a heat treatment (so-called "post-exposure bake") to promote the deprotection reaction. The heat treatment can be carried out using a heating device such as a hotplate. The heating temperature is generally in the range of 50 to 200° C., preferably in the range of 70 to 150° C.

The composition layer is developed after the heat treatment, generally with an alkaline developing solution and using a developing apparatus. The development here means to bring the composition layer after the heat treatment into contact with an alkaline solution. Thus, the exposed portion of the composition layer is dissolved by the alkaline solution and removed, and the unexposed portion of the composition layer remains on the substrate, whereby producing a resist pattern. Here, as the alkaline developing solution, various types of aqueous alkaline solutions used in this field can be used. Examples include aqueous solutions of tetramethylammonium hydroxide and (2-hydroxyethyl)trimethylammonium hydroxide (common name: choline).

After the development, it is preferable to rinse the substrate and the pattern with ultrapure water and to remove any residual water thereon.

<Application>

The resist composition of the present invention is useful as the resist composition for excimer laser lithography such as with ArF, KrF or the like, and the resist composition for electron beam (EB) exposure lithography and extreme-ultraviolet (EUV) exposure lithography, as well as liquid immersion exposure lithography.

The resist composition of the present invention can be used in semiconductor microfabrication and in manufacture of liquid crystals, thermal print heads for circuit boards and the like, and furthermore in other photofabrication processes, which can be suitably used in a wide range of applications.

EXAMPLES

The present invention will be described more specifically by way of examples, which are not construed to limit the scope of the present invention.

All percentages and parts expressing the content or amounts used in the Examples and Comparative Examples are based on weight, unless otherwise specified.

The weight average molecular weight is a value determined by gel permeation chromatography.

Apparatus: HLC-8120GPC type (Tosoh Co. Ltd.)

Column: TSK gel Multipore HXL-M×3+guardcolumn (Tosoh Co. Ltd.)

Eluant: tetrahydrofuran

Flow rate: 1.0 mL/min

Detecting device: RI detector

Column temperature: 40° C.

Injection amount: 100 μL

Standard material for calculating molecular weight: standard polysthylene (Toso Co. ltd.)

Synthesis Example 1: Synthesis of a Salt Represented by the Formula (II-1)

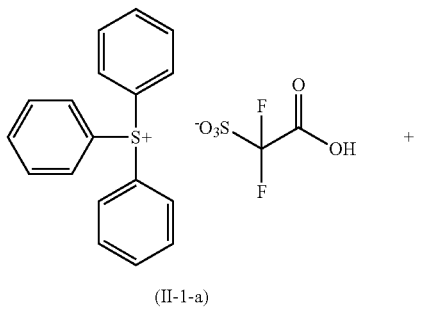

(II-1-a)

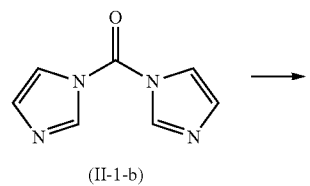

(II-1-b)

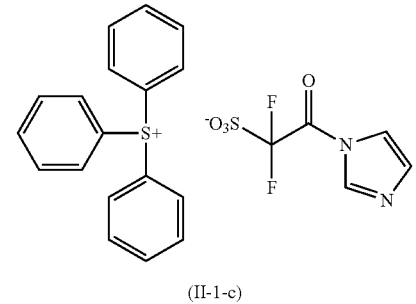

(II-1-c)

A salt represented by the formula (II-1-a) was synthesized by the method described in JP2008-127367A.

10.00 parts of the compound represented by the formula (II-1-a), 50.00 parts of acetonitrile and 4.44 parts of the compound represented by the formula (II-1-b) (Trade name: carbonyl diimidazole, Tokyo Chemical Industry Co., LTD) were charged, and stirred for 30 minutes at 80° C. After that, the obtained reactant was cooled to 23° C., and filtrated, whereby giving 59.48 parts of a solution containing the salt represented by the formula (II-1-c).

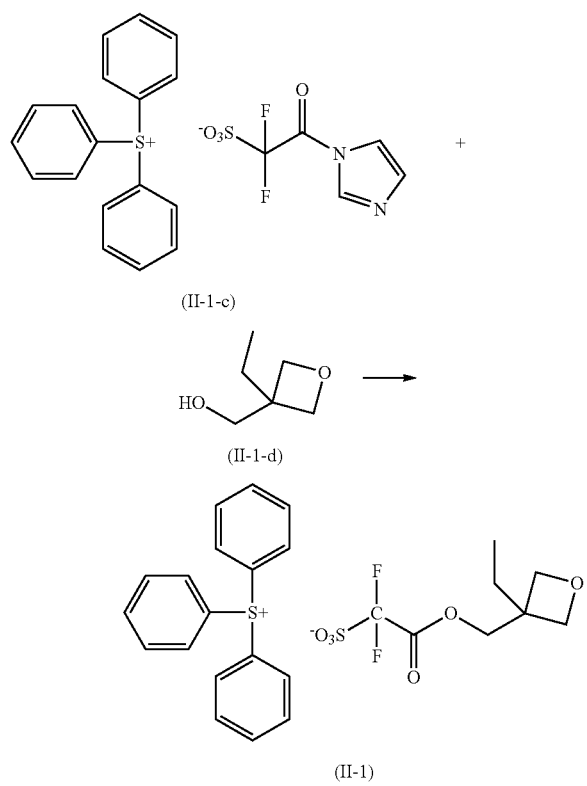

(II-1-c)

(II-1-d)

(II-1)

59.48 parts of the salt represented by the formula (II-1-c) and 2.57 parts of a compound represented by the formula (II-1-d) (Trade name: 3-ethyl-oxetane methanol, Tokyo Chemical Industry Co., LTD were charged, stirred for 1 hour at 23° C., and filtrated. The obtained filtrate was concentrated, to this concentrate, 100 parts of chloroform and 30 parts of ion-exchanged water were charged, stirred for 30 minutes, and separated to obtain an organic layer. These washing with water operations were repeated for 3 times. The obtained organic layer was concentrated to obtain a concentrate, whereby giving 8.73 parts of the salt represented by the formula (II-1).

MS(ESI(+) Spectrum): M+ 263.1

MS(ESI(−) Spectrum): M− 273.0

Synthesis Example 2: Synthesis of a Salt Represented by the Formula (II-2)

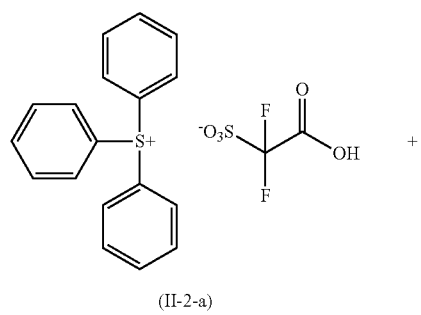

(II-2-a)

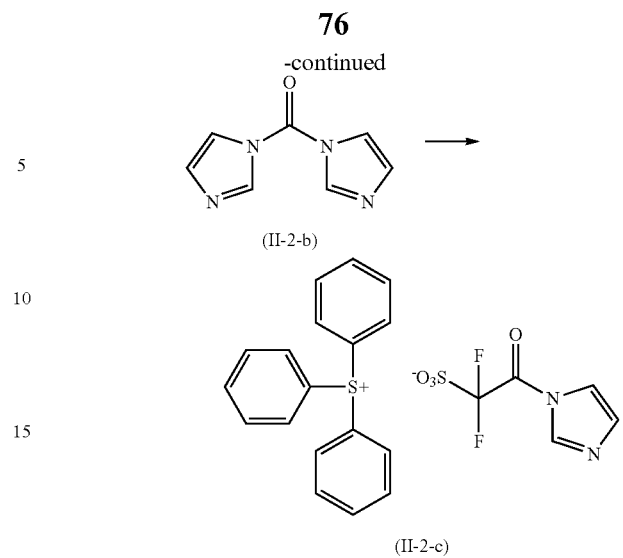

(II-2-b)

(II-2-c)

A salt represented by the formula (II-2-a) was synthesized by the method described in JP2008-127367A.

10.00 parts of the compound represented by the formula (II-2-a), 50.00 parts of acetonitrile and 4.44 parts of the compound represented by the formula (II-2-b) (Trade name: carbonyl diimidazole, Tokyo Chemical Industry Co., LTD) were charged, and stirred for 30 minutes at 80° C. After that, the obtained reactant was cooled to 23° C., and filtrated, whereby giving 59.68 parts of a solution containing the salt represented by the formula (II-2-c).

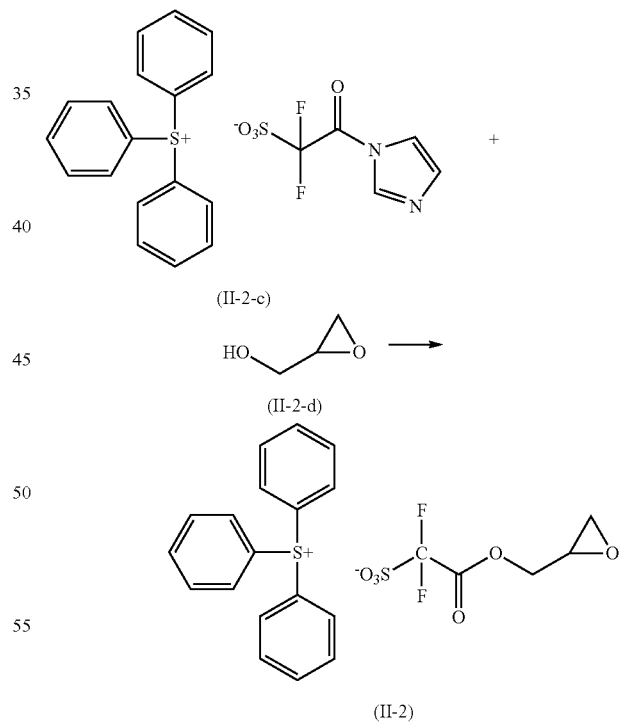

(II-2-c)

(II-2-d)

(II-2)

59.68 parts of the salt represented by the formula (II-2-c) and 1.64 parts of a compound represented by the formula (II-2-d) (Trade name: glycidol, Aldrich Corporation) were charged, stirred for 1 hour at 23° C., and filtrated. The obtained filtrate was concentrated, to this concentrate, 100 parts of chloroform and 30 parts of ion-exchanged water were charged, stirred for 30 minutes, and separated to obtain an organic layer. These washing with water operations were repeated for 3 times. The obtained organic layer was concentrated to obtain a concentrate, whereby giving 5.80 parts of the salt represented by the formula (II-2).
MS(ESI(+) Spectrum): M⁺ 263.1
MS(ESI(−) Spectrum): M⁻ 231.0

Synthesis Example 3: Synthesis of a Salt Represented by the Formula (II-3)

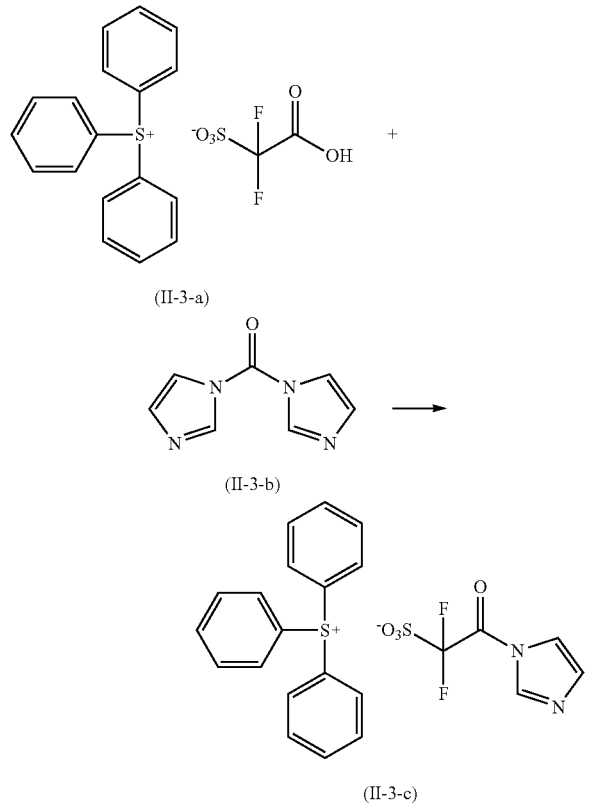

(II-3-a)

(II-3-b)

(II-3-c)

A salt represented by the formula (II-3-a) was synthesized by the method described in JP2008-127367A.

10.00 parts of the compound represented by the formula (II-3-a), 50.00 parts of acetonitrile and 4.44 parts of the compound represented by the formula (II-3-b) (Trade name: carbonyl diimidazole, Tokyo Chemical Industry Co., LTD) were charged, and stirred for 30 minutes at 80° C. After that, the obtained reactant was cooled to 23° C., and filtrated, whereby giving 59.88 parts of a solution containing the salt represented by the formula (II-3-c).

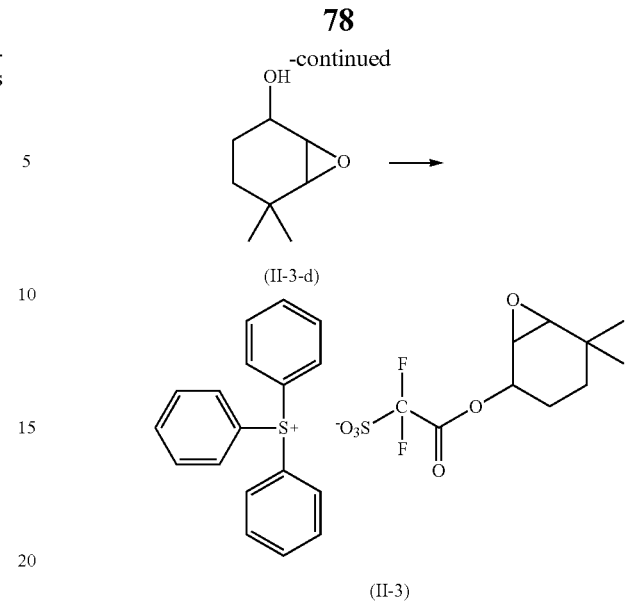

(II-3-d)

(II-3)

59.88 parts of the salt represented by the formula (II-3-c) and 3.15 parts of a compound represented by the formula (II-3-d) (Trade name: 5,5-dimethyl-7-oxabicyclo[4.1.0]heptane-2-ol, Aldrich Corporation) were charged, stirred for 1 hour at 23° C., and filtrated. The obtained filtrate was concentrated, to this concentrate, 100 parts of chloroform and 30 parts of ion-exchanged water were charged, stirred for 30 minutes, and separated to obtain an organic layer. These washing with water operations were repeated for 3 times. The obtained organic layer was concentrated to obtain a concentrate, whereby giving 5.42 parts of the salt represented by the formula (II-3).

MS(ESI(+) Spectrum): M⁺ 263.1
MS(ESI(−) Spectrum): M⁻ 299.0

Synthesis Example 4: Synthesis of a Salt Represented by the Formula (II-4)

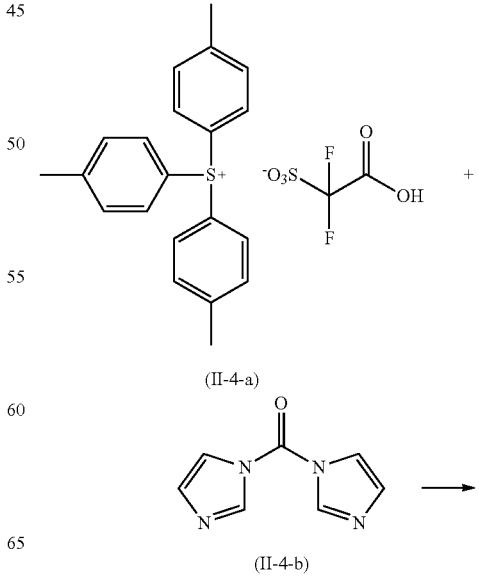

(II-4-a)

(II-4-b)

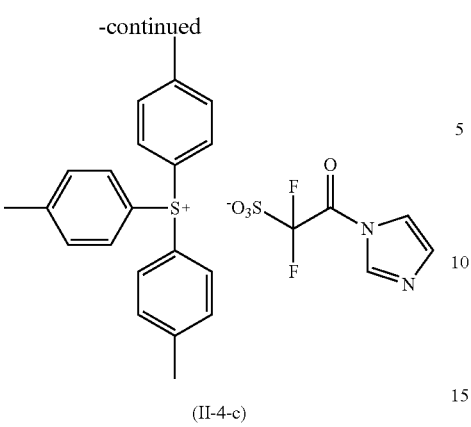

(II-4-c)

10.96 parts of a salt represented by the formula (II-4-a), 50.00 parts of acetonitrile and 4.44 parts of the compound represented by the formula (II-4-b) (Trade name: carbonyl diimidazole, Tokyo Chemical Industry Co., LTD) were charged, and stirred for 30 minutes at 80° C. After that, the obtained reactant was cooled to 23° C., and filtrated, whereby giving 60.54 parts of a solution containing the salt represented by the formula (II-4-c).

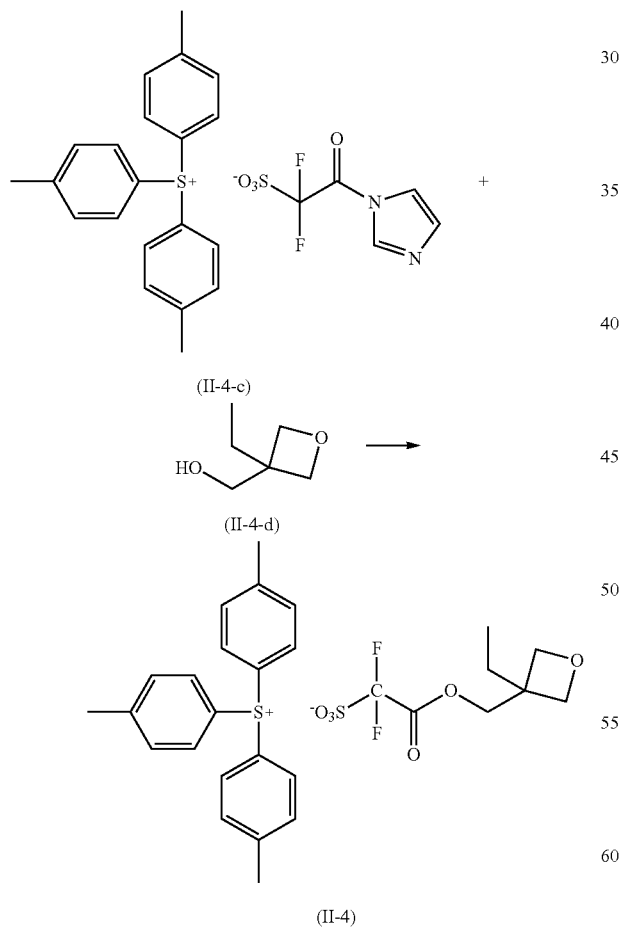

(II-4)

60.54 parts of the salt represented by the formula (II-4-c) and 2.57 parts of a compound represented by the formula (II-4-d) (Trade name: 3-ethyl-oxetane methanol, Aldrich Corporation) were charged, stirred for 1 hour at 23° C., and filtrated. The obtained filtrate was concentrated, to this concentrate, 100 parts of chloroform and 30 parts of ion-exchanged water were charged, stirred for 30 minutes, and separated to obtain an organic layer. These washing with water operations were repeated for 3 times. The obtained organic layer was concentrated to obtain a concentrate, whereby giving 8.92 parts of the salt represented by the formula (II-4).

MS(ESI(+) Spectrum): M$^+$ 305.1

MS(ESI(−) Spectrum): M$^-$ 273.0

Synthetic Example of the Resin

The monomers used the synthesis of the resin are shown below.

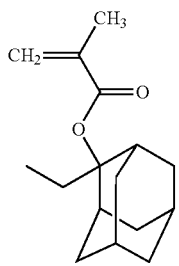

(A)

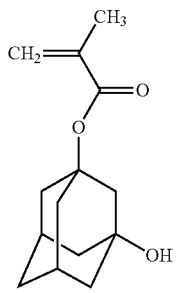

(B)

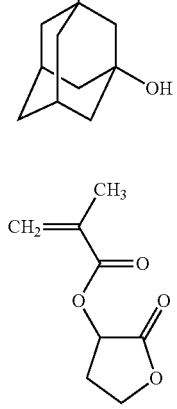

(C)

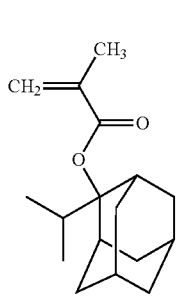

(D)

-continued

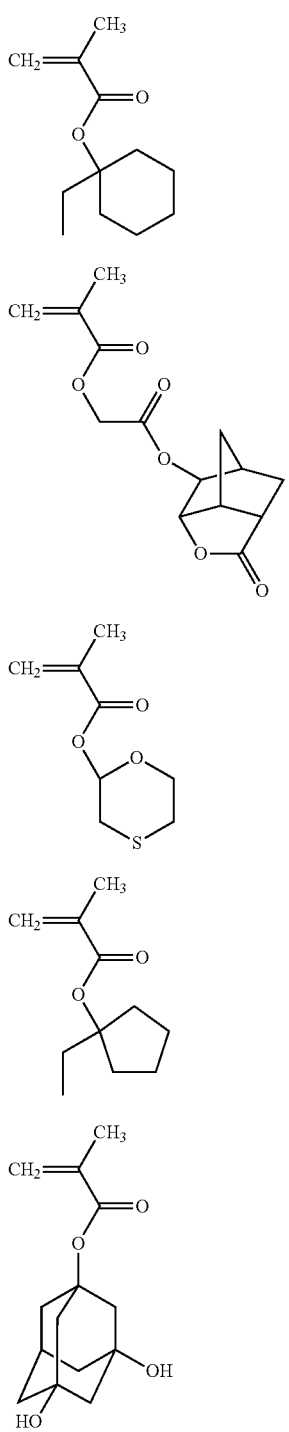

These monomers are referred to as "monomer (A)" to "monomer (I)".

Synthetic Example 5: Synthesis of Resin A1

Monomer (D), monomer (E), monomer (B), monomer (C) and monomer (F) were mixed together with a mole ratio of monomer (D): monomer (E): monomer (B): monomer (C): monomer (F)=30:14:6:20:30, and dioxane was added thereto in an amount equal to 1.5 times by weight of the total amount of monomers to obtain a solution. Azobisisobuty- ronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 73° C. After that, the reacted mixture was poured into a mixture of a large amount of methanol and water (methanol:water=4:1, weight ratio) to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times to reprecipitate and purify, resulting in a 65% yield of copolymer having a weight average molecular weight of about 8100. This copolymer, which had the structural units of the following formula, was referred to Resin A1.

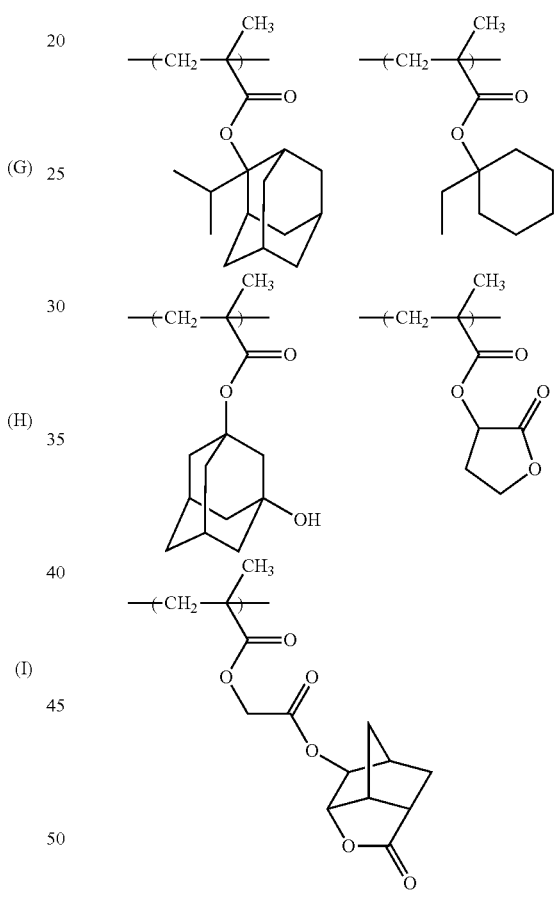

Synthetic Example 6: Synthesis of Resin A2

Monomer (A), monomer (E), monomer (B), monomer (C) and monomer (F) were mixed together with a mole ratio of monomer (A): monomer (E): monomer (B): monomer (C): monomer (F)=30:14:6:20:30, and dioxane was added thereto in an amount equal to 1.5 times by weight of the total amount of monomers to obtain a solution. Azobisisobuty- ronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 73° C. After that, the obtained reacted mixture was poured into a mixture of a large amount of methanol and water (methanol:water=4:1, weight ratio) to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated three times to reprecipitate and purify, resulting in a 68% yield of copolymer having a weight average molecular weight of about 7800. This copolymer, which had the structural units of the following formula, was referred to Resin A2.

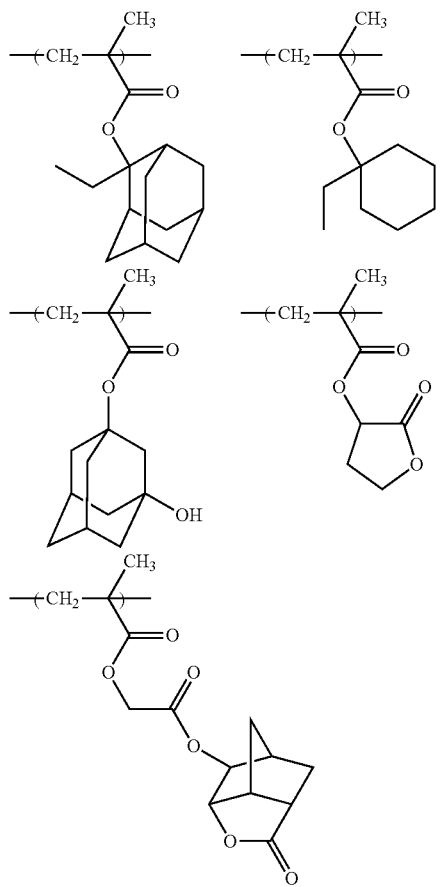

Synthetic Example 7: Synthesis of Resin A3

Monomer (A), monomer (B) and monomer (C) were mixed together with a mole ratio of monomer (A): monomer (B): monomer (C)=50:25:25, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1.0 mol % and 3.0 mol % respectively with respect to the entire amount of monomers, and the resultant mixture was heated for about 8 hours at 80° C. After that, the obtained reacted mixture was poured into a mixture of a large amount of methanol and water (methanol:water=4:1, weight ratio) to precipitate a resin. The obtained resin was filtrated. Thus obtained resin was dissolved in another dioxane to obtain a solution, and the solution was poured into a mixture of methanol and water to precipitate a resin. The obtained resin was filtrated. These operations were repeated three times to reprecipitate and purify, resulting in a 60% yield of copolymer having a weight average molecular weight of about 9200. This copolymer, which had the structural units of the following formula, was referred to Resin A3.

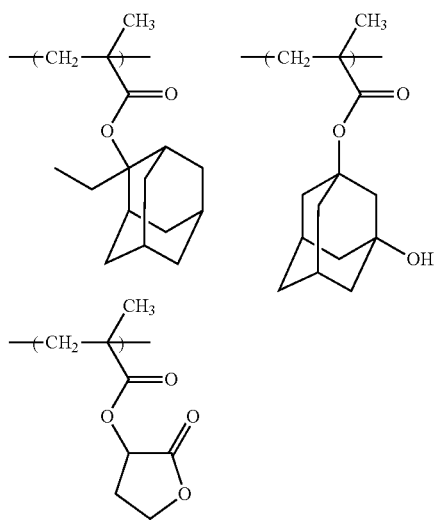

Synthetic Example 8: Synthesis of Resin A4

Monomer (A), monomer (E), monomer (B), monomer (F) and monomer (C) were mixed together with a mole ratio of monomer (A): monomer (E): monomer (B): monomer (F): monomer (C)=30:14:6:20:30, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times to reprecipitate and purify, resulting in a 78% yield of copolymer having a weight average molecular weight of about 7200. This copolymer, which had the structural units of the following formula, was referred to Resin A4.

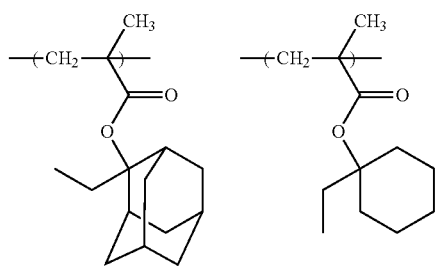

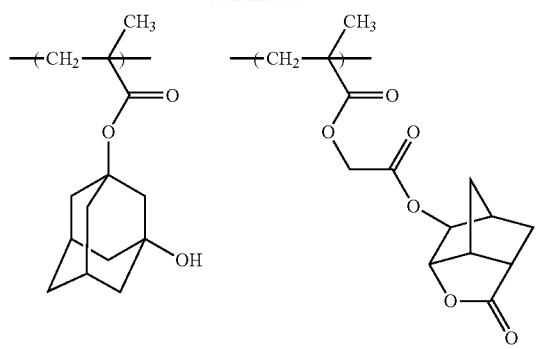

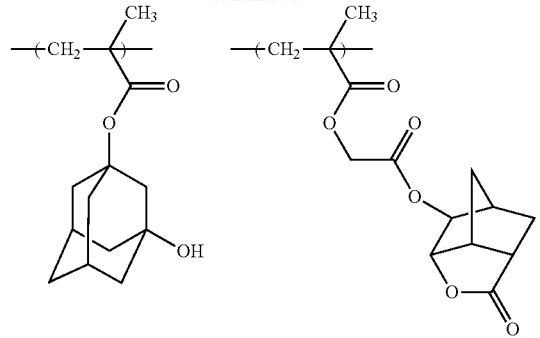

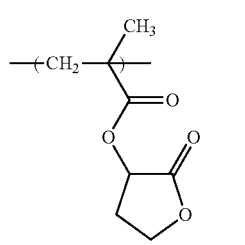

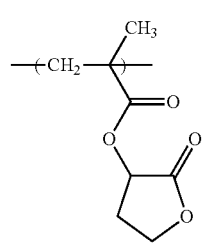

Synthetic Example 9: Synthesis of Resin A5

Monomer (A), monomer (G), monomer (B), monomer (F) and monomer (C) were mixed together with a mole ratio of monomer (A): monomer (G): monomer (B): monomer (F): monomer (C)=30:14:6:20:30, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times to reprecipitate and purify, resulting in a 78% yield of copolymer having a weight average molecular weight of about 7200. This copolymer, which had the structural units of the following formula, was referred to Resin A5.

Synthetic Example 10: Synthesis of Resin A6

Monomer (A), monomer (H), monomer (B), monomer (F) and monomer (C) were mixed together with a mole ratio of monomer (A): monomer (H): monomer (B): monomer (F): monomer (C)=30:14:6:20:30, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times, resulting in a 85% yield of copolymer having a weight average molecular weight of about 8400. This copolymer, which had the structural units of the following formula, was referred to Resin A6.

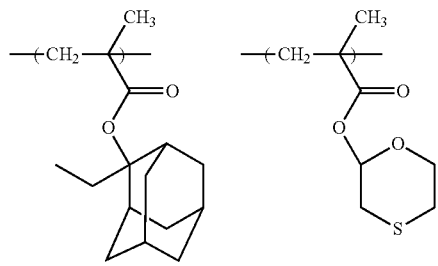

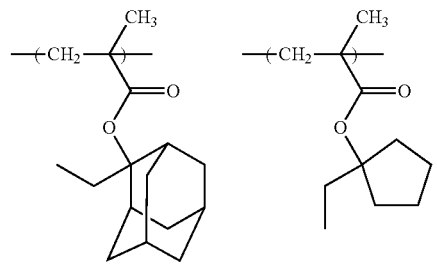

-continued

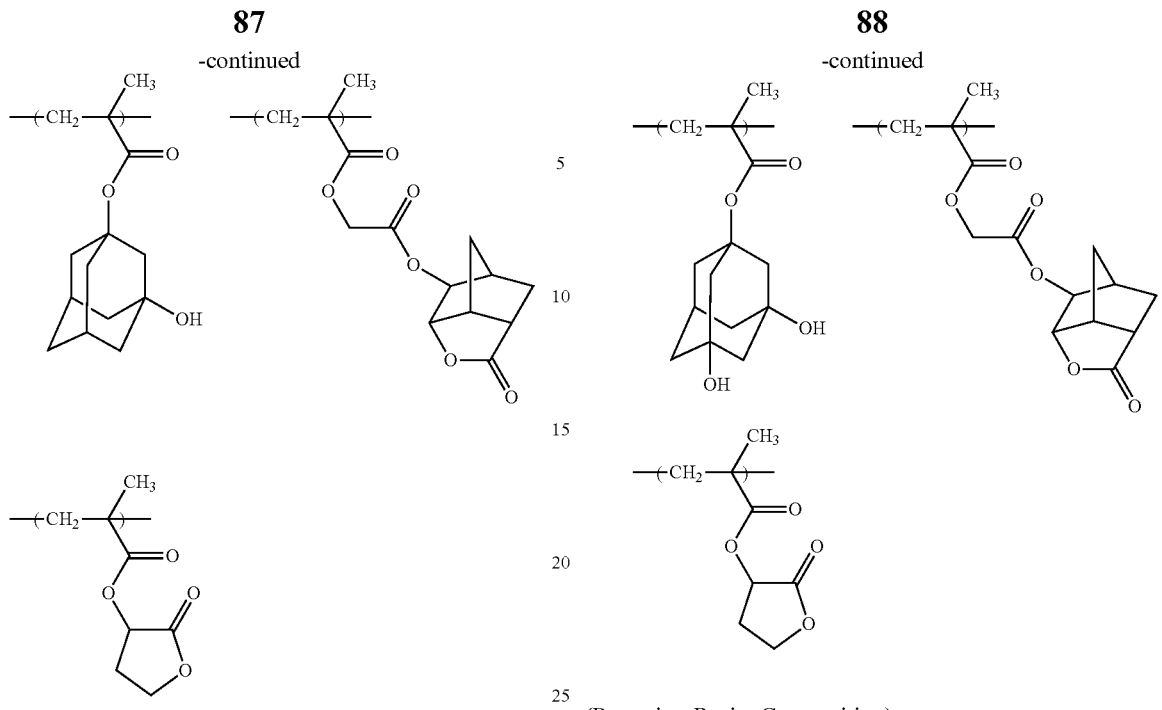

Synthetic Example 11: Synthesis of Resin A7

Monomer (A), monomer (H), monomer (I), monomer (F) and monomer (C) were mixed together with a mole ratio of monomer (A): monomer (H): monomer (I): monomer (F): monomer (C)=30:15:3:27:20, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1 mol % and 3 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times, resulting in a 81% yield of copolymer having a weight average molecular weight of about 7800. This copolymer, which had the structural units of the following formula, was referred to Resin A7.

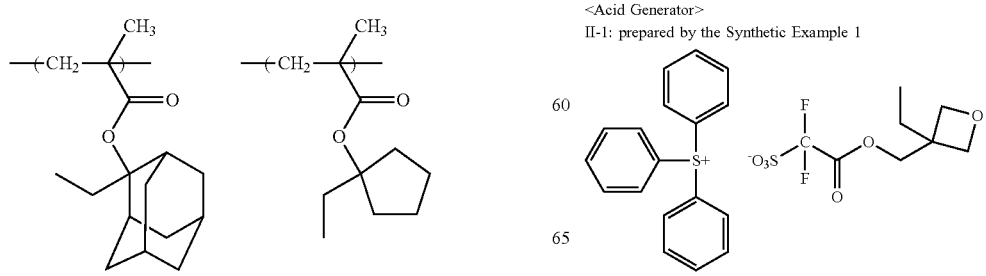

(Preparing Resist Composition)

Resist compositions were prepared by mixing and dissolving each of the components shown in Table 1, and then filtrating through a fluororesin filter having 0.2 μm pore diameter.

TABLE 1

| | | | | | (Unit: parts) |
|---|---|---|---|---|---|
| | Resin | Acid Generator | Compound (I) | Basic Compound | BP/PEB (° C./° C.) |
| Ex. 1 | A1 = 10 | II-1 = 1.4 | D1 = 0.1 | — | 95/85 |
| Ex. 2 | A2 = 10 | II-1 = 1.4 | D1 = 0.1 | — | 110/105 |
| Ex. 3 | A2 = 10 | II-1/B1 = 0.7/0.7 | D1 = 0.1 | — | 110/105 |
| Ex. 4 | A2 = 10 | II-1/B1 = 1.0/0.4 | D1 = 0.1 | — | 110/105 |
| Ex. 5 | A3 = 10 | II-1 = 1.4 | D1 = 0.1 | — | 110/105 |
| Ex. 6 | A4 = 10 | II-1 = 1.4 | D1 = 0.1 | — | 110/105 |
| Ex. 7 | A5 = 10 | II-1 = 1.4 | D1 = 0.1 | — | 110/105 |
| Ex. 8 | A5 = 10 | II-2 = 1.4 | D1 = 0.1 | — | 110/105 |
| Ex. 9 | A5 = 10 | II-3 = 1.4 | D1 = 0.1 | — | 110/105 |
| Ex. 10 | A5 = 10 | II-4 = 1.4 | D1 = 0.1 | — | 110/105 |
| Ex. 11 | A6 = 10 | II-1 = 1.4 | D1 = 0.1 | — | 110/105 |
| Ex. 12 | A6 = 10 | II-4 = 1.4 | D1 = 0.1 | — | 110/105 |
| Ex. 13 | A7 = 10 | II-1 = 1.4 | D1 = 0.1 | — | 110/105 |
| Ex. 14 | A7 = 10 | II-4 = 1.4 | D1 = 0.1 | — | 110/105 |
| Comparative Ex. | | | | | |
| 比較例 1 | A3 = 10 | B2 = 1.4 | — | C1 = 0.1 | 110/105 |

<Resin>
Resins A1 to A7 prepared by the Synthetic Examples
<Acid Generator>
II-1: prepared by the Synthetic Example 1

TABLE 1-continued (Unit: parts)

| Resin | Acid Generator | Compound (I) | Basic Compound | BP/PEB (° C./° C.) |
|---|---|---|---|---|

II-2: prepared by the Synthetic Example 2

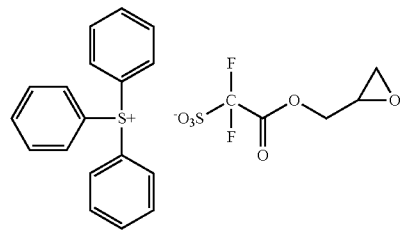

II-3: prepared by the Synthetic Example 3

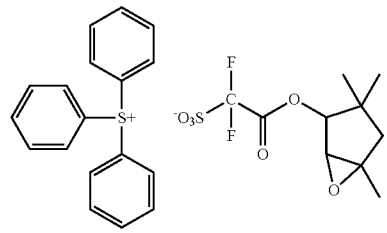

II-4: prepared by the Synthetic Example 4

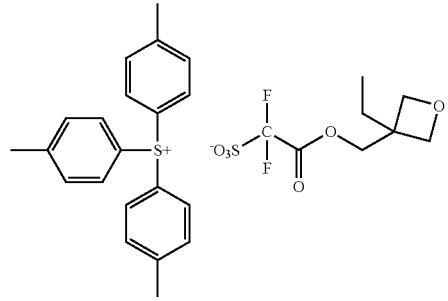

B1: this was prepared by a method according to the method described in the Examples of JP2010-152341A

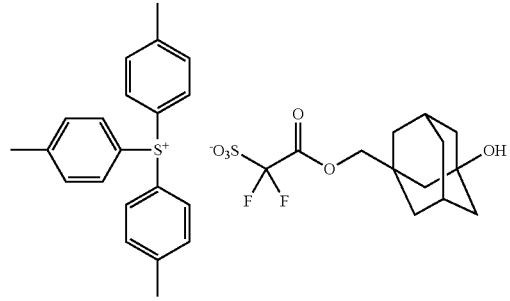

B2: this was prepared by a method according to the method described in the Examples of JP2007-161707A

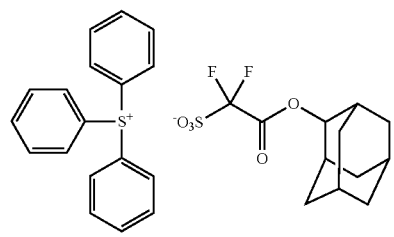

TABLE 1-continued (Unit: parts)

| Resin | Acid Generator | Compound (I) | Basic Compound | BP/PEB (° C./° C.) |
|---|---|---|---|---|

<Basic compound: Qencher>
C1: 2,6-diisopropylaniline (obtained from Tokyo Chemical Industry Co., LTD)
<Compound (I)>
D1: obtained from Tokyo Chemical Industry Co., LTD

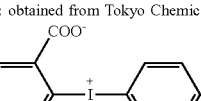

<Solvent of Resist Composition>

| Propylene glycol monomethyl ether acetate | 265 parts |
|---|---|
| Propylene glycol monomethyl ether | 20 parts |
| 2-Heptanone | 20 parts |
| γ-butyrolactone | 3.5 parts |

(Producing Resist Pattern)

A composition for an organic antireflective film ("ARC-29", by Nissan Chemical Co. Ltd.) was applied onto 12-inch silicon wafers and baked for 60 seconds at 205° C. to form a 78 nm thick organic antireflective film.

The above resist compositions were then applied thereon by spin coating so that the thickness of the resulting film became 85 nm after drying.

The obtained wafers were then pre-baked for 60 sec on a direct hot plate at the temperatures given in the "PB" column in Table 1 to form a composition layer.

Line and space patterns were then exposed through stepwise changes in exposure quantity using an ArF excimer laser stepper for immersion lithography ("XT:1900Gi" by ASML Ltd.: NA=1.35, ¾ Annular, X-Y deflection), on the wafers on which the composition layer had thus been formed. The ultrapure water was used for medium of immersion.

After the exposure, post-exposure baking was carried out by 60 seconds at the temperatures given in the "PEB" column in Table 1.

Then, puddle development was carried out with 2.38 wt % tetramethylammonium hydroxide aqueous solution for 60 seconds to obtain a resist pattern.

Effective sensitivity was represented as the exposure amount at which a 50 nm line and space pattern resolved to 1:1 (line pattern: space pattern) with the each resist film.

(Pattern collapse (PCM) Evaluation)

Using a mask for forming 45 nm of 1:1 line and space pattern, a resist pattern was prepared at a higher exposure amount than the effective sensitivity, and observed obtained line pattern by the electron scanning microscope.

A "O" was given if the pattern was not observed to disappear patterns due to collapse or delamination when the line width was finer than 38 nm, and a "X" was given if the pattern was observed to disappear patterns due to collapse or delamination when the line width is 38 nm or more.

Table 2 illustrates there results. The parenthetical number means minimum line width (nm) of resolved resist pattern without observation of pattern disappearance.

TABLE 2

|  | PCM |
| --- | --- |
| Ex. 1 | ○(32) |
| Ex. 2 | ○(31) |
| Ex. 3 | ○(33) |
| Ex. 4 | ○(32) |
| Ex. 5 | ○(36) |
| Ex. 6 | ○(31) |
| Ex. 7 | ○(30) |
| Ex. 8 | ○(34) |
| Ex. 9 | ○(31) |
| Ex. 10 | ○(30) |
| Ex. 11 | ○(30) |
| Ex. 12 | ○(30) |
| Ex. 13 | ○(30) |
| Ex. 14 | ○(30) |
| Comp. Ex. 1 | x(43) |

According to the resin and the resist composition of the present invention, it is possible to achieve satisfactory less pattern collapses and defects. Therefore, the present resist composition can be used for semiconductor microfabrication.

What is claimed is:

1. A resist composition comprising (A) a resin being insoluble or poorly soluble in alkali aqueous solution, but becoming soluble in an alkali aqueous solution by the action of an acid, and having a structural unit represent by the formula (a1-1) or the formula (a1-2), (B) an acid generator represented by the formula (II), and (D) a compound represented by the formula (I),

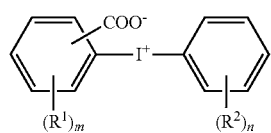

(I)

wherein $R^1$ and $R^2$ in each occurrence independently represent a $C_1$ to $C_{12}$ hydrocarbon group, a $C_1$ to $C_6$ alkoxyl group, a $C_2$ to $C_7$ acyl group, a $C_2$ to $C_7$ acyloxy group, a $C_2$ to $C_7$ alkoxycarbonyl group, a nitro group or a halogen atom;

m and n independently represent an integer of 0 to 4;

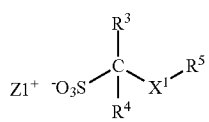

(II)

wherein $R^3$ and $R^4$ independently represent a fluorine atom or a $C_1$ to $C_6$ perfluoroalkyl group;

$X^1$ represents an $C_1$ to $C_{17}$ divalent saturated hydrocarbon group, and one or more hydrogen atom contained in the divalent saturated hydrocarbon group may be replaced by a fluorine atom, one or more —$CH_2$— contained in the divalent saturated hydrocarbon group may be replaced by —O— or —CO—;

$R^5$ represents a group having cyclic ether structure;

$Z1^+$ represents an organic cation; and which further comprises a solvent,

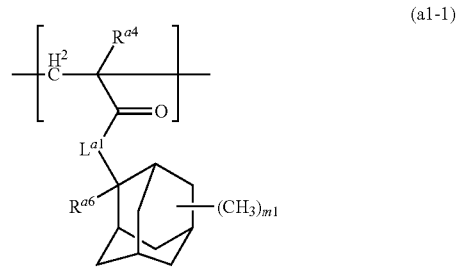

(a1-1)

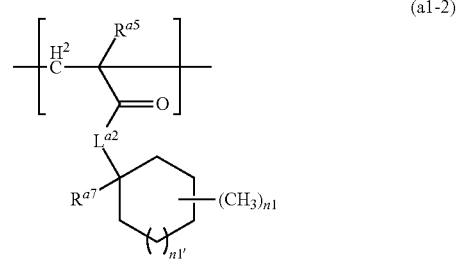

(a1-2)

in each formula, $L^{a1}$ and $L^{a2}$ independently represent *—O— or *—O—$(CH_2)_{k1}$—CO—O—, k1 represents an integer of 1 to 7, * represents a bond to the carbonyl group;

$R^{a4}$ and $R^{a5}$ independently represent a hydrogen atom or a methyl group;

$R^{a6}$ and $R^{a7}$ independently represent a $C_1$ to $C_8$ alkyl group or a $C_3$ to $C_{10}$ alicyclic hydrocarbon group;

m1 represents an integer 0 to 14;

n1 represents an integer 0 to 10; and n1' represents an integer 0 to 3, wherein $R^5$ in the formula (II) is a group represented by the formula (IIA) or the formula (IIE),

(IIA)

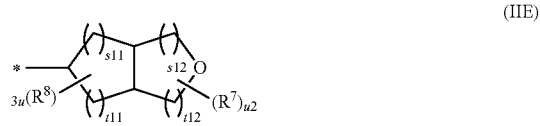

(IIE)

wherein s1 is 1 or 2 t1 represents an integer of 0 to 2, provided that s1+t1 is 2 to 3;

s11 represents an integer of 1 to 4, t11 represents an integer of 0 to 2;

s12 is 1 or 2, t12 represents an integer of 0 to 2, provided that s12+t12 is 2 to 3;

$R^6$ in each occurrence represents a $C_1$ to $C_{12}$ saturated hydrocarbon group, a $C_6$ to $C_{18}$ aromatic hydrocarbon group, or two $R^6$ are bonded together to form a ring, and one or more hydrogen atoms contained in the saturated hydrocarbon group, the aromatic hydrocarbon group and the ring may be replaced by a $C_1$ to $C_6$ alkyl group or a nitro group, and one or more —CH$_2$— contained in the saturated hydrocarbon group and ring may be replaced by —O—;

u1 represents an integer of 0 to 8;

R$^7$ and R$^8$ in each occurrence independently represent a hydroxy group, a halogen atom, a C$_1$ to C$_6$ alkyl group, a C$_1$ to C$_6$ alkoxyl group, a C$_1$ to C$_6$ hydroxy alkyl group, a C$_2$ to C$_7$ acyl group, a C$_2$ to C$_7$ acyloxy group or a C$_2$ to C$_7$ acylamino group, or two of R$^7$ and/or R$^8$ may be bonded together to form a single bond or a ring;

u2 and u3 independently represent an integer of 0 to 16; and

* represents a bond to X$^1$.

2. A method for producing a resist pattern comprising steps of;
(1) applying the resist composition of claim 1 onto a substrate;
(2) drying the applied composition to form a composition layer;
(3) exposing the composition layer;
(4) heating the exposed composition layer, and
(5) developing the heated composition layer.

* * * * *